United States Patent [19]

Dyer et al.

[11] 4,433,387

[45] Feb. 21, 1984

[54] SYSTEM FOR PROCESSING DATA RECEIVED FROM A PORTABLE DATA STORE AND FOR CLEARING THE STORE

[75] Inventors: Robert E. Dyer, Dunwoody; Scott C. Swanson, Roswell; Robert A. Hicks, Norcross, all of Ga.

[73] Assignee: Sangamo Weston, Inc., Norcross, Ga.

[21] Appl. No.: 177,334

[22] Filed: Aug. 12, 1980

[51] Int. Cl.³ .......................... G06F 3/04; G06F 13/00
[52] U.S. Cl. ................................................... 364/900
[58] Field of Search ... 364/200 MS File, 900 MS File; 371/21, 24; 365/201, 218

[56] References Cited

U.S. PATENT DOCUMENTS

| | | | |
|---|---|---|---|
| 3,859,635 | 1/1975 | Watson et al. | 364/200 |
| 4,099,069 | 7/1978 | Cricchi et al. | 365/218 |
| 4,220,991 | 9/1980 | Hamano et al. | 364/900 X |
| 4,258,430 | 3/1981 | Tyburski | 364/900 |

OTHER PUBLICATIONS

Choy, D. M., "Bit Pattern Generation Suitable for Use with Magnetic Bubble Testing", *IBM T.D.B.*, vol. 20, No. 11B, Apr. 1978, pp. 4926-4927.

*Primary Examiner*—Harvey E. Springborn
*Attorney, Agent, or Firm*—Dale Gaudier

[57] ABSTRACT

System and apparatus for treating data derived in serial pulse fashion from a source such as a meter. Data words are recorded upon a magnetic bubble memory which is portable and which includes real time and identification data in addition to pulse source data. The portable storage device incorporating the magnetic bubble memory is inserted into reader apparatus for transmission by telecommunication to a translator station which may be located remotely from the reader station. Cyclical redundancy check verification of the transmission is made between the stations to assure proper transmission. Further, the translation station carries out data verification checks. Erase apparatus is provided in the vicinity of the reader apparatus to carry out a memory check for the magnetic bubble memory and an erasure thereof through the insertion of zeroes therewithin.

32 Claims, 37 Drawing Figures

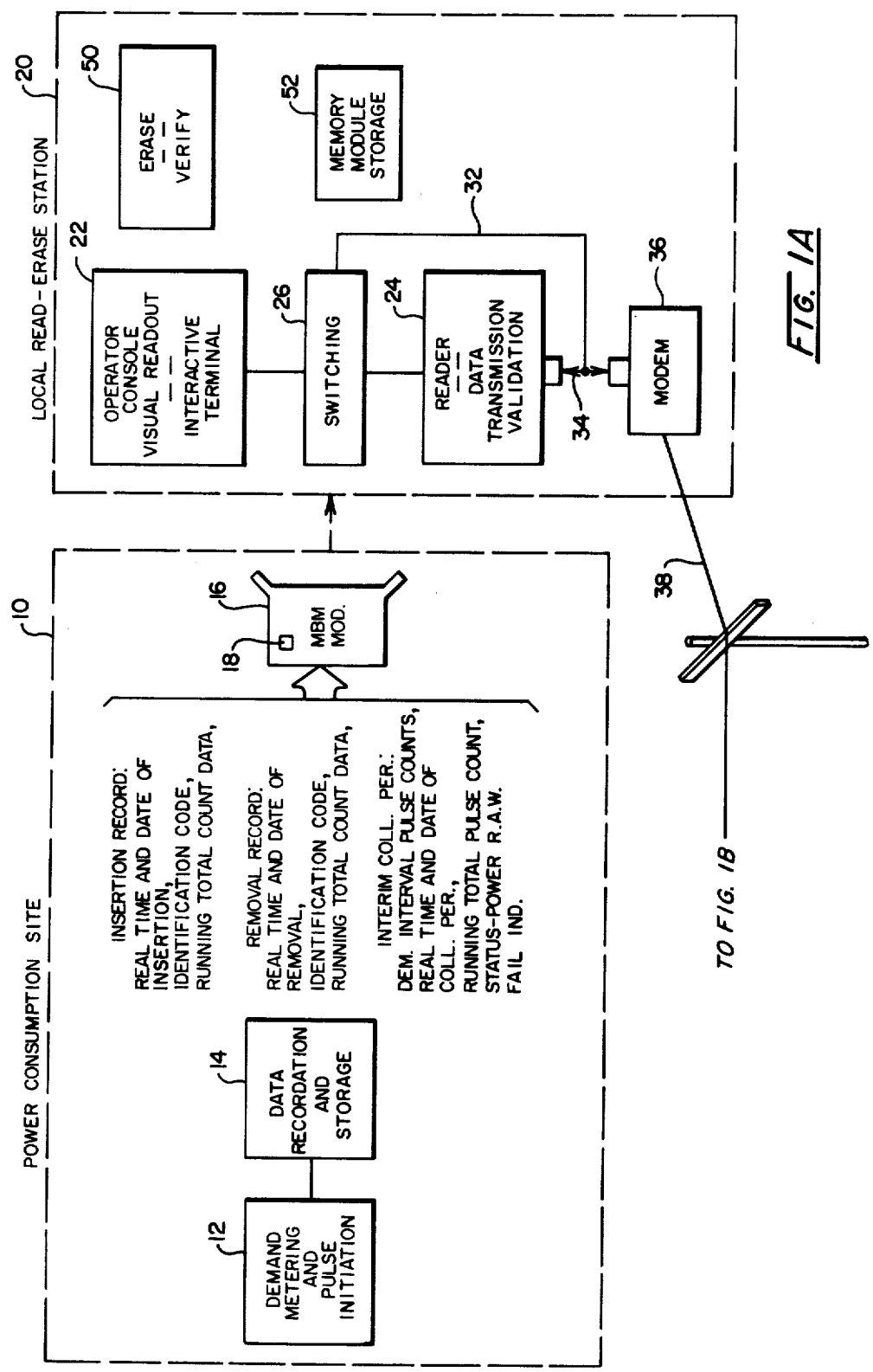

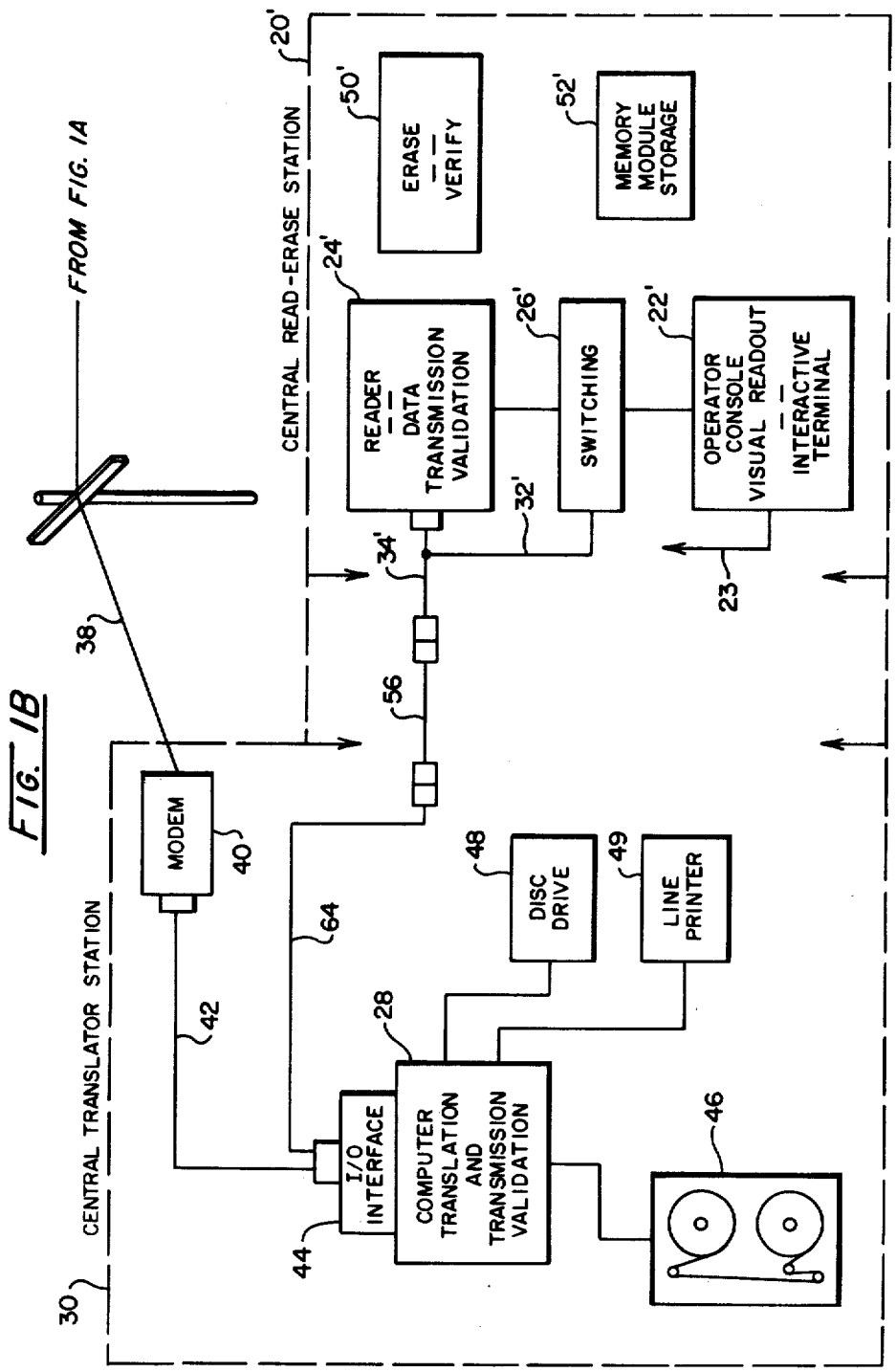

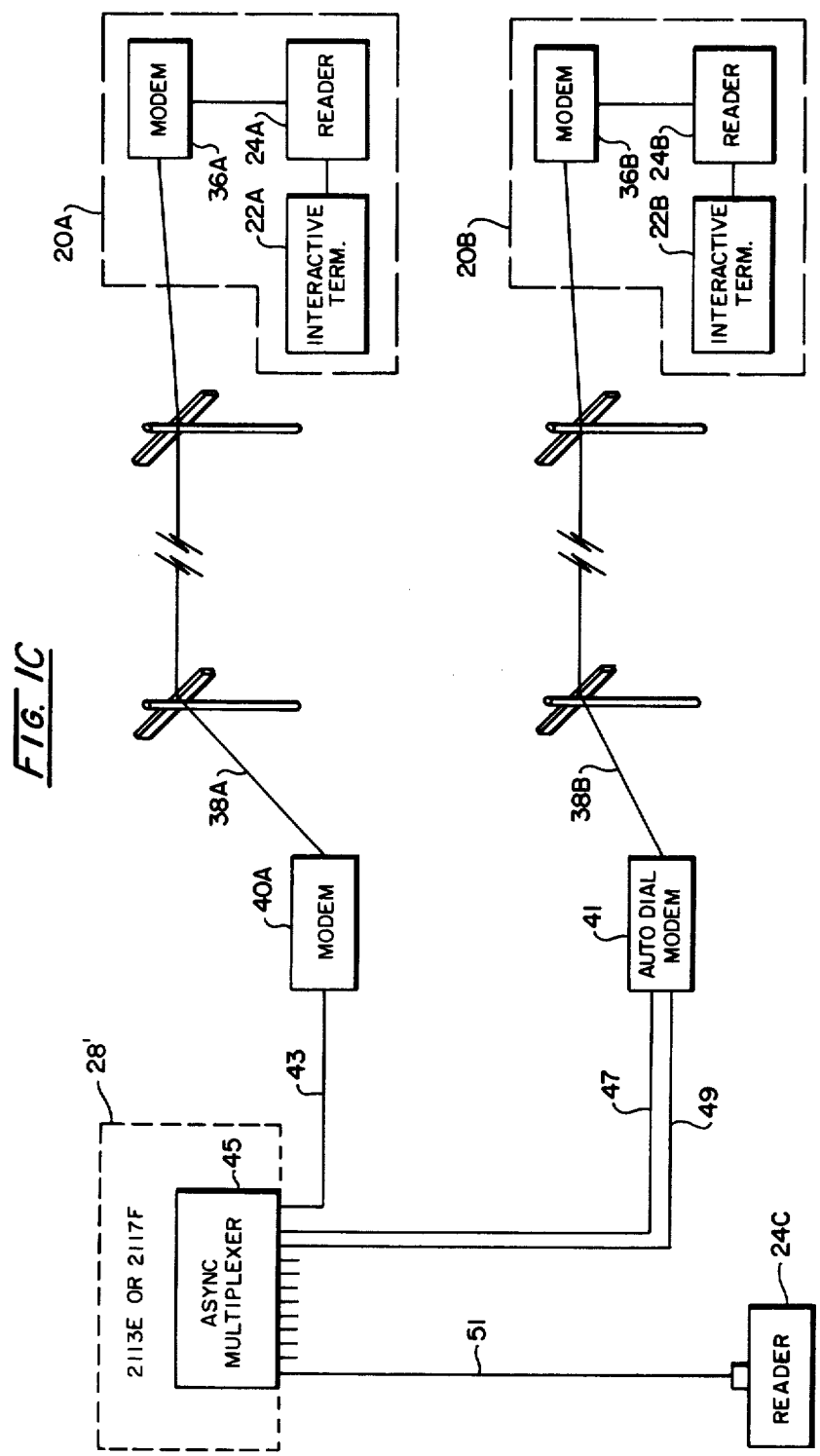

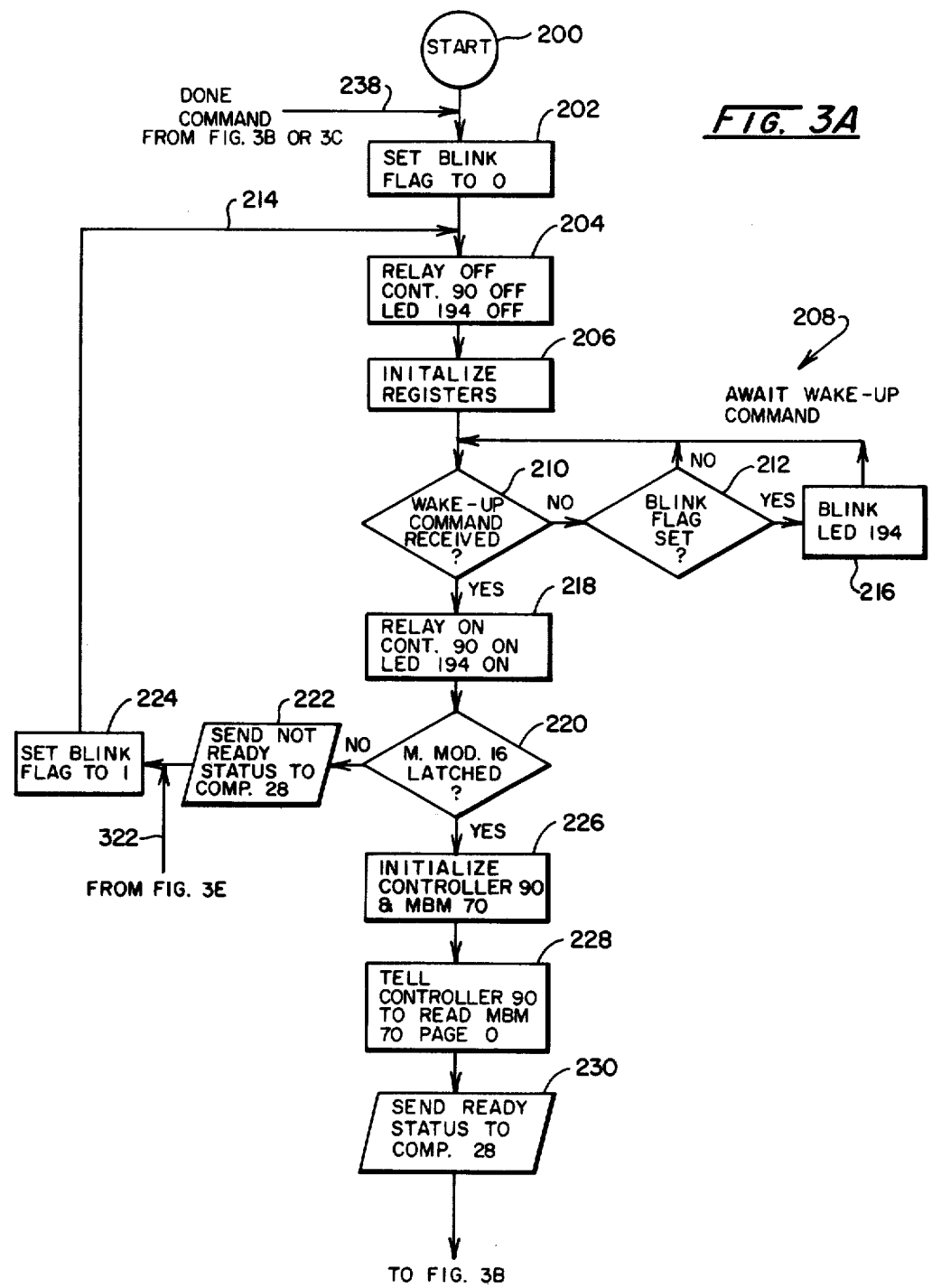

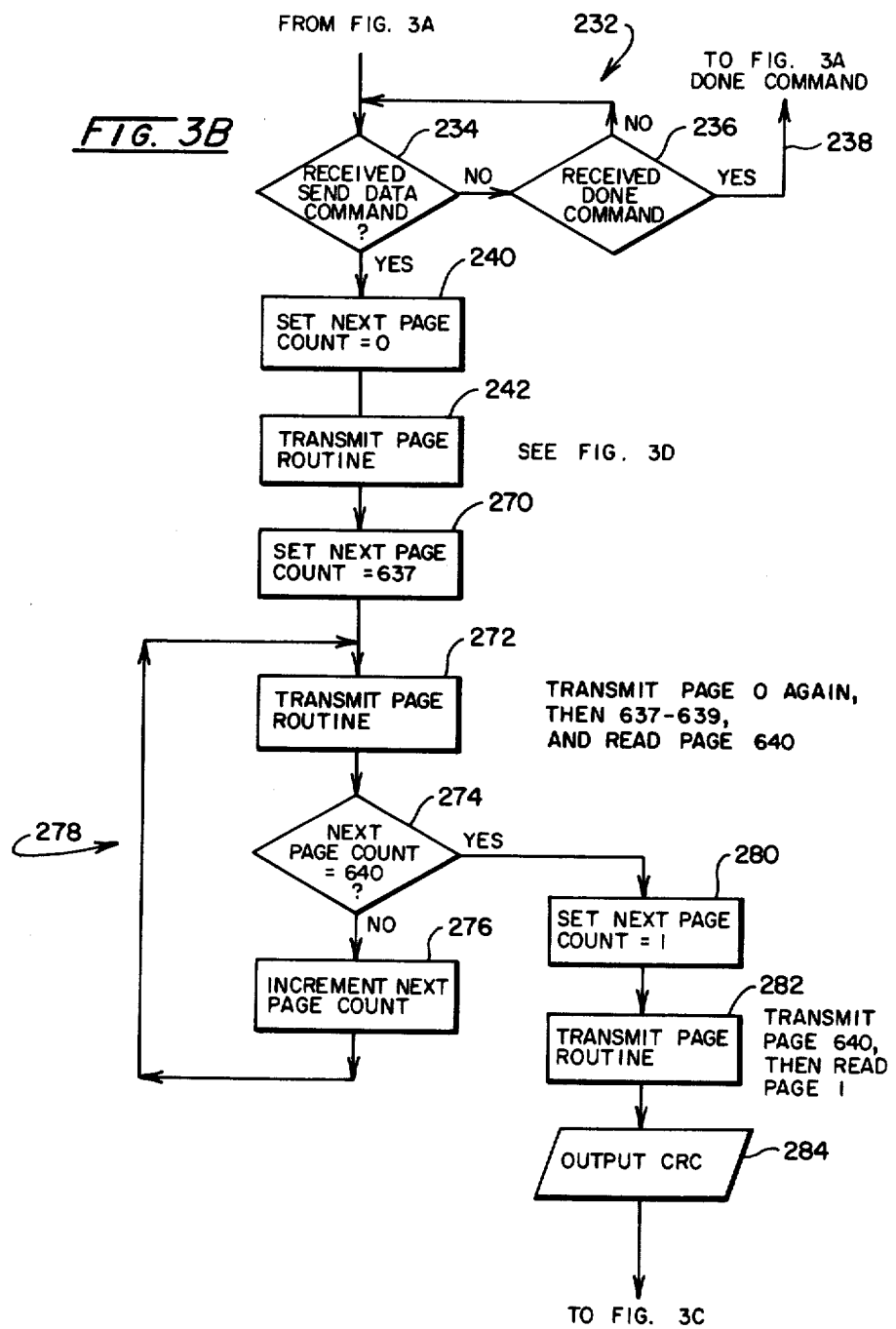

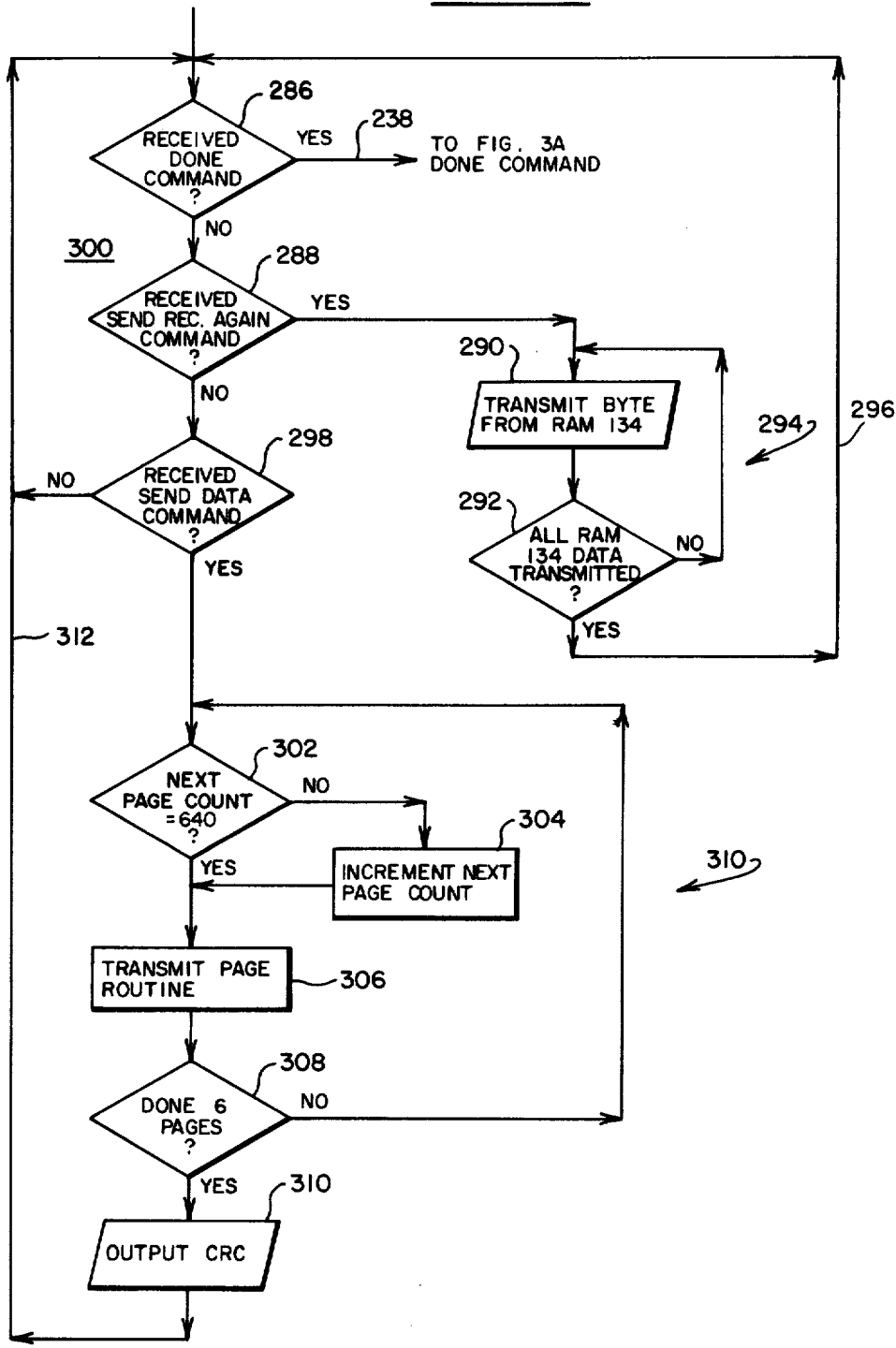

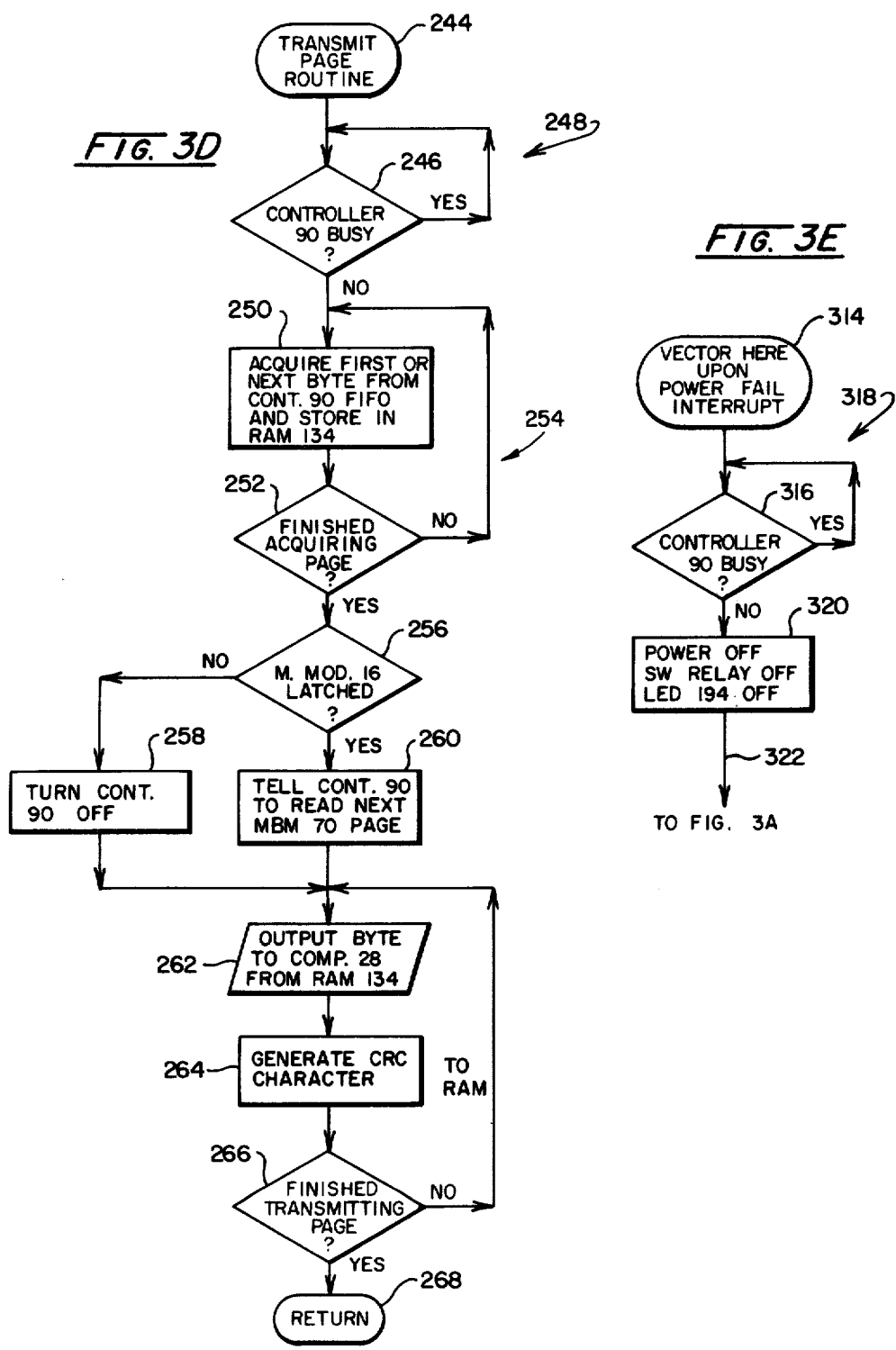

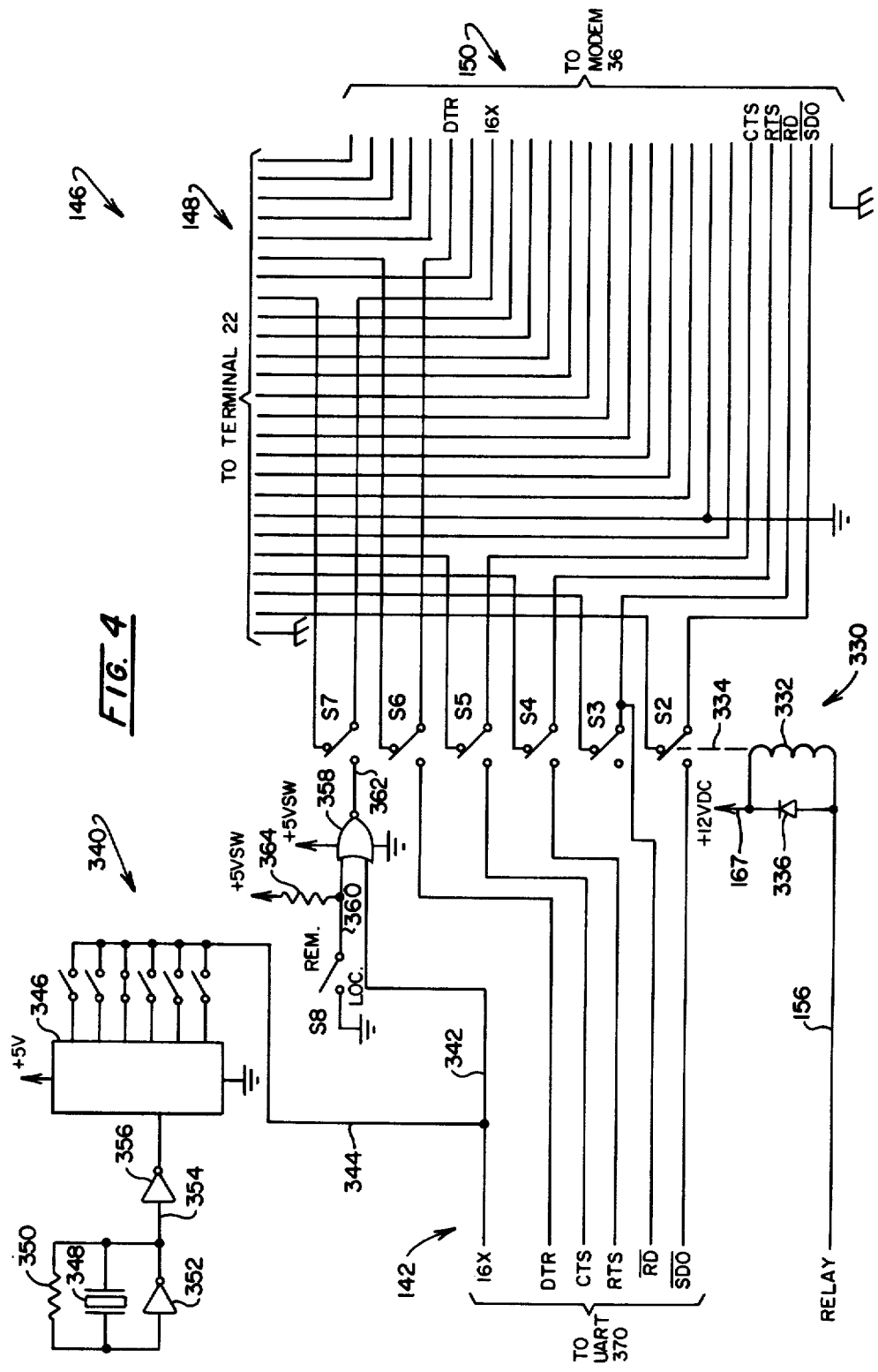

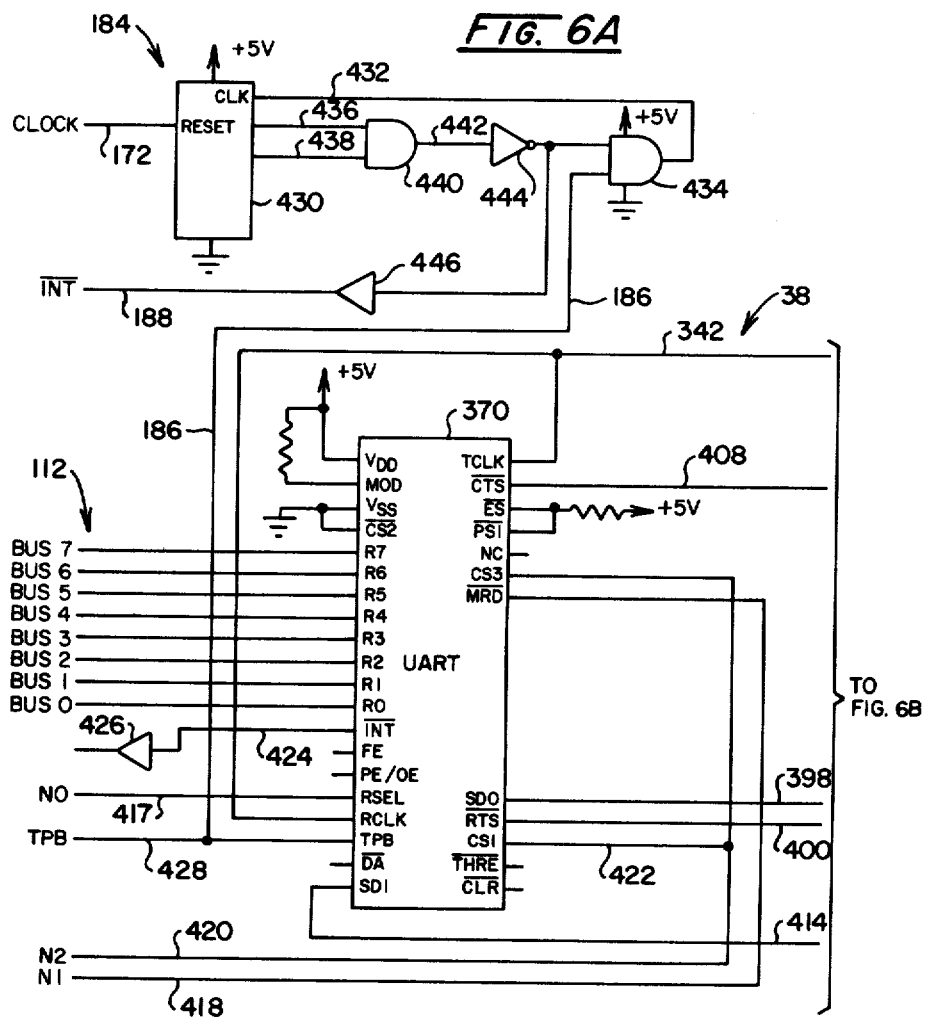
FIG. 6A
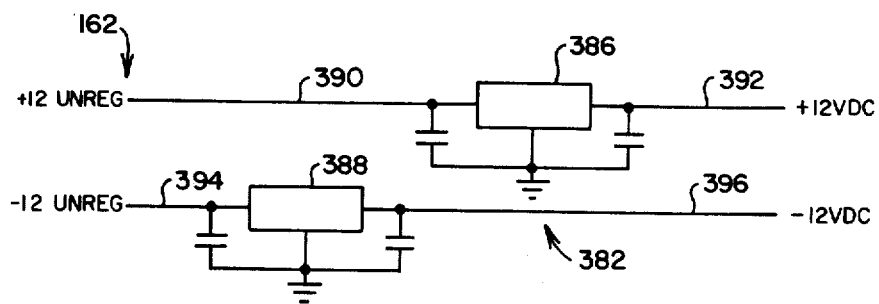

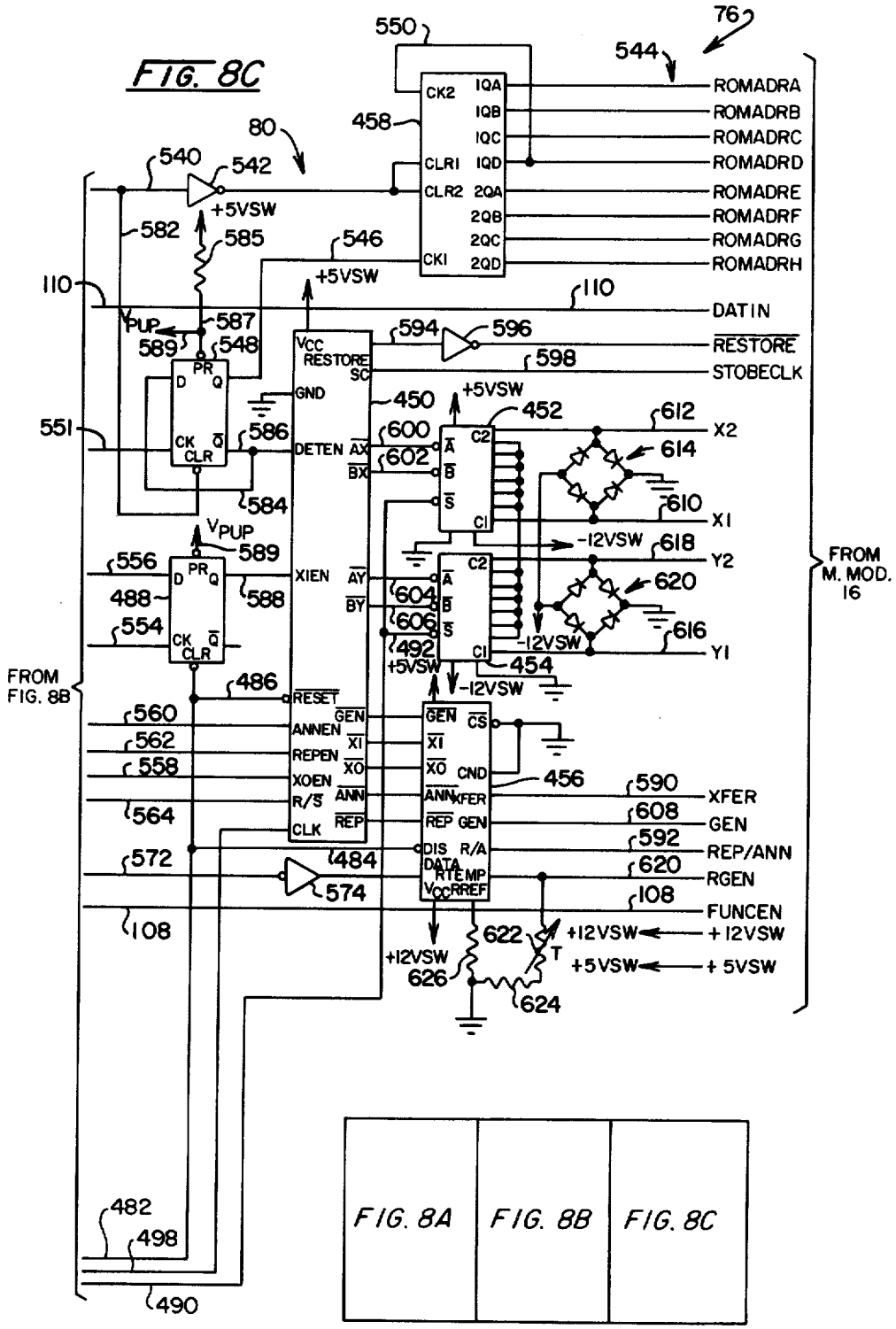

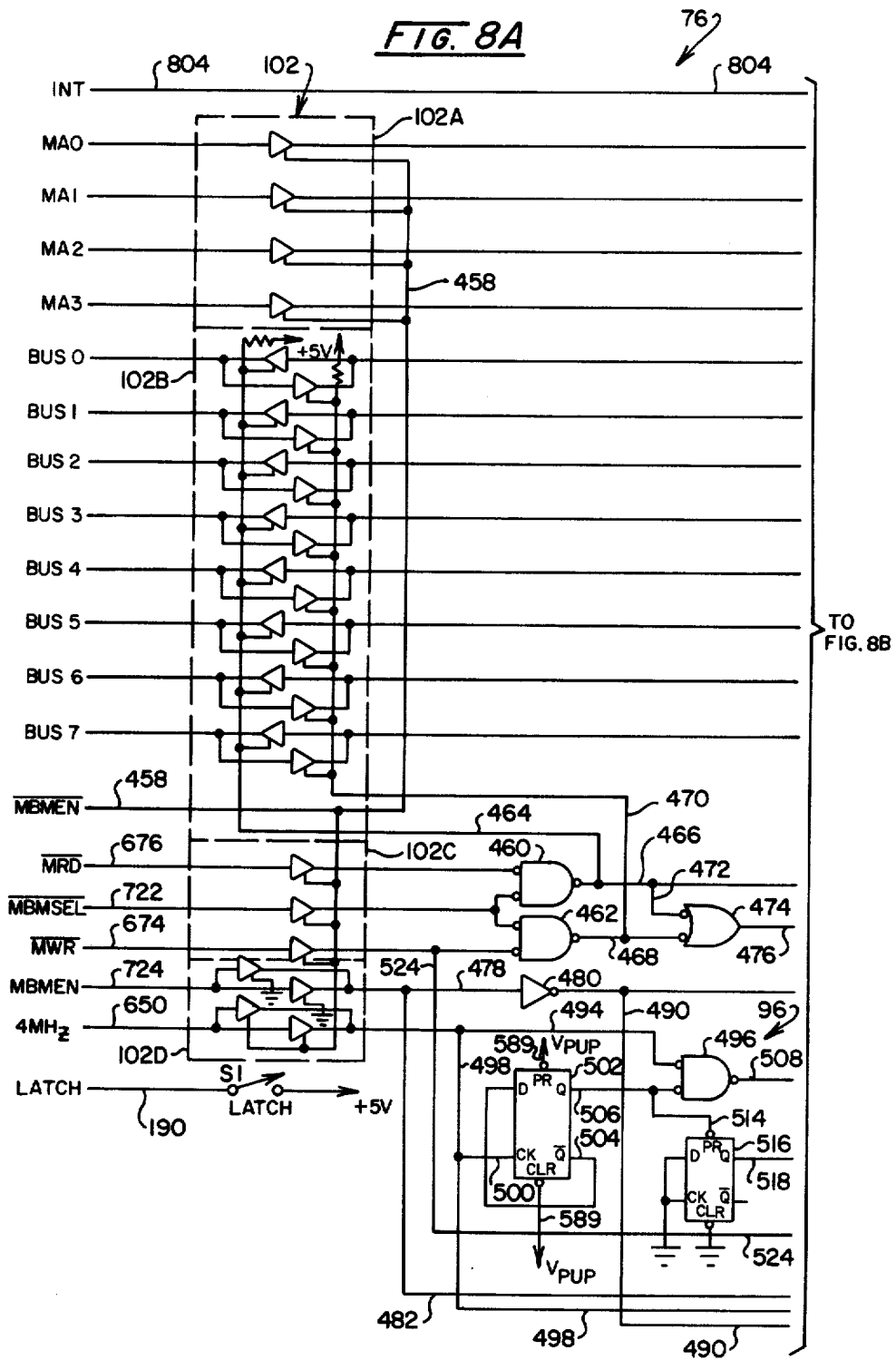

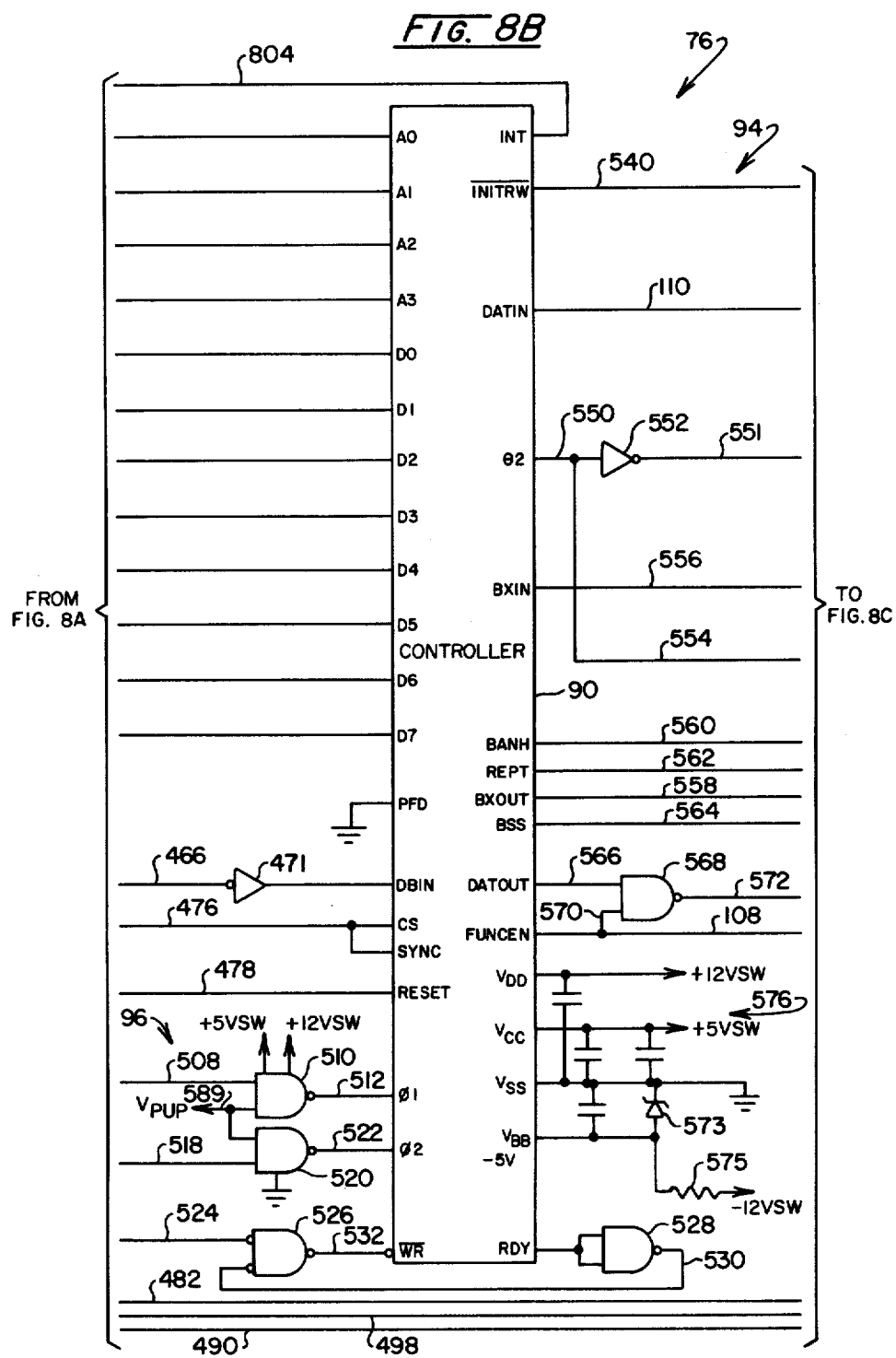

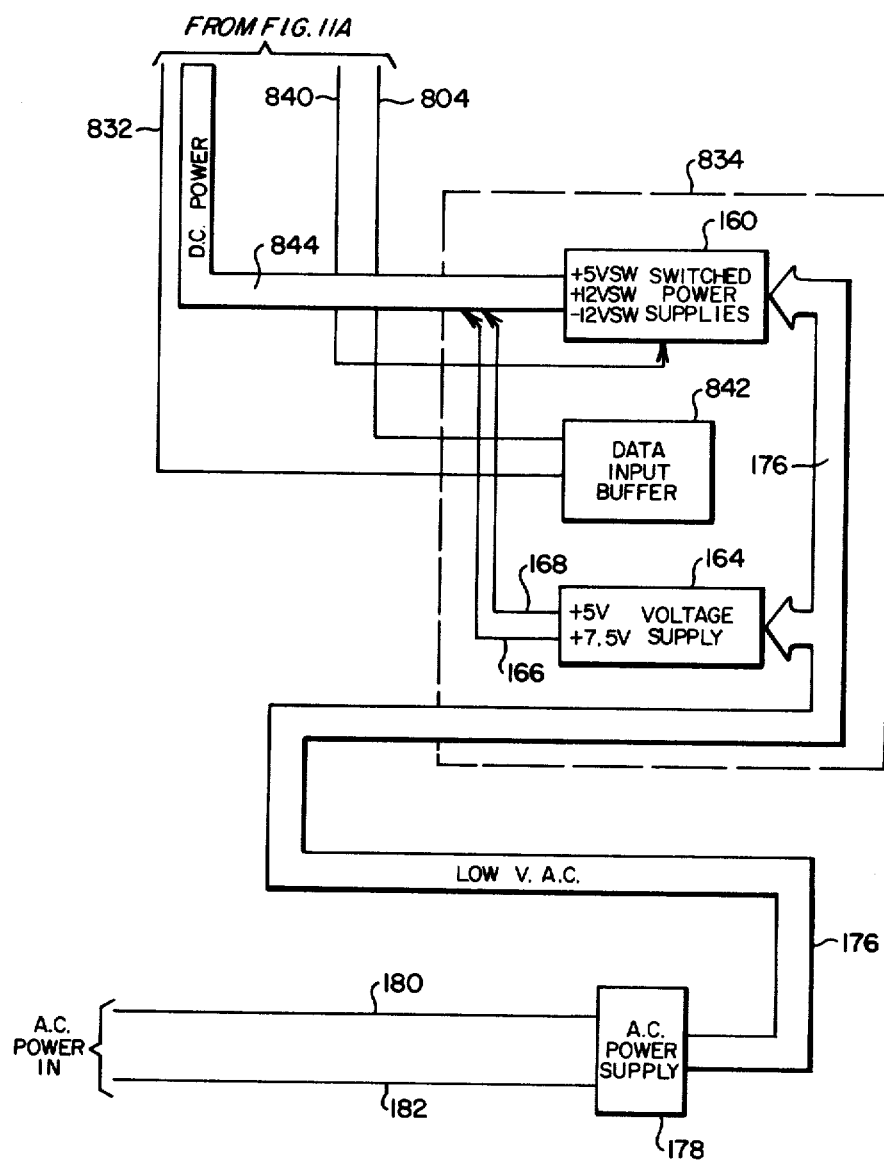

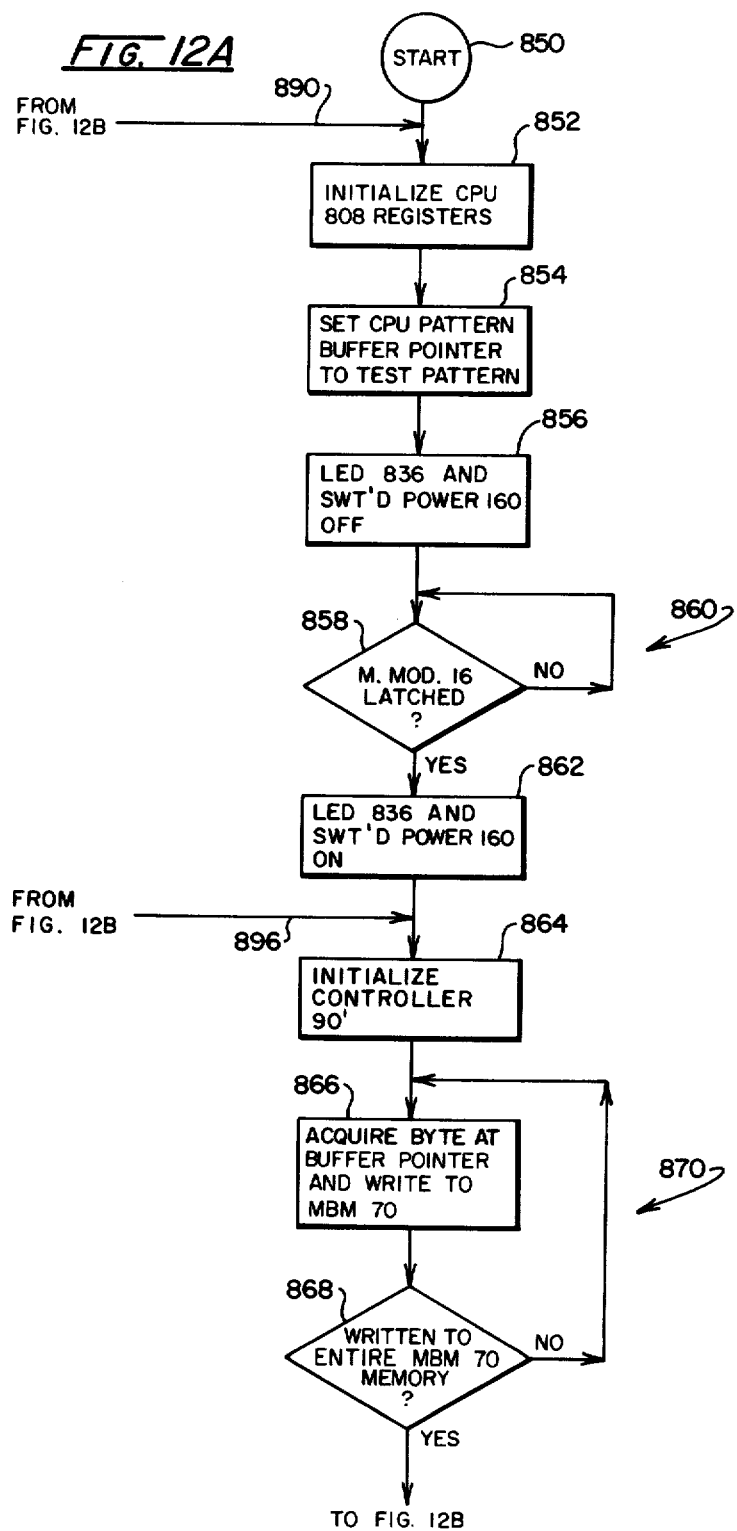

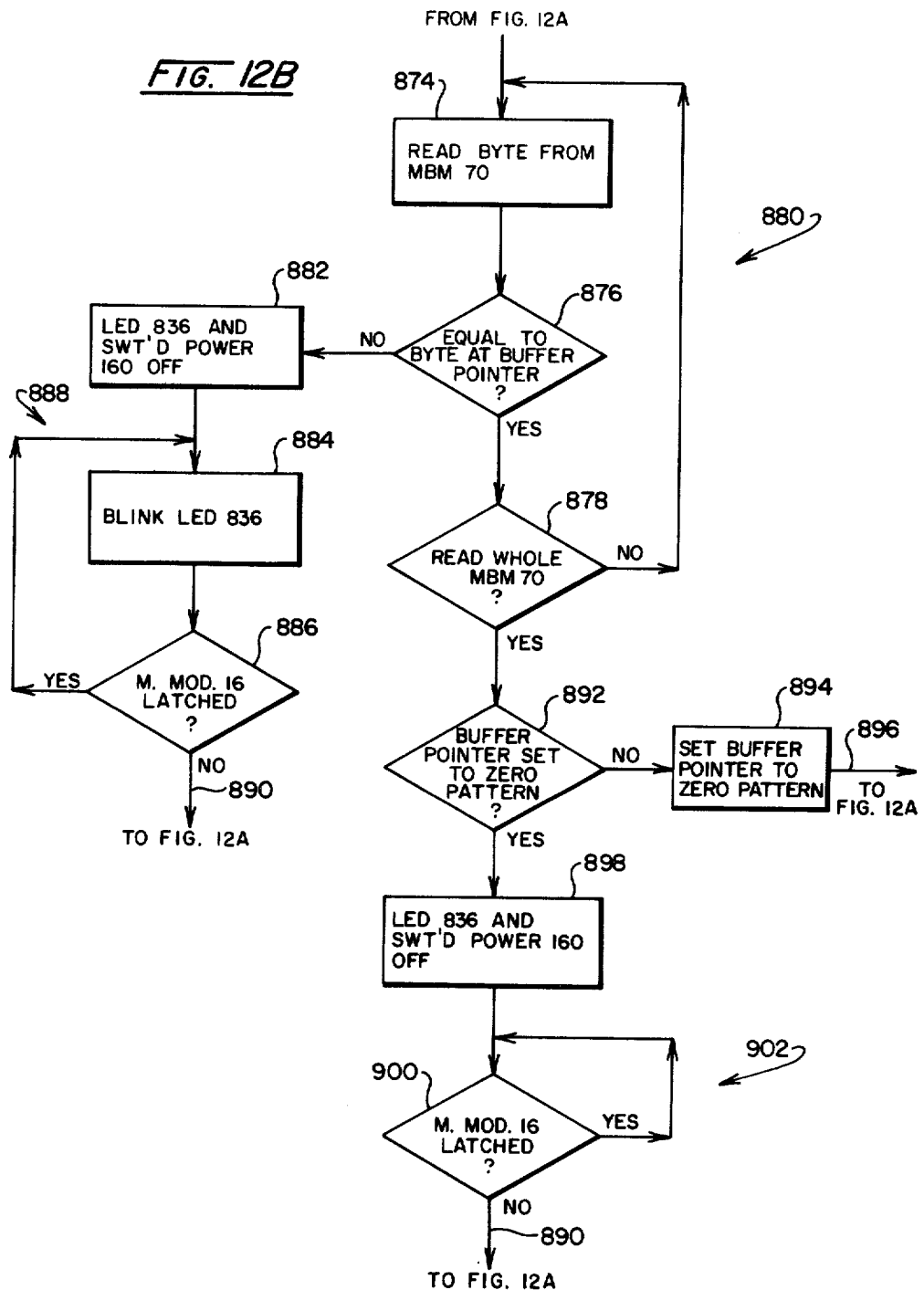

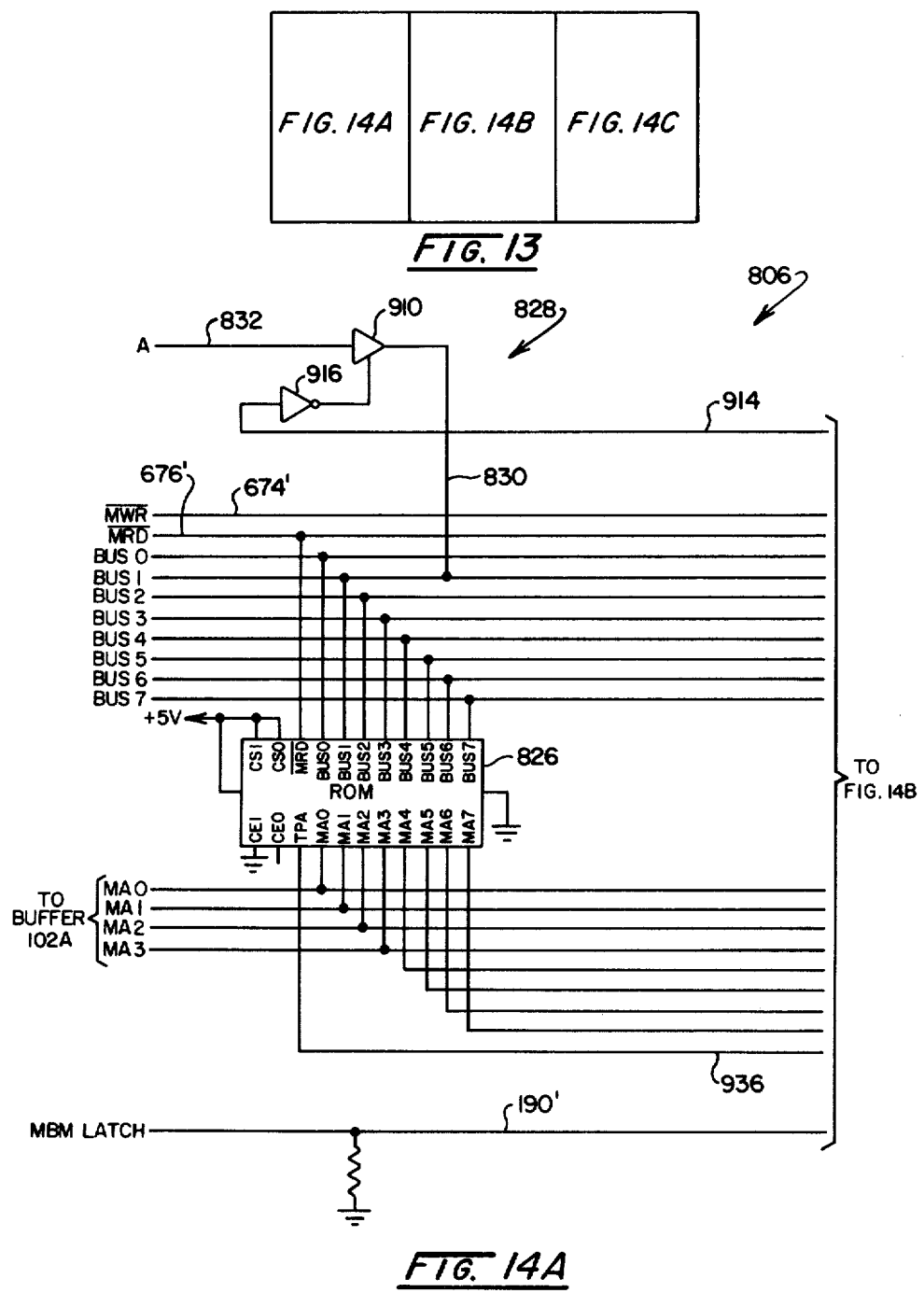

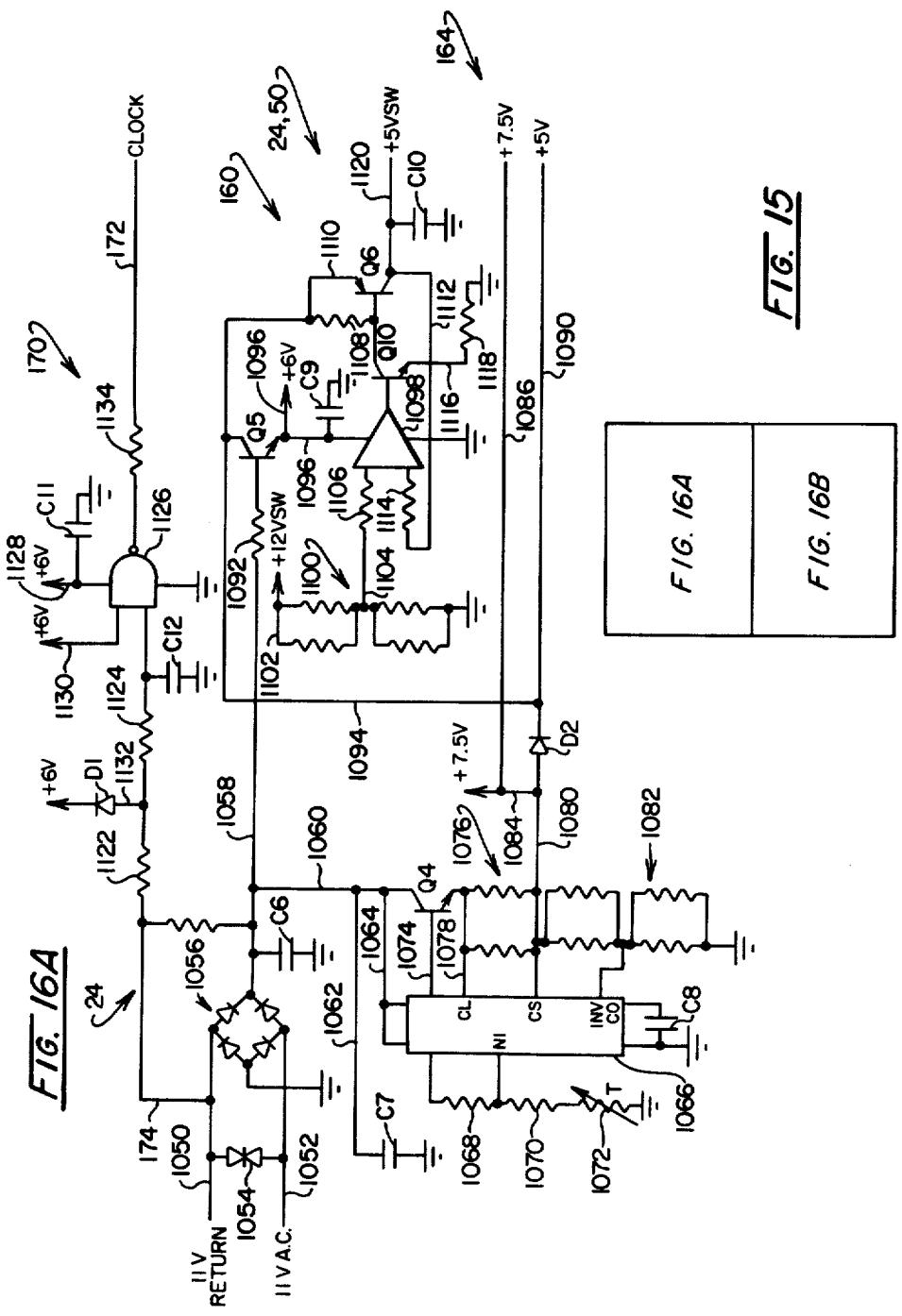

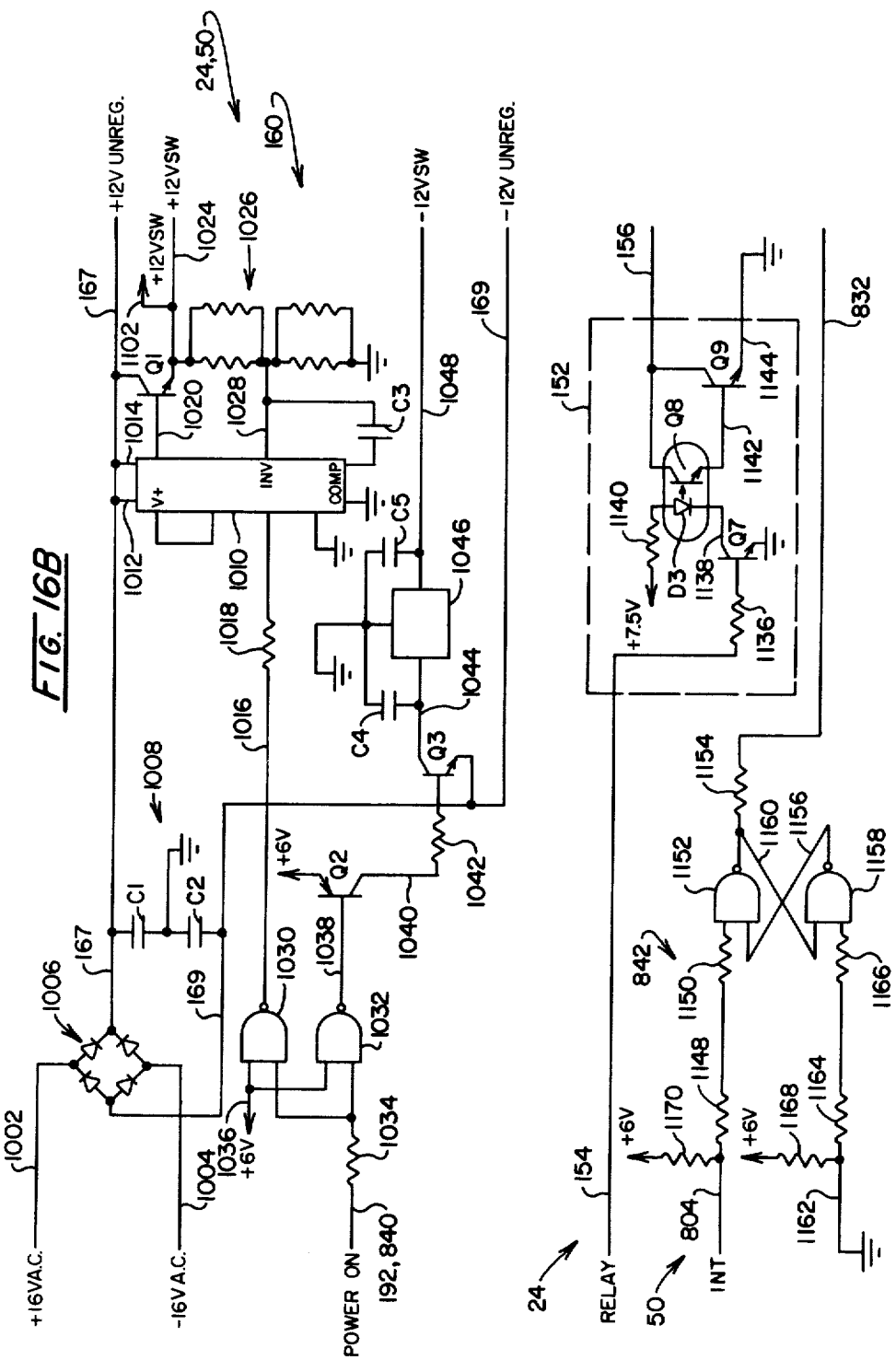

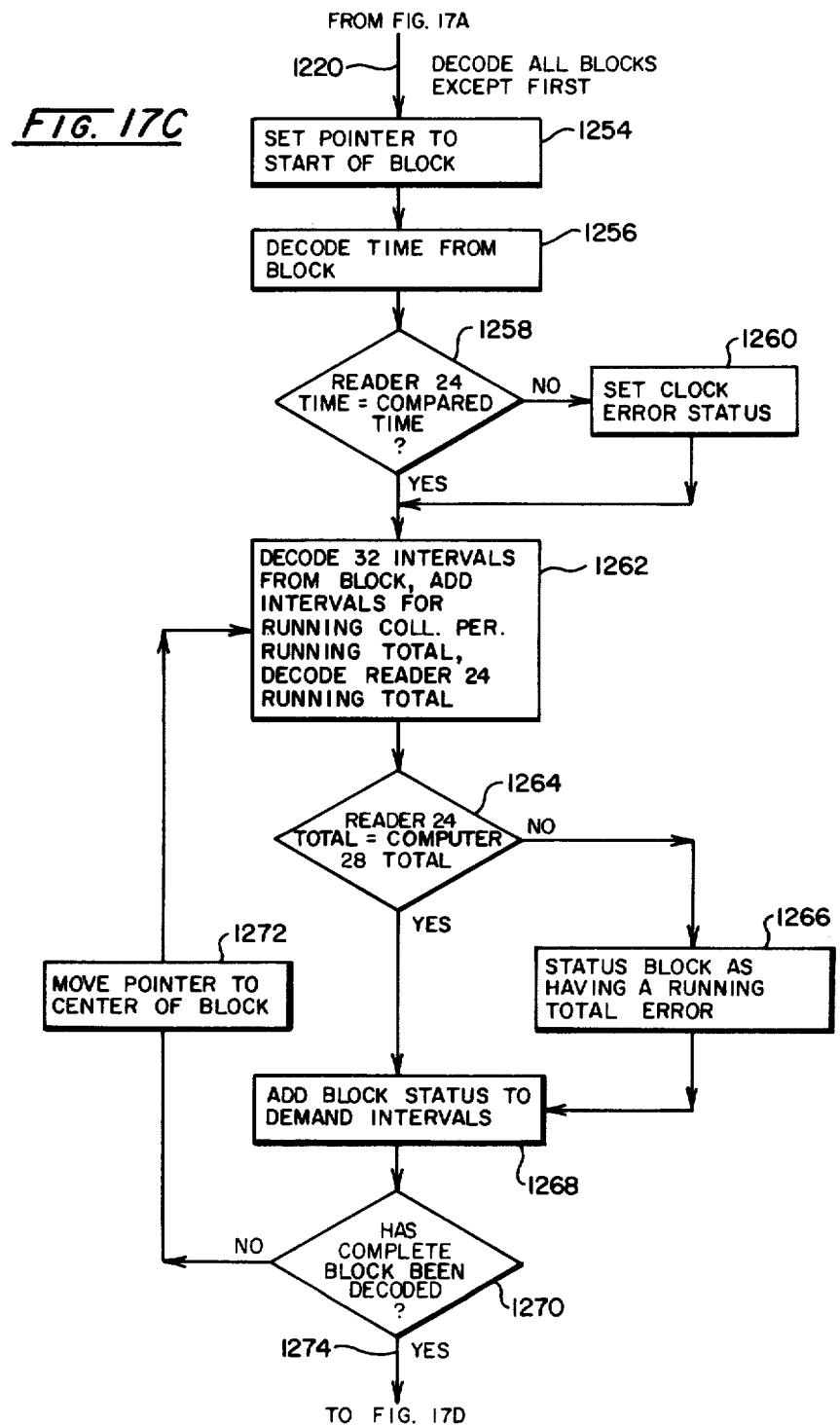

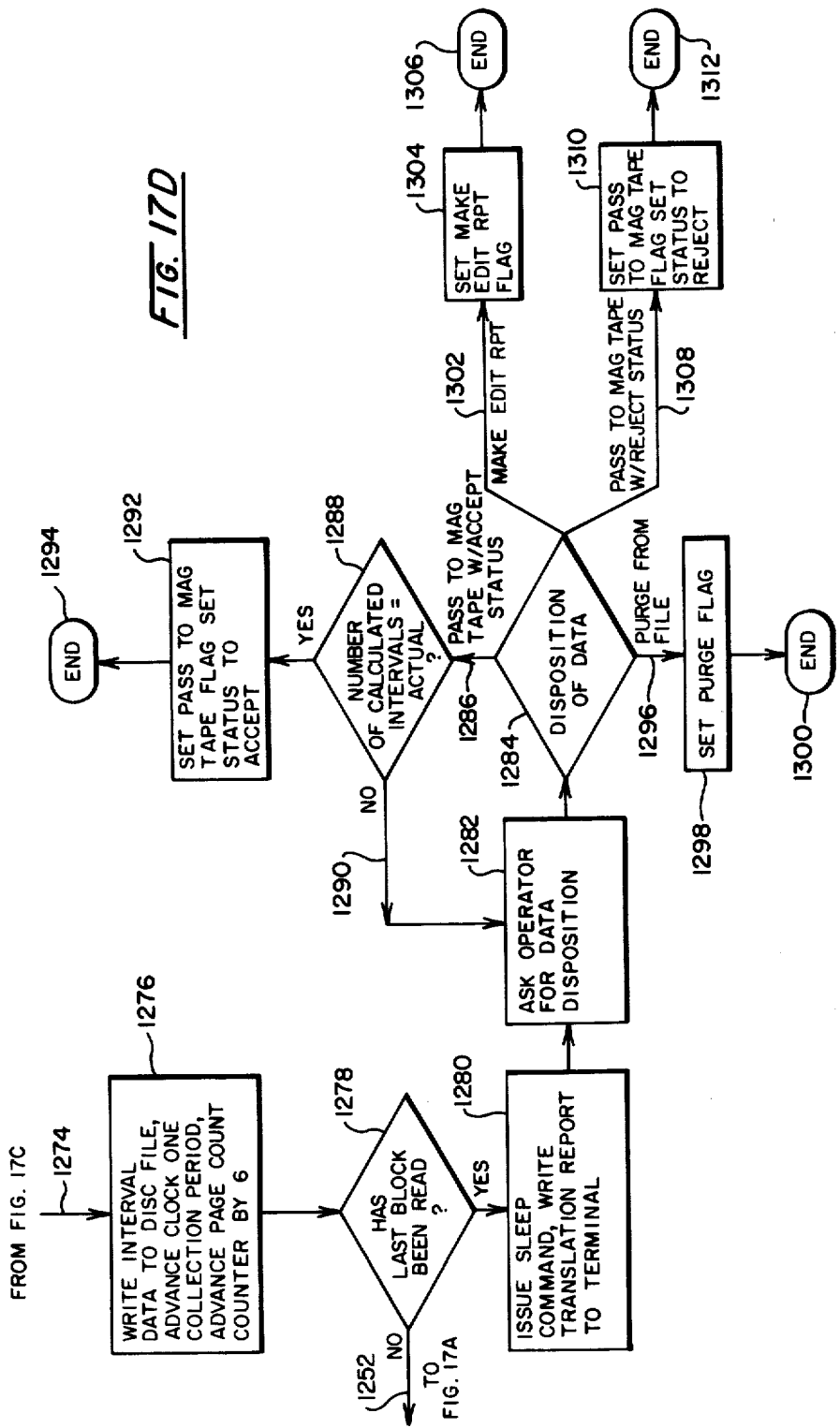

SYSTEM FOR PROCESSING DATA RECEIVED FROM A PORTABLE DATA STORE AND FOR CLEARING THE STORE

BACKGROUND OF THE INVENTION

In carrying out the billing of principal commercial or industrial clients and the like, power utility companies utilize meters which are installed at the pertinent user locations, which meters are associated with recording implements. To provide a recordation of data total and peak power demands, the meters are configured having pulse initiator devices and related circuitry which serve to develop a recordable pulse output in correspondence with KWH meter disc rotation. Thus, the number of pulses developed within a predetermined relatively short interval, called a "demand interval", may be correlated with power usage. Recorders are associated with the meters for providing a record of the pulses and which generally are structured having a recorder deck which receives a magnetic tape cartridge, the tape within which serves, in turn, as a recording medium. Recorded with these pulses are periodic signals which are spaced in time to define the commencement of successive demand intervals. The recorders typically also will incorporate a mechanical register which responds to the generation of each pulse to provide a cumulative total thereof which can be visually read. Also provided for visual inspection is a clock having a conventional twelve hour display.

The magnetic tape cartridge retain tape in an amount adequate to exhibit a recording duration commensurate with the desired billing periods which may range from about thirty to over one hundred days. To achieve this capacity in a practical manner, recording tape speeds are quite slow, typically being about two thousandths of an inch per second.

In performing the recorded pulse billing approach, service personnel of the cognizant billing company periodically visit the sites of the meter-recorder installations at which time they remove the previously installed magnetic tape cartridges and install a cleared or erased one. As part of this exchange, the service personnel are required to develop a written record of informational data associated with the particular meters serviced. These data will include serial number, fictitious customer identification number or the like which is associated with the meter; stop time, representing the time of cartridge removal; and stop register readings, representing the recorded number of pulses at the time of removal of a cartridge. Generally, both the time shown on the recorder clock as well as the corresponding time shown on the service personnel's wrist watch or the like is provided. The thus manually logged information is recorded on a card which is packaged with or attached to the removed magnetic tape cartridge for transfer to a more or less centralized translation facility. Corresponding data are logged with respect to the installation of the cleared cartridge. In this regard, the start register readings and the time of start-up are recorded along with customer identification data and recorder clock times. This information is maintained with the recorder or meter for use in connection with the next servicing visit. As is apparent, the start-up information recorded on the last previous visit again is logged by the operator for incorporation with the removed cartridge. Each of these manual recordation steps constitutes an event of potential human error.

The information containing magnetic cartridges and the manually logged data cards associated with each are transported by mail or by the service personnel to a centralized translation station. At this station, the data retained by the tapes are developed into a computer compatible medium from which billing computations are carried out. As part of this process, however, personnel at the translation station must manually enter into the computerized translation system all data written down by service personnel in the field for each cartridge. Thus, another occasion for the occurrence of human error is introduced into the system. Additionally, in the latter regard, the data cards associated with a given cartridge may be misplaced in transit to the translation station.

The number of magnetic cartridges processed on a day-to-day basis at typical translation stations is quite large, justifying the relatively high capital investment associated with such stations. Further, this translation procedure itself is labor intensive, time being required to enter written data as above-described as well as in transferring tape related data. These data are removed at higher tape speeds, about three and a half minutes typically being required for the procedure, the combined procedures culminating into a relatively lengthy processing period. This processing period results in a relatively heavy personnel cost factor.

Upon transferring data, the magnetic tape within the cartridges must be cleared or erased for reuse and this procedure again requires a labor expenditure. Additionally, it has been considered desirable to verify that the tape has been properly erased. However, mechanisms for carrying out such tape certification have been found to require a considerable investment and thus, tape verification procedures typically are not resorted to.

The general location of the translation station with respect to metering sites varies for each utility company. In areas of dense industrial installations, all of the metering and recording sites may be located within facile commuting distance from the station. However, the business expanse of many power utility companies encompasses wide geographical regions, often including several states or governmental regions and requiring communication between metering and translation stations over distances spanning as much as hundreds of kilometers. It would appear, therefore, that in view of these communicating distances, some form of telecommunication should be established between remotely located magnetic tape cartridge reading implements and centrally located, more expensive and elaborate translation stations. Unfortunately, magnetic tape cartridges, being read at much higher tape speeds than those provided during recording to achieve the noted three and a half minute read-out time, are not suited for telecommunication forms of transmission. They either must be shipped or hand carried to the translation stations. Such forms of tape cartridge transportion, in addition to being subject to human error, impose billing delays costly to the power utility companies in terms of cash flow and the like.

SUMMARY

The present invention is addressed to a system and associated apparatus for treating meter source data which not only improves the accuracy of its collection, but also expands capabilities for analyzing such data.

Human error factors encountered in earlier systems and techniques are avoided and the labor factors associated with data collection and translation are lowered with the instant system. A particularly advantageous feature of the present invention resides in a capability for economically providing reader and erase stations at diverse locations remote from a centralized translation facility and transferring collected data from these diverse locations to the translation facility by telecommunication. Telecommunicative transmission between the reader and translator stations is verified through the computation of a cyclical redundancy check character by both the reader apparatus and the translator station followed by a comparison of the characters at the translator station. Telecommunication of data is made practical through the use of a portable data storage device which is provided as a cartridge-like component having a magnetic bubble memory and which is operatively associated by field operators with the reader station. This magnetic bubble memory feature not only provides a readily erasable data collection module, but also provides for a practical memory verification procedure to be carried out at a verification station.

Another feature and object of the invention is to provide a system for treating data signals representing measurable events occurring at a data source which includes portable data storage devices having solid state memory for receiving and storing data words, and a recorder positionable at the data source for removably receiving the storage device in signal communicating relationship. The recorder generates data words representing the data signals which are received during a select interval of time, sometimes referred to as a demand interval. The recorder further transfers these data words into predetermined locations within the portable signal storage solid state memory. A reader is provided which is positionable at a location remote from the data source location which may removably receive the portable data storage device in signal communicating relationship. The reader includes a first signal processor which is initially energizable to assume a standby status and which is responsive to an activation command signal subsequent to assuming the standby status to assume an active status and which is responsive to a transmit command signal for transmitting the data words to an output. Such system further provides a translator station which may be present at a centralized facility remote from the reader station which has an input for receiving, when activated, the transmitted data words from the reader output and which includes a second signal processor which serves to generate the activation command signal and transmit command signal and which operates to analyze the validity of the transmitted data words as well as carry out the recordation thereof upon a storage medium such as a conventional mainframe computer tape. The system further may include a terminal which is located in the vicinity of the reader and which is in a selective interactive signal communication with the translator station and through which by manual actuation, the activation of the translator may be carried out.

Another feature and object of the invention is to provide a system as above described incorporating reader apparatus which responds to an activation command signal from a translator station for transferring a first group of data words from a predetermined location within the solid state memory of the portable storage device to a signal storage arrangement and which is responsive to a subsequent transmit command signal for transmitting that first group of data words stored within the signal storage arrangement at the reader output while transferring a second group of data words into the signal storage arrangement while the transmission is being carried out. This permits reading and translation procedures to be carried out at improved rates.

Another object of the invention is to provide a system as above described wherein the reader apparatus signal processor is configured for carrying out an arithmetic operation based upon a predetermined mathematical expression and with respect to all the transmitted data words to derive a first check character signal which is transmitted at the output of the reader. Correspondingly, the translator signal processor is configured for carrying out the same arithmetic operation based upon the predetermined mathematical expression and with respect to all of the transmitted data words received at its input to derive a second check character signal. The translator signal processor further is configured for carrying out a comparison of the value of the first and second check character signals for deriving an error status signal in the presence of an inequality therebetween. Upon the occurrence of an inequality between the first and second check character signal values, the translator signal processor generates a transmit again command signal received at the reader apparatus to provide for the retransmission of the data word signals. The translator station signal processor further is configured for deriving an error status signal in response to a predetermined number of occurrences of the inequality between the first and second check character signal values.

Another object of the invention is to provide a system as above described wherein the reader station signal processor is responsive to a deactivation command signal to assume a standby status and the translator station signal processor is configured for response to a ready or status signal of the reader apparatus within a predetermined interval following an actuation command signal so as to subsequently generate a transmit command signal. The translator signal processor responds at the termination of the interval as noted for generating a deactivation command signal to cause the reader station to assume its standby status. Additionally, the translator station is configured for receiving transmitted data words within another predetermined interval following its submission of a transmit command signal and in the event such data words are not received, the translator generates the deactivation command signal to cause the reader station to return to a standby status.

Another object of the invention is to provide a system of the type described which includes an eraser apparatus which is positionable in the vicinity of the reader apparatus and which removably receives the portable data storage device in signal communicating relationship. The eraser includes a signal processor which is configured for initially inserting a predetermined data word test pattern into the solid state memory of the portable data storage device. The signal processor then subsequently reads the inserted test pattern and then carries out a comparison of the inserted test pattern with the read test pattern to derive a memory error signal in the presence of an inequality therebetween. The eraser apparatus then responds to erase the solid state memory of the portable data storage device in the absence of the inequality. Some perceptible indication, for example a blinking light or the like, is provided in the presence of the memory error signal.

Other objects of the invention will, in part, be obvious and will, in part, appear hereinafter.

The invention, accordingly, comprises the system and apparatus possessing the construction, combination of elements and arrangement of parts which are exemplified in the following detailed disclosure. For a further understanding of the nature and objects of the invention, reference should be made to the following detailed description taken in connection with the accompanying drawings.

BRIEF DESCRIPTION OF THE DRAWINGS

FIGS. 1A, 1B, and 1C are schematic representations of the system of the invention, showing metering stations, bubble memory association therewith, as well as reader and eraser apparatus, operator consoles and mainframe computers;

FIGS. 3A-3E are a composite flow chart representing the microinstructions utilized in connection with the reader apparatus of the invention;

FIG. 4 is a circuit diagram showing one portion of the reader apparatus of the invention associated with a relay and oscillator function shown in FIG. 2A;

FIGS. 6A and 6B represent a circuit diagram of input-output components of the reader apparatus of the invention;

FIG. 7 is a miniaturized representation of the proper positioning of FIGS. 8A-8C;

FIGS. 8A-8C are a circuit diagram showing controller and related function represented in general in FIG. 2A;

FIGS. 11A and 11B are a schematic representation of the eraser apparatus of the invention;

FIGS. 12A-12B represent a flow chart describing the microinstructions of the eraser components of the invention;

FIG. 13 is a miniaturized representation of the proper positioning of FIGS. 14A-14C;

FIGS. 14A-14C are a circuit diagram showing the microprocessor and related components represented generally in FIG. 11A;

FIG. 15 is a miniaturized representation showing the proper positioning for considering FIGS. 16A-16B;

FIGS. 16A and 16B are a composite circuit diagram showing powering components for use in connection with either or both the reader and eraser apparatus of the invention;

FIGS. 17A-17D represent a flow chart describing the instructions of the processing components of the translation arrangement of the invention as such components relate with the reader apparatus.

DETAILED DESCRIPTION

Figure 2A:
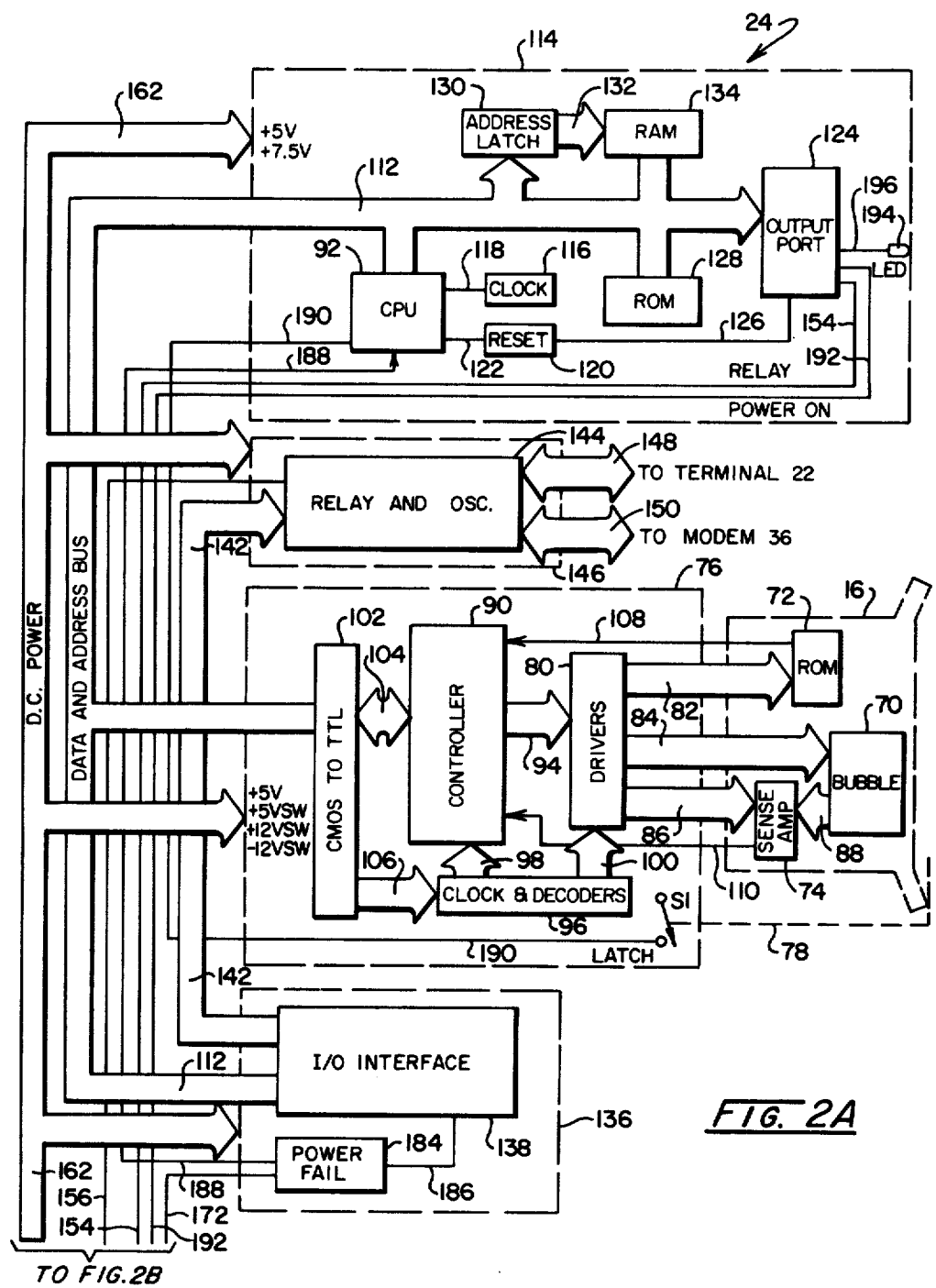
FIGS. 2A and 2B are a schematic drawing of the circuit components making up the reader portion of the system of the invention.

The system of the present invention permits a significant enhancement of the capability for utility companies to more accurately and efficiently collect, transfer, read and translate power demand or utilization data. An overall view of the system is represented in FIGS. 1A and 1B. Referring to FIG. 1A, a power consumption site is schematically portrayed as located within a given geographic boundary represented by the dashed line 10. This user location will have positioned therewith one or a plurality of power monitoring meters, conventionally of an inductive variety, which are fashioned so as to provide not only a dial read-out of total power consumption, but also will include pulse initiator circuits which generate pulse signals in correspondence with, for example, the rotation of a meter disc. Accordingly, the rate of production of these pulses, as well as their total may be utilized to evolve a profile of power utilization. This profile then is translated in accordance with prenegotiated billing approaches for determining power costs.

The position of the demand metering and pulse initiator circuitry is represented within boundary 10 by block 12. Block 12 is shown associated with a data recordation and storage function represented by block 14. In the past, such recordation as represented at function 14 has been provided as discussed above by magnetic tape recording devices operating in conjunction with tape cartridges. However, as described in U.S. Pat. No. 4,361,877, entitled "Billing Recorder with Non-Volatile Solid State Memory" by Robert E. Dyer et al, and assigned in common herewith, such data recordation now may be carried out utilizing solid state implements having essentially no moving parts. With this improved apparatus, resort is made to magnetic bubble memory technology wherein a magnetic bubble module or small cartridge-like component is utilized in place of the former magnetic tape cartridge. Such a magnetic bubble memory module (MBM) or portable data storage device is represented at 16 and includes a small indicator region 18 providing a color coded representation of its erased or data-containing status.

Enjoying the attributes of non-volatility, high density storage capability and non-mechanical structure, the bubble memories or chips within modules 16 are formed generally of a suitably prepared magnetic material, such as epitaxially grown magnetic garnet films exhibiting a predominant direction of magnetization perpendicular to the film plane. By applying a bias field normal to the film plane, circular cylindrical magnetic domains, termed "magnetic bubbles", are formed which can be annihilated or generated to evolve a logic storage system. In this regard, reference is made to the following publications:

I. "Magnetic-Bubble Memory Technology" by Chang, Marcel Dekker, Inc. 1979.

II. "TIBO203, Magnetic-Bubble Memory, Systems Application Manual", Texas Instruments, Inc., 1979, Dallas, Tex.

Publications I and II are incorporated herein by reference. Preferably, the mobile memory architecture utilized with the bubble memory device of module 16 is one which incorporates a major-minor loop approach in which data are generated in a major loop, serially shifted to align with minor loops and then transferred for storage to the minor loops. The Type TIBO203 magnetic bubble memory device described in Publication II is packaged containing a 92,304-bit bubble memory chip, two mutually perpendicular coils for providing a rotating magnetic field, a permanent-magnet structure for providing required static field and a magnetic shield assembly. Architecture for the device incorporates a major loop and 157 minor loops of 641 bits each.

The major loop contains generate, replicate (duplicate) and annihilate control functions as well as a detector. Production economies provide for the redundant production of 157 minor loops, of which 13 may be determined to be defective. Accordingly, a dedicated ROM function is provided to evolve information as to which of these loops are defective.

The above-catalogued control functions are accomplished by providing current pulses through appropriate control elements on the bubble chip. For example, a current pulse through a control element causes a local alteration in magnetic field. This field alteration in conjunction with a permalloy pattern formed upon the film serves to carry out overall control. Generally, a chevron-shaped propagation pattern is provided to direct bubble movement within the loops.

Bubble domains are created by current pulse flow through a generate loop. The presence of a bubble in a bit position represents a logic "1" and the absence thereof, a logic "0". When a data string equal in length to the number of minor loops (considered a "page" of data in some sectors of industry) has been generated and shifted around the major loop to align with the minor loops, a transfer gate is energized. The page of data then is transferred to the minor loop and is circulated there. New data may be generated, shifted and transferred into each of the 641 different minor loop "page" positions.

Generally, data are retrieved from the minor loops a "page" (as defined above) at a time. When the desired page rotates to the top of minor loops, it is transferred to the major loop where the bits move in serial form until the first bit arrives at a replicate-annihilate element. If the page of data is to be stored again after being read, a replicate current pulse is issued when a bubble arrives at the replicate gate which stretches and cuts the bubble into two domains of the same size as the original. One of these bubbles is diverted into the detector area where it is read and destroyed, and the other continues moving about the major loop to be stored again at the minor loops. Thus, it is possible to read a page of data, recirculate the information and put it back in the minor loops for non-volatile storage. Before new data can be entered in a particular page position the old data must be removed by carrying out a destructive read operation which, essentially, provides for the insertion of zeroes.

Data recordation function 14 incorporates an appropriate receptacle and latch arrangement such that service personnel may insert module 16 thereinto and latch it into position. In its general operation, the memory components of the instant system record the pulses generated at metering function 12 in the sequence of their development. The pulses so generated effectively are recorded continuously in encoded fashion with no gaps or the like in their recordation. And, along with such recordation, the demand intervals within which they are collected also are recorded in a format wherein their real time and date of recordation may be determined. By contrast, no such real time information is available for recordation with magnetic cartridge recordation systems.

Because the recoration carried out by function 14 in conjunction with a plurality of serially inserted memory modules 16 is one which is continuous in nature and without gaps, the reliability of long term monitoring recordation is assured. In general, an accommodation for limiting the power requirements of the recorder device is provided by an arrangement wherein recordation function 14 incorporates a random access memory (RAM) feature which serves to retain pulse data as well as horographic and date data over an interval deemed a "collection period". Such collection periods may, for example, encompass any given number of demand intervals, typically a collection period of four hours being associated with a sequence of 16 successive 15 minute demand intervals. At the termination of any given collection interval, data recordation function 14 energizes the memory module 16 and inserts that data which it has collected, whereupon, power is terminated to the module. This arrangement permits the utilization of a battery type stand-by power supply within function 14 to accommodate for operation of the system even though power outages, environmental temperature limitations or the like are encountered. Further, memory positions are assigned to recordably denote or flag the condition of a power failure within a given collection period.

As is represented in labeled format in FIG. 1A, any given interim collection period, for example of four hours, will be represented by memory data representing the demand interval pulse counts, i.e. the number of pulses occurring during successive demand intervals, for example of 15 minutes. Also available from such an interim collection period record is the real time and data of pulse compilation. For example, for each 15 minute or the like demand interval within a collection period, the number of pulses occurring will be recorded and the real time including month, day, and hour and hour of commencement of the collection period. Further, the collection period data will include a running total pulse count as it exists at the end of a given collection period. Where more than one channel is provided, such definition of totals for each channel are provided. Additionally, status or high order bits are assigned to indicate whether or not a read after write test resulted in a failure. Further, a write failure as well as a power failure flag are provided.

Inasmuch as successive collection period intervals are assigned sequential real time or times of commencement and termination, for example "0 hour", "0400 hours", "0800 hours" etc., the real times of insertion of successive replacement memory modules 16, for the most part, will occur at times intermediate the commencement and termination of a pre-defined collection interval. Accordingly, the first page and fourth to last page of memory available within the bubble memory of module 16 are assigned, respectively, to contain "Insertion Record Data" and "Removal Record Data". Returning to the figure, it may be observed that the insertion record is shown to include the real time (hour and minute) and date of insertion of module 16, as well as an identification of the using entity of power consumption site 10. Additionally, the running total pulse count for any given number of channels is provided and these data generally are incorporated within a page designated "0" of the memory. Page "1" of the memory is assigned the month, day and hour representing the termination of the current collection period which occurs following the insertion of the new memory module 16. Demand interval data from the commencement of the collection period up until the time of insertion of module 10 are zero filled until that demand interval during which module 16 was inserted is encountered. At that point in time, pulse counts again are recorded within demand intervals commencing with an initial partial interval representation, it being understood that the zero filled demand interval memory locations will have been recorded in a memory module 16 which had been inserted within recordation function 14 next preceding the instant one. In addition to current demand interval data, page 3 (assuming the first page to be designated "page 0") of the memory will include channel related running totals of pulses as well as status data relative to whether a read after write failure was encountered or other such selected information.

The fourth to last page of memory within module 16, for example page 637, is assigned to receive removal record information as generally labeled in the drawing. This information will include the month, day, hour and minute of removal of memory module 10 along with an identification of the user at power consumption site 10 and the running pulse count totals for each of the number of channels through which such data was collected.

In pages 638-640, of module 16, the current demand interval data, representing the number of pulses collected within the partial collection period involved to the point of module 16 removal are compiled along with corresponding real time collection interval identification. Finally, a running total of the number of pulses represented by metering function 12, a status indication and data check verification are recorded in the last page of memory. Thus, a complete record of both encoded pulse data and supporting time and data information automatically are provided and recorded within the memory module 16. Additionally, the visual indication at region 18 is altered to reflect that module 16 has been utilized and is ready for reading and translation. In general, the service personnel are not required to attach data cards and the like to the module, or to record times and totals and the like as well as identification materials. All such data are written into solid state memory. This permits the minimization of the opportunity for human error to enter into the metering and translation system.

Where conventional, tape media recorders are involved, utility personnel travel to the power consumption site on a billing period basis, for example, once each month. At this time, they approach the meter or meters and associated recorders at the site and read the time off of the recorder, following which such data are written down on a data card associated with a magnetic tape cartridge. Then, the actual time at which the recorder tape magazine is changed as provided by the service personnel's wristwatch is written down as well as the register number on the meter or some identification of the user or customer. Additionally, the mechanical register output associated with the recorder is recorded on the data card along with the stop time or time at which the magnetic tape cartridge is removed. The data card, attached to the magnetic tape cartridge then is ready for removal to a central translation station. The service personnel then install an erased magnetic tape cartridge and record its start time, leaving the cartridge and associated data card at the site 10 for a repetition of the procedure on the next billing period visit.

In comparison, with the instant system, the service personnel approach the induction meters and recorder at the user site, remove the memory module 16 and install a new one. As an option, the personnel may write the start-up register reading for the next billing cycle. Start times and stop times need not be recorded and the service personnel need simply observe that the clock of the recorder is accurate with respect to real time.

Returning to the prior procedures, upon leaving the power consumption site 10, the service personnel, depending upon the geographical region of the utility, deliver the magnetic tape cartridges to a central translating station. Where such stations are somewhat remote, then the cartridges are mailed or delivered through some form of delivery service. Such delivery distances may encompass hundreds of kilometers. At the central translation station personnel receive the magnetic tape cartridges with attached data cards and manually enter into a translating computer all of the information written down by service personnel at the power consumption site. Thus, another opportunity for human error enters the system of the prior art.

From the foregoing, it may be observed that two occasions for the introduction of human error are present in connection with the central translation procedure. As indicated earlier herein, because a practical translation of magnetic tape within a cartridge must take place at tape speeds far in excess of recording speeds, transmission of such data by telecommunication is impractical. Thus, the opportunity for billing data loss during tape cartridge shipment is quite apparent. Such transmission further is impractical because the tape recorded data contains no segregation of data components, for example demand interval real time identification. As a second factor, personnel must be used to manually enter card containing data into the computerized translation systems.

Returning to FIG. 1A, with the system of the present invention, a local reader-erase station as represented within dashed boundary 20 is provided. At this station, an operator console having a visual readout along with an interactive terminal for use with a remote central computer station is provided as represented at block 22. This terminal will have the capability of operating with central computer programs above and beyond those associated simply with the reading of magnetic memory modules as at 16. The latter reading apparatus is represented at block 24 in association with the terminal 22 through a switching arrangement represented at block 26. Switching function 26 has a normal configuration coupling the operator console and interactive terminal 22 with a disc memory based mini-computer represented at 28 in FIG. 1B which serves to generate a principal computer compatible magnetic tape suited for carrying out automated billing of power users. The computer as at 28 may, for example, be present as a Hewlett-Packard, Model 2113E or 2117F, either device supporting up to 1,024K words of memory.

Mini-computer 28, representing a sizable capital investment, is installed at a geographically centrally located central translator station represented by dashed boundary 30. Direct terminal communication with computer 28 for purposes other than module 16 reading is represented in FIG. 1A at line 32 extending from switching function 26 to a modem cable 34 of reader and data validation function 24. In this regard, both functions 22 and 24 are capable of corresponding with mini-computer 28 by telecommunication as is represented by the extension of cable 34 to a modem 36. Modem 36 may be, for example, a Model T103V or T202S as manufactured by Rixon, Inc. of Silver Spring, Md. or the equivalent thereof. Extending from modem 36, there schematically is shown a telecommunications system represented by line 38 which leads to a modem 40 which is functionally identical to modem 36, which, in turn, is coupled through modem cable 42 to an I/O interface card 44 which is operationally associated with mini-computer 28. Card 44 is generally referred to as a "Buffered Asynchronous Communications Interface" generally identified as a type 12966 Marketed by Hewlett Packard and serves to provide an EIA standard serial interface for accommodating the RS-232C signals evolved at reader function 24. Card 44 controls the time frame when the terminal as at 22 can communicate with the computer 28 as well as when the reader and data validation function 24 can similarly communicate. The device further provides storage such that it can retain information generated either from terminal 22 or reader 24 pending computer 28 access availability. As schematically represented, only one reader 24 could be utilized at a time. Those skilled in the art will recognize that additional cards 44 may be provided for increasing the utilization of computer 28. Additionally, one terminal as at 22 may be utilized to service more than one reader 24. The remote telephone line 38 transmission of data from the reader function 24 is available to the instant system in consequence of the magnetic bubble memory feature of module 16. This stems from the attribute of such memories in having a data encoded-characteristic, all locations of data being segregated between information codes such that, for example, all demand intervals and the like are readily accessible to requests from computer 28. This permits the positioning of local reader-erase stations 20 at geographic locations conveniently proximate power consumption sites 10, such stations 20 representing a relatively smaller capital investment justifying their disperse locations. Of course, through the utilization of telecommunication transmission approaches, no human error is involved due to loss of modules in the course of transmission. Generally, voice grade lines as at 38 are capable of accommodating 1200 baud and the system may operate with up to about 16 autodial modem links; or up to 32 modem links and, correspondingly, or up to 32 hard wired terminals for read-erase stations located adjacent central translator station 30.

Looking in more detail to the computer facilities at central translator station 30, computer 28 will operate in conjunction with one or more tape drives as at 46. These may be of Hewlett-Packard type 7970B or 7970E and provide a mainframe computer compatible tape for ultimate billing purposes. Computer 28, additionally, utilizes a memory present as one or several disc drives and related disks as represented generally at 48. These disc drives, for example, may be Hewlett-Packard Model Nos 7906, 7920 or 7925. The disc drives 48 store such information as is provided in earlier translated or preceding memory module 16 memories. Thus, computer 28 is capable of calling up such information as previous total pulse counts, pertinent dates of insertion and removal and the like for comparison purposes to achieve reliability. Another feature which may be provided with the computer 28 is a line printer represented at block 49 which may be present as a Hewlett-Packard type 2608 or 2617.

Looking to FIG. 1C, another approach to the system utilization of computer 28 is revealed, computer 28 being shown in the figure by a dashed boundary at 28'. The I/O interface card 44 described in connection with FIG. 1B is not present in the instant embodiment, an asynchronous, multiplexer 45 being provided to take its place. Multiplexer 45 may be present, for example as a type 12920B asynchronous multiplexer produced by Hewlett-Packard (supra) and provides a 16 port input which, coupling to ports available within computer 28', provides 12 additional input port capacity. A remote station is shown within dashed boundary 20A as including an interactive terminal 22A, a reader apparatus 24A the output to which extends to a modem 36A. Modem 36A may be identical to that described at 36 in FIG. 1A. Telecommunicative transmission of data words is provided as represented by line 38A to a modem 40A. Modem 40A, as before, may be identical to that shown in FIG. 1B. The output of modem 40A is presented along line 43 to one input port of multiplexer 45.

Another remote station embodiment of the system is shown within dashed boundary 20B in the figure. In this embodiment, the interactive terminal is represented at 22B, while the reader apparatus is shown associated therewith at block 24B. The output of reader 24B extends through modem 36B for transmission along telecommunicative line 38B. As before, modem 36B may be identical to that described at 36 in connection with FIG. 1A. Line 38B, however, extends to an autodial modem 41. This modem may be an automatic calling unit identified as type 801 marketed, for example, by Western Electric Company. Two output ports 47 and 49 extend from modem 41 to multiplexer 45. Multiplexer 45 also may operate directly in conjunction with a reader apparatus positioned in the vicinity thereof as represented by block 24C and line 51.

Reader function 24 (FIG. 1A) is under the control of computer 28 (FIG. 1B) and, generally, is operated under a procedure wherein the service or local personnel insert module 16 into a receptacle within reader 24 and call up computer 28 to request the attention thereof. Module 16 will be seen to be latched within reader 24, and such latching provides input information for assuring proper insertion of the module. Upon being called up, computer 28 transmits a prompt character, following which keyboard operation emanating from operator console 22 will effect the initiation of the program to read memory module 16. The initial command sent from computer 28 is an activation command designated WAKE UP; however, upon being energized, the reader 24 will be seen to carry out a task assuring that module 16 is properly secured. Upon receipt of the WAKE UP command, the reader 24 responds with a status signal, either a READY or NOT READY command. In the event the latter command is transmitted, control is returned to operator console and interactive terminal 22. Additionally, some indicator, for example a flashing lamp, provides a visual indication to the operator that the system is not in readiness for reading module 16. Upon the receipt of a READY response, processor 28 transmits a transmit command signal designated a SEND DATA command, whereupon reader 24 will submit an initial block of 6 pages of data from the bubble memory within module 16. The term "page" as used hereinafter is intended to mean 18 bytes of data. These transmitted data will include page 0 insertion data which, as noted above, includes real time and date, user identification and input channel total pulse counts. Upon sending the insertion record two times, the removal record and partial collection period data are transmitted, following which a status indication and running pulse total are provided and a 16 bit CRC (cyclic redundancy check) is carried out. This check utilizes a polynomial generated word derived with respect to all data within reader 24 and is also generated within computer 28. A comparison of the values thus computed provides a principal validation of the transmission of the data. An insertion of running total counts provides a further comparison of the data being transmitted for computer 28 such that any discrepancy in the sequence of counts for a given series of modules emanating from one meter can be detected. In effect, no pulses are lost in the system. Upon checking of the data record thus far transmitted, computer 28 transmits SEND DATA commands which are submitted in sequence until all data are received, upon which a deactivation command signal designated a SLEEP command is transmitted by computer 28 which causes a return of communication between computer 28 to operator console and terminal 22 through activation of switching function 26. To facilitate the transfer of data, it will be seen that memory functions within reader 24 are utilized during the reading of data from the magnetic bubble memory of module 16 while earlier derived information from the module is under transmission to computer 28. Reader 24 also retains a feature permitting its accommodation to power outages at the reading station. This function permits the indexing of the magnetic bubble memory within module 16 such that data are not lost during a reading operation.

Generally, for local transmission of such data from stations described later herein as at 20 ' to the central translator station 30, an interval of about 30 seconds will be required. This may be compared with the 3½ minute period generally required to transfer the data from a magnetic cartridge, for a corresponding situation wherein such cartridge and its reader are positioned at central translator station 30. This 3½ minute interval does not include the personnel labor factor involved in the manual transference of information from the magnetic tape cartridge data card of the computer as discussed above.

Upon the completion of read-out from a module 16, computer 28 transmits a variety of read-out data to the visual read-out of interactive terminal 22. These data will be of such a character as to permit the operator of the terminal to accept or reject the data read out, such acceptance or rejection being implemented by the simple expedient of pushing one key at the terminal 22. In the event of a rejection of the material, the data is held in abeyance by computer 28 pending a determination of the cause of any discrepancy.

Returning to FIG. 1A, the local reader-erase station 20 is shown to include an erase function represented schematically at block 50. In operation, upon the acceptance of a memory module 16 translation by the operator, the module 16 is removed from the reader 24 and inserted into an appropriate receptacle within the erase apparatus at 50. Upon operator actuation of a latch, verfication routine is carried out which determines whether or not the memory module 16 is a properly operating one. This is followed by an erase routine which, itself, is checked. The time involved in this entire procedure is about 10 seconds or less and, following erasure, the module 16 is ready for reuse in the field. Such validated erasure is available with the bubble memory components of module 16, whereas, as indicated above, such a feature is not practical with the use of magnetic tape cartridges. Of particular importance, provision of the erase with a verification function as at block 50 will involve a relatively lower capital expenditure permitting the use of such verification in a variety of local reader-erase stations 20. With such availability, fewer modules 16 are required for any local servicing facility, thus again saving in capital expenditures. Where it is desired to retain data-containing module 16 pending further evaluation due to discrepancies indicated at the console visual readout 22, a module storage facility may be provided locally as indicated by function block 52. Generally, the erasure operation is carried out in a "multi-page mode" technique to achieve the very short interval required for erasure.

Returning to FIG. 1B, a centrally located read-erase station is represented having the same numeration but in primed fashion as that represented at local reader-erase station 20. Station 20' would be located adjacent or within central translator station 30 and includes the same principal functions as are retained within the local reader-erase station 20. For example, a reader function 24' along with associated switching 26' and interactive terminal 22' is provided. Additionally an erase feature is provided at 50'. However, the interconnection with computer 28 is one which is hard wired as indicated by the connection of cable 34' to input cable 64 through couplers including a modem eliminator cable 56. While a switching function is shown at 26', it will occur to those skilled in the art that terminal 22' may be coupled directly through card 44 to computer 28. Such a connection is represented schematically by arrow 23. When provided with or adjacent central translator station 30, the baud rate may be increased to 9600 and the time of translation of a module 16 can be reduced. Accordingly, where central translator station 30 is geographically located reasonably proximate a user entity as described at boundary 10, the provision of a read-erase station 20' becomes quite practical, all of the advantages of the system remaining intact.

Another feature which is available with the system of the invention is one wherein total pulse counts are utilized for a variety of purposes, i.e. the data recorded within recordation stations 14 upon module 16 for a wide variety of user entitles 10 being capable of being analyzed and collated to determine demand rates over a wide geographical area. Such an arrangement is available only with the system at hand, inasmuch as all pulse data are available in conjunction with universal real time labeling. Thus, broad varieties of analyses can be carried out to determine future and present required capital structuring of the utility organization. Further, it will be apparent that the system of the invention holds applicability to a wide range of metering systems, not merely those involved in power consumption. For example, the system is readily applicable to the analysis of flow rates within sales lines of natural and artificial gas distribution systems, as well as any of a broad variety of metering situations wherein a digital output representing quantities of qualities is evolved.

Figure 2B:
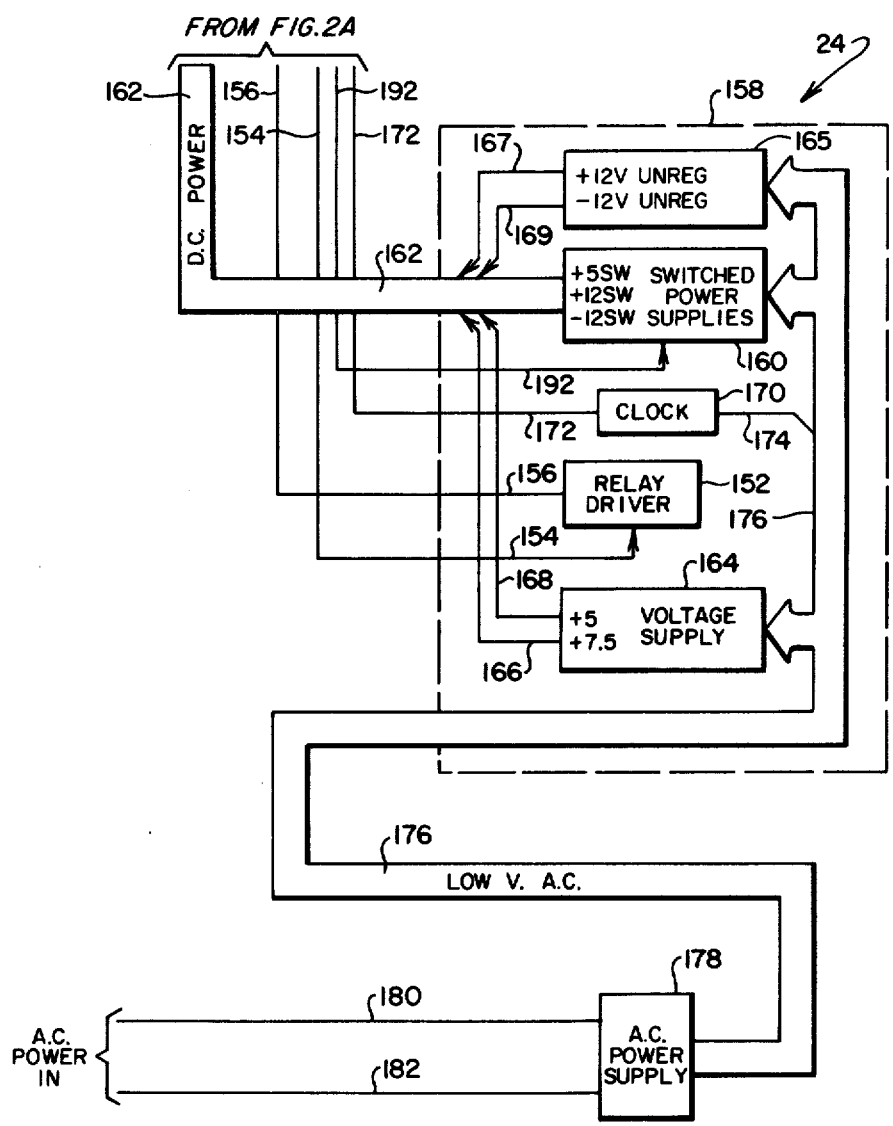

Turning now to FIGS. 2A and 2B, a block schematic diagram representing the reader function 24 and associated switching function 26 is revealed in a higher level of detail. In FIG. 2A, the magnetic memory module 16 again is represented within a dashed boundary moving the numerical designation 16. Mounted within module 16 is a magnetic bubble memory device of the earlier described type TIBO203 marketed by Texas Instruments, Inc., Dallas, Tex. This memory device is a 14-pin dual-in-line module containing a 92,304 bit bubble memory chip MBM 70) and related magnetic elements as well as major/minor-loop architecture as described above. Memory device 70 operates in conjunction with a read only memory 72 (ROM) which accommodates for the earlier described redundancy of minor loops, defective loops being mapped in ROM 72 to an extent that 144 of the 156 loops are active. Additionally, provided within module 16, is a sense amplifier 74 which serves to sense the voltage change when a bubble passes a magnetic-resistive detector element within memory 70. A TTL-compatible ouput is produced by amplifier 74 such that it operates, in effect, to convert an analog output of the bubble to a digital signal. Amplifier 74 may, for example, be present as a type SN75281 bubble-memory sense amplifier marketed by Texas Instruments, Inc. (supra).

Module 16 is inserted into a receptacle which is associated with components of the reader represented within a boundary 76, which boundary, for example, may encompass a circuit board of the device and the components of which are described in a still higher level of detail in connection with FIGS. 8A–8C. As indicated earlier, following the insertion of module 16 within a receptacle, the service personnel actuate a latch which carries out a switching operation. This latching arrangement is represented by the dashed line 78 operating in conjunction with a switch, S1.

As module 16 is inserted, electrical connection is made with various components within boundary 76, including a driver function 80. Driver 80 includes such components as a counter which generates ROM 72 address materials as represented at bus 82, coil driver and function timing generator devices associated with MBM chip 70 through a bus 84, and control features for the sense amplifier 74 as represented by bus 86, sensing amplifier 74 being shown associated with MBM 70 through bus 88. Additionally positioned within boundary 76 is a bubble memory controller 90 which serves to provide read, write and memory addressing operations upon command from a microprocessor CPU 92 within the reader 24. More particularly, controller 90 monitors the location of all data stored in the MBM 70 and stores and receives data under CPU 92 control. The device is typically fabricated using N-channel silicon gate MOS technology. Controller 90 is shown associated with driver 80 through bus 94. Clock and decoder inputs to controller 90 and driver function 80 are provided from a correspondingly labeled function represented at block 96, those inputs, respectively, being represented by buses 98 and 100. A collection of buffers is represented at block 102 which serve to convert the CMOS logic leading to boundary 76 to TTL logic as is utilized by the controller, driver, clock and decoder components. Interaction between the buffers 102 and controller 90 is represented by bus 104, while corresponding interaction with the clock and decoder function 96 is represented by bus 106. Signals representing the selection of a non-elected or defective minor loop are directed from ROM 72 to controller 90 by a line represented at 108, while a data input line transferring serial data of memory 70 through sense amplifier 74 to controller 90 is represented at 110. The buffers represented at 102 communicate with the components of the central processing unit (CPU) or microprocessor 92 through bi-directional data and address buses which are generally represented at 112.

Referring to the processing (CPU 92) function, the components associated therewith are represented within a boundary, which may be present as a discrete circuit board represented by dashed line 114. These components within boundary 114 will be seen to be described in greater detail in connection with FIGS. 10A–10C. The CPU 92 may be of a type CDP 1802 Microprocessor manufactured by RCA, Inc. and operates in conjunction with and somewhat under the control of computer 28 to regulate the transfer of data from MBM 70, through modem 36 to computer 28. The microprocessor arrangement within boundary 114 includes a system clock network 116 represented as being coupled to CPU 92 through line 118 as well as a reset input network 120 associated with CPU 92 through line 122 and to an output port function, represented at block 124, through interconnections represented by line 126. In conventional fashion. CPU 92 operates in conjunction with a read only memory network (ROM) represented by block 128. Retained within ROM 128 are the microinstructions for carrying out the program designated for CPU 92. CPU 92 additionally operates in conjunction with an address latch network represented at block 130 which serves a multiplexing function for the type CPU at hand. For example, such CPUs have a 16 bit address capability but only 8 address terminals, therefore, address latch 130 serves to multiplex the addresses asserted to those 8 terminals into a 16 bit system. Address latch 130 is shown to be associated through bus 132 with a random access memory network (RAM) or signal storage function 134. Network 134 serves the function of storing data read from memory MBM 70 in a manner wherein the latter is capable of being read while data from an earlier requested transmission is submitted to computer 28. This improves the throughput rate of the system, providing for the very low time intervals involved in carrying out reading and translation of module 16.

The microprocessing function represented at boundary 114 communicates through data and address buses 112 with an input-output (I/O) interfere function as well as a power failure detecting arrangement and regulator network represented within the dashed boundary 136. As before, boundary 136 may represent a discrete circuit board within the reader 24. The I/O interface function is represented within boundary 136 at block 138 and includes a "Universal Asynchronous Receiver-Transmitter" (UART) which serves to convert 8 bit parallel data to serial asynchronous data for use at computer 28 to permit translation of the data asserted thereto utilizing the specific programs of computer 28. Additionally, the function represented at block 138 carries out a CMOS to RS232 level transition to permit signal communication. The control inputs and outputs associating computer 28 and modem 36 with the UART components of interface function 138 are asserted through a bus 142 which extends to a switching relay and oscillator function represented at block 144. The components of block 144 are shown within a dashed boundary 146, which may be present as a circuit board within reader 24. As indicated earlier in connection with switching function block 26, in normal operation of the system, the interactive terminal 22 is directly coupled with computer 28 to permit operation in conjunction with programs other than those associated with the instant memory module 16 data translation. This normal association of these functions is represented at bus 148. However, during the period of reader 24 operation, a switching relay or transfer circuit is energized to isolate terminal 22 and provide a coupling between the I/O interface function 138 and modem 36 or, for readers associated with a central read-erase station as represented at 20', more directly to computer 28. These interconnections are represented schematically by bus 150. The oscillator function within block 144 is one selected for transmitting higher baud rate information to the computer 28 in the event that "local" utilization of the system is made by the above-discussed central read-erase station 20' operation. Thus, with the system, efficient time utilization is provided for the operation of computer function 28.

The relay components within function 144 are energized by command from CPU 92 through the activation of a relay driver 152 (FIG. 2B) in consequence of a signal asserted through output port 124 and line 154. Driver 152, in turn, energizes a relay through line 156 to provide communication with modem 36 in a remote mode, through bus 150.

FIG. 2B reveals that the relay driver or switching actuation circuit 152 is positioned within a dashed boundary 158 which, as before, may be present as a discrete circuit board. Boundary 158 also includes a switched power supply function 160 which provides predetermined d.c. power inputs to the system as labeled through a d.c. power bus 162. Additionally, boundary 158 encompasses a d.c. power supply 164 having labeled outputs at lines 166 and 168 which are interconnected into leads within d.c. power bus 162. Function 164 provides controlled power inputs specific to the requirements of the components within dashed boundary 114. Bus 176 further is shown leading to block 165 the output of which at lines 167 and 169 is coupled to d.c. power bus 162. A line frequency responsive clock 170 also is positioned within boundary 158 having an output at line 172 and an input at line 174 extending to a low voltage a.c. power supply bus 176. Bus 176, in turn, extends to an a.c. power supply 178 implemented as a transformer bank which, in turn, receives line input from along lines 180 and 182.

Returning to FIG. 2A, the d.c. power supply bus 162 is shown extending to components within dashed boundaries 146, 76 and 136 in addition to boundary 114.

Line 172 extending from the clock 170 is shown coupled with a power fail network represented by block 184. In addition to extending to the UART components of I/O interface block 138 via a line 186, power fail function 184, upon the occasion of a line input failure, provides an output at line 188 which represents an interrupt signal to CPU 92. CPU, in turn, provides for the carrying out of the restoration of any current page being read at bubble memory 70 to the minor loops and the indexing of the device to its page 0 reference position.

FIG. 2A also reveals that, with the insertion of modules 16 and the closure of latch arrangement 78, switch S1 is opened to, in turn, open line 190 serving to indicate a proper insertion. As will be shown in detail later herein, with the initial activation of the system, a light emitting diode (LED) 194, shown associated with output port 124 by line 196, is continuously illuminated upon the receipt of the earlier-described WAKE-UP command from computer 28, the LED indicating a proper latching of memory module 16. Additionally, upon the receipt of the latter command, the relay function including relay driver 152 and switching relays within function 144 are activated. Receipt of the WAKE-UP command is through a line monitoring arrangement associated with the modem 36 or cable 34' which is directed to CPU 92 through I/O interface function 138.

The sequence of reading events carried out by the system of the invention and the electronic components or hardware carrying out that sequence of events are described in the discourse to follow. To facilitate an initial understanding of the events and procedures, reference initially is made to the microinstructional flow chart represented by FIGS. 3A-3C. These figures should be observed in a sequence commencing uppermost with FIG. 3A and continuing in regular sequence to FIG. 3C, FIGS. 3D and 3E representing, respectively, a more detailed version of a subroutine of the program and an interrupt routine. In effect, the flow chart generally summarizes the instructional data stored within ROM 128 which are called upon by the processor function CPU 92 to operationally associate the functions described in connection with FIGS. 2A and 2B. Following a discussion of the flow chart, the discourse then turns to a description of electronic components constituting the reader 24 of the system.

Referring to FIG. 3A, the start of the read procedure as represented at 200 involves the powering up of the reader through the actuation of a conventional turn on switch and a consequent carrying out of an initiation of registers and the like thus evoking a "standby" status. The operator also, operating from terminal 22, requests control from computer 28 after which the computer 28 will return a prompt character to permit the request of a translation task program. The operator additionally inserts memory module 16 into the appropriate receptacle within reader 24 in a manner electrically connecting it with the components within boundary 76. A WAKE-UP command or activation command signal will next be received from computer 28.

As represented at block 202, an internal register of CPU 92 includes a blink flag which governs the status of LED 194. This flag is set to a 0 value assuring that LED 194 is off. In general operation, when LED 194 is energized in steady state fashion, reading of memory module 16 is being carried out normally. However, when LED 194 is in a blinking mode, an error in memory module 16 insertion, reading or the like will have been encountered. The program then proceeds to block 204 at which point, utilizing the primarily initialized registers, instructions are given to turn the switching relay, as described in conjunction with block 144, to an off condition; to turn the controller 90 and, consequently, MBM memory 70 of module 16 to a non-powered state or off (using switched power supplies 160) and to assure that LED 194 is in an off state. Block 204 serves a checking function assuring an off state at the commencement and termination of the program. The program then progresses to the instructions at block 206 at which point the remaining registers of CPU 92 are initialized. Upon such initialization, the program progresses to a loop 208 serving to await a WAKE-UP command from computer 28. Loop 208 includes decision block 210 which queries whether or not the WAKE-UP command has been received. If it has not, the loop 208 progresses to the question as to whether the blink flag has been set, as represented at 212. In the event the blink flag has not been set, then the loop 208 returns to the input of decision block 210 to await the WAKE-UP command. In such a condition, LED 194 will remain off, thus apprising the operator that reading and translating of the memory of module 16 has not commenced. In the event that a signal has been received following the setting of the blink flag to 0 as represented at block 202 through line 214, representing some malfunction, then the blink flag will have been set and the answer at query 212 will be yes which leads loop 208 to block 216 instructing the system to cause LED 194 to blink. This warning condition will remain until the WAKE-UP command is received.

On the receipt of a WAKE-UP command, an active status ensues and the program progresses to block 218 at which point CPU 92, operating through output port 124, causes LED 194 to be energized in steady state fashion through line 196; simultaneously causes a switching actuation circuit including relay driver 152 to be activated through line 154 to, in turn, activate a switching relay or transfer circuit within function 144 through line 156; and to activate the switched power supplies 160 through line 192. This latter activation, in turn, effects the powering up of controller 90 and, consequently, MBM 70. The program then progresses to decision block 220 at which point a query as to whether memory module 16 has been appropriately latched with the closure of switch S1 and assertion of a corresponding signal along line 190 to CPU 92. Where the query at block 220 indicates that memory module 16 has not been latched, then, as represented at block 222, a NOT READY status signal is sent to computer 28. Additionally, as represented at block 224, the blink flag within a register of CPU 92 is set to a 1 value which is inputted through line 214 to cause the system to loop and carry out a continuous blinking of LED 194 as represented at minor loop 208. This condition, providing for a blinking of LED 194, will continue until the WAKE-UP command is received, and proper latching of memory module 16 has been carried out. Of course, it will apprise the operator that a memory module 16 has not been inserted within reader 24. The condition also will result in computer 28 sending a message to terminal 22 advising the operator of the situation at hand.

Assuming that the query as to whether memory module 16 has been inserted and properly latched at block 220 results in a yes response, then, as represented at block 226 subroutines effecting the initialization of controlleer 90 and MBM 70 are carried out. In this regard, reference is made to publication II above, the subroutines involved being selected for the purpose of interfacing the controller 90 and MBM 70 with microprocessor CPU 92. Controller 90 power-up initialization is required to load the minor loop size, while the bubble memory power-up initialization is required to be done for the bubble memory chip 70 to annihilate any bubbles in its major loop.

As indicated earlier herein, the reading of a page from MBM 70 requires several milliseconds and, additionally, about the same length of time is required to transmit that page of data to computer 28. Therefore, an arrangement is provided to instruct the controller 90 to carry out the reading of a page of data at MBM 70 and, while such reading is underway, the immediately preceding page of data which was read is transmitted upon appropriate command from computer 28. To commence such an arrangement with respect to page 0 within MBM 70, block 228 provides instructions for carrying out the reading of page 0. Note, that such reading of page 0 occurs before computer 28 has been sent a READY command. Only the WAKE-UP command has been received from computer 28 at this time. With this arrangement, page 0 will have been read and submitted to FIFO temporary memory within controller 90 before a SEND DATA or "transmit" command is received from computer 28. Following the instruction at block 228, the program proceeds to block 230 which provides for sending a READY status signal to computer 28. This signal is sent conditioned upon a mutual clearance for sending data between the UART function at block 138 and modem 36.

Referring to FIG. 3B, following the transmission of a READY signal to computer 28, the program commences a minor loop program represented at 232, decision block 234 representing the first query of that loop. If computer 38 has not sent a SEND DATA command to CPU 92, then a next query, represented at block 236 determining the presence of a DONE command is made. In the event the answer is no, then the loop continues until such time as a SEND DATA command is received. Any command other than DONE at this juncture is ignored until such time as the SEND DATA command is received. A DONE command indicates the completion of a reading of the entire memory of MBM 70 within module 16. With the presentation of a yes answer at decision block 236, an appropriate indication is provided along line 238 which leads to the input to block 202 in FIG. 3A.

When the SEND DATA command is received, decision block 234 provides for the carrying out of a routine wherein page 0 of MBM 70 is transmitted twice, followed by a transmission of the last four pages of memory, for example pages 637 through 640. Recall from the discussion of data recordation and storage function 14, that page 0 of memory includes the month, day, hour and minute of the time of insertion of memory module 16, the identification of the user facility as well as pulse count totals for all data channels monitored. These data were complied as an "insertion record". Similarly, page 637 contains removal record information including the month, day, hour and minute of removal, user identification, and running pulse count totals.

Referring to block 240, upon the receipt of a SEND DATA command, a register designated "Next Page Count" is set to 0. This register is utilized in conjunction with a Transmit Page routine represented generally by block 242. The register utilized at block 240 is internal to CPU 92.

The Transmit Page routine represented at block 242 and in later portions of the instructions is a subroutine wherein the page of data retained in a signal storage function present as a FIFO memory within controller 90 which had previously been read from MBM 70 is acquired. Following such acquisition, the controller is instructed to carry out the reading of a next page of data and the previous page of data as acquired is transmitted to computer 28. Thus, the time interval for reading and transmitting is minimized by these simultaneous activities.

Referring to FIG. 3D, the Transmit Page routine is set forth in detail. The entry into the subroutine of FIG. 3D is represented at 244, from which entry, the subroutine progresses to a decision block 246 at which point a query is made as to whether controller 90 is busy. A busy status will be present if the controller 90 is carrying out earlier instructions to read a page of memory. In the event the controller is busy, then a minor loop represented at 248 is executed until such time as controller 90 is available for instruction. As represented at block 250, instructions then are provided to acquire the first (or next) byte of data from the FIFO memory within controller 90 and transfer that byte of data to another portion of the signal storage function present as RAM 134. For the initial entry into the program, the 0 page information read as described in conjunction with block 228 in FIG. 3A, is placed in RAM 134 in accordance with the instructions at block 250. Following the instructions at block 250, the subroutine progresses to the decision at block 252 querying whether or not a page of data has been fully acquired. Inasmuch as one page of data represents 18 bytes of information, the minor loop represented at 254 is utilized 18 times following which a yes response is received at block 252 representing the storage in RAM 134 of one page of data.

The subroutine then looks to the reading of MBM 70; however, as a condition precedent to such reading, as represented at decision block 256, query is made as to whether the memory module 16 remains latched. This check is made inasmuch as, should memory module 16 be removed from reader 24 at this point in time, the data within MBM 70 would be lost. Accordingly, in the event of a "no" response at block 256, as represented at block 258, MBM 70 is turned off by switching off power to controller 90. This is carried out by simply turning off power to MBM 70 from switched power supplies 160. Note, that MBM 70 will be at a 0 or indexed position since it is standing by pending an order to carry out a reading thereof. Further in this regard, as represented at block 246, it is known at this junction that the controller 90 is not busy.

Where the memory module 16 is latched, the response to decision block 256 is affirmative and the subroutine progresses to block 260. At block 260, controller 90 carries out instructions for causing MBM 70 to read out the next page of data, that next page being designated or defined by the next page count register as described in connection with block 240 (FIG. 3B). Recall, that the register described in connection with the latter block was set just before entering the instant subroutine. For the initial instructional loop, page 0 again will be read.

Following the page reading as set forth at block 260, the subroutine progresses to block 262 at which point a byte from RAM 134 is outputted or transmitted to computer 28. This outputting is carried out by CPU 92 while the controller 90 is reading the next designated page of data.

As indicated earlier herein, to ensure proper telephonic communication between the reader 24 and computer 28 a cyclic redundancy check is carried out for each transmitted block of six pages of memory. This check is to an extent wherein a dislocation or defect in any given bit of transmitted data will result in a requirement or command by computer 28 to retransmit that block of data. To achieve such finite control, a CRC character is generated for each byte of data read from memory module 16. Recalling that one block of data constitutes six pages of memory, the CRC check combines these CRC characters to derive a final check character which will have a two byte extent and will be positioned as the last two bytes of each such transmitted block.

The CRC character for each byte is represented as being generated by instruction at block 264. This character is submitted to RAM 134. The page transmit routine then progresses to decision block 266, at which point that query as to whether all 18 bytes constituting a page of information have been transmitted is made. In the event of a negative response, then the routine loops to the input to block 262 to continue the outputting of bytes to computer 28 and generation of corresponding CRC characters as represented, respectively, at blocks 262 and 264. Upon the completion of the transmittal of an 18 byte page, as represented by an affirmative response at block 266, and as labeled at block 268, the program returns to an appropriate position within the principal microinstructions, which, for the instant transmission, is represented at block 270 in FIG. 3B.

Returning to FIG. 3B, block 270 will be seen to represent an instruction wherein the page count register now is set to page 637, the first of the last four pages of memory within MBM 70. Upon setting the register as represented at block 270, the program then proceeds to block 272 wherein a Transmit Page routine again is carried out, that subroutine being the same as described above in connection with FIG. 3D. Operating in conjunction with the page count set at block 270, it may be recalled that page 0 will have been transmitted and controller 90 will have been told to again read page 0. The Transmit Page routine as represented at block 272, therefore, will transmit page 0 again while causing a reading of page 637 to be carried out. The program then encounters decision block 274 which queries whether or not the final memory page, page 640 has been reached by the next page count register. Where this is not the case, then as represented at block 276, the next page count register is incremented and the instructions continue in loop fashion, as represented by minor loop 278 until the last memory page, page 640 has been reached.

When the page count register does reach page 640, as represented at decision block 274, then the program sets the page count register to page 1, as represented at block 280. At this point, page 640 data will now be ready to be transmitted from RAM 134, it having been read from MBM 70. Accordingly, as represented at block 282, the Transmit Page subroutine described in connection with FIG. 3D again is carried out in accordance with a next page count register indication of page 1. Page 1 will represent the first page of demand metering pulse data recorded in MBM 70 and will be the first page within the next six page block of data to be transmitted. Following the carrying out of the Transmit Page subroutine, as represented at block 282, the program then outputs the CRC check information within the last two bytes of memory as represented at block 284. Computer 28 carries out a similar CRC computation and provides a comparative checking determining their equivalency to assure that a proper transmission has occurred.

Data are sent to computer 28 asynchronously in byte binary form with a single start and stop bit and no parity. The CRC check may, for example, be generated from the CEC-CCITT polynomial: $X^{16}+X^{12}+X^5+1$. In the event a comparison of the CRC value evolved in computer 28 and that evolved in reader 24 is false, then computer 28 provides for the retransmission of the data, for example, with a transmit again command signal identified as a SEND RECORD AGAIN command. Such transmission generally is repeated several times where equivalency is not achieved.

Turning to FIG. 3C, the final components of the microinstructions are revealed, those instructions serving to carry out the reading and transmission of sequential blocks of six pages of data within MBM 70 as well as to provide for termination procedures and resend data techniques. In the figure, the initial decision block is identified at 286 and serves to question whether or not a DONE command has been received. This command indicates that all data from MBM 70 have been received and the program should return to a start status. Accordingly, upon receipt of such command, as represented at line 238 extending to FIG. 3A, the blink flag is set to 0, as represented at block 202; the switching relay and LED 194 are turned off; and the controller 90-MBM 70 combination is turned off. Finally, as represented at block 206, the registers are initialized and the program diverts to loop 208 pending the receipt of a next WAKE-UP command. Computer 28 then may instruct the operator to insert another module 16 at the operator console visual read-out 22.

Where the DONE command is not received, then the program progresses to decision block 288 wherein the question is posed as to whether a SEND RECORD AGAIN command has been received. Such a command will have been received where the CRC check values do not match. Assuming the response to the decision at block 288 to be an affirmative one, then, as represented at block 280, the information available within RAM 134 is transmitted in byte increments until the entire block with CRC check data has been transferred. Accordingly, as represented at decision block 292, if this is not the case, as represented by minor loop 294, transmission continues, as represented at block 290, until the data are fully transmitted. Upon the occurrence of an affirmative response at block 292, the program returns, as represented by line 296, to the query posed at decision block 286.

Assuming that no SEND RECORD AGAIN command has been received as determined at decision block 288, the program progresses to decision block 298. At block 298, the question is made as to whether the SEND DATA command has been received. In the event such command has not been received, then as represented by minor loop 300, the program awaits the receipt of a command.

With the receipt of a SEND DATA command, the program proceeds to decision block 302 at which point the question as to whether the last page of memory has been reached is made. As indicated in block 302, this page may, for example, be page 640. In the event the last page is not encountered, then as represented at block 304 the next page count register is incremented. With the latter incrementation or with the presence of an affirmative response at block 302, the program progresses to carry out an earlier-described Transmit Page routine as represented in block 306. As before, this routine has been described in detail in connection with FIG. 3D. Recall, that page 640 will have been transmitted to computer 28 in the first block of data such that the information concerning that page is accepted and available within the computer.

Looking to the sequence described thus far, when the next page register has been incremented in the instant sequence, it will move to page 2 such that the routine at block 306 will carry out the reading of page 2 and the simultaneous transmission of page 1. Following the carrying out of the subroutine at block 306, the program progress to decision block 308 at which point the query as to whether a block (six pages) of data has been completed. If that is not the case, then as represented by loop 310, the instant routine continues until such block is completed. Thus, pages 1 through 6 will be transmitted for the instant condition while controller 90 is caused to read page 7. At the conclusion of six pages, as represented at block 310, the CRC check is outputed to conclude the treatment of the block data and, as represented at line 312, the program returns to the input to decision block 286. This routine will continue until such time as the DONE command, representing the full reading of module 16, is received from computer 28.

As discussed in connection with FIGS. 2A and 2B, reader 24 also includes a power fall monitoring feature as described in FIG. 2A at block 184. This feature is provided inasmuch as it is important that memory module 16 and associated controller 90 remain energized under power failure conditions until the completion of the reading of a page of data. Normally, the interval required for reading a single page is relatively short, being less than about 12 milliseconds. Accordingly, the power fail circuit 184 toggles the interrupt input to CPU 92 from along line 188. This permits CPU 92 to carry out a power fail subroutine utilizing a voltage supply made available by a capacitor or the like (not shown) mounted, for example within boundary 158 and having a capacity sufficient to permit the imposition of adequate powering for completing a page reading routine. Looking to FIG. 3E, the subroutine for operating CPU 92 in this mode is revealed. With the development of an interrupt signal at line 188, as represented at block 314, the microinstructions vector to a power fail interrupt condition. As represented at block 316, an inquiry is made as to whether controller 90 is busy. Stated otherwise, this inquiry determines whether or not the controller 90 is in the process of reading or actively acquiring a page of data. In the event that the answer is in the affirmative, then as represented by minor loop 318, the power fail subroutine awaits the completion of the reading of one page of data, while power is supplied by the noted capacitor. In the event that the controller 90 is not busy then, as represented at block 320, the power inputs to the system are turned off, the switching relay is de-energized and LED 194 is de-energized. The subroutine then exits to line 322 which is revealed in FIG. 3A. Returning to FIG. 3A, note that line 322 leads to the input of block 224 at which point the blink flag bit is set to one and the system, in effect, then carried out a routine substantially identical to that carried out with the assertion of a DONE command at line 238. However, should power return following a short power interruption or the like, LED 194 will be permitted to blink on and off, as represented at block 216, until such time as a WAKE-UP signal is received.

Turning now to the hardware implementation of the reader function of apparatus 24 set forth schematically in connection with FIGS. 2A and 2B, communication between computer 28 and reader function 24 has been described as being carried out through a switching relay arrangement represented at block 144 in FIG. 2A. Such switching provides for a normal communication between the terminal 22 and computer 28. However, limited communication between reader 24 and the computer 28 is provided to an extent that the two functions are coupled for data transmission only during the period wherein a reading procedure is taking place. Referring to FIG. 4, the components within the boundary 146 in FIG. 2A are shown in a higher level of detail. FIG. 4 reveals the discrete lines of bus 148 which extend to terminal 22, as well as those lines, earlier represented as bus 150 in bracket form leading to modem 36. The unlabeled ones of these lines provide for direct, uninterrupted communication between modem 36 and terminal 22, while those having a terminal assignment label are shown to associate modem 36 with terminal 22 through a transfer circuit present as an array of switches, S2–S7. Switches S2–S7 form a portion of a relay represented generally at 330 and are actuated from their normal (translator select condition) positions as represented in the drawing, to communication with an opposite pole by energization of a solenoid winding 332. The association of winding 332 with switches S2–S7 is represented by dashed line 334. Winding 332 is coupled between line 156 and line 167 which carries a +12 v d.c. power supply input derived from d.c. power bus 162 and power supply function 165 (FIG. 2B). A blocking diode 336 provides the conventional function of blocking inductive surges and the like. As described in connection with FIG. 2B, actuation of winding 332 takes place with the assertion of a signal from CPU 92 acting through output port 124 through line 154 to relay driver 152. Driver 152 responds, in turn, by providing a low value at line 156 permitting the energization of winding 332. Upon such energization, a reader select condition obtains wherein the array of switches S2–S7 are thrown to couple bus 142, carrying the terminal assignments 16X, DTR, CTS, RTS, $\overline{RD}$ and $\overline{SDO}$ with modem 36 through the correspondingly labeled leads represented at bus 150. Note additionally, that the $\overline{RD}$ terminal is permanently coupled to modem 36, notwithstanding the actuation of switch S3. This line serves to monitor computer 28 through modem 36 such that reader 24 may receive a WAKE-UP signal prior to the energization of winding 332.

Referring to the terminal assignment labels in FIG. 4, DTR, $\overline{SDO}$ and RTS represent, respectively, "Data Terminal Ready", "Serial Data Out", and "Request To Send" and effect communication between the UART function of I/O interface 138 and modem 36. The terminal assignment, CTS, indicates "Clear To Send", and represents communication to the UART function from either the modem 36 or computer 28. Terminal assignment $\overline{RD}$ represents "Received Data" and identifies the line through which serially formed data are transmitted through modem 36 from computer 28. Additionally, the line carries control signals from computer 28 through modem 36 such as the WAKE-UP command earlier described. The terminal labeled "16X" driven from an oscillator function represented generally at 340. Oscillator 340 is a baud rate clock which operates in conjunction with a switch S8 to establish the baud rate of the system for operation of reader 24. Switch S8 is closed to provide for the assertion of the rate clock pulse to line 342 through line 344. Line 344, in turn, leads to the selective output of a counter 346 coupled with a +5 v power supply deriving from voltage supply 164 (FIG. 2B). Counter 346 may be present as a type 4040 marketed by RCA, Inc. The input to counter 346 is derived from a 2.4576 MHz crystal oscillator 348 operating in conjunction with resistor 350 and inverter gate 352, and the output thereof is directed through line 354 and buffer 356 to counter 346.

Line 342, representing the baud rate signal, is directed to one input of NOR gate 358, while the opposite input thereto is derived from line 360. The latter input extends from switch S8 to ground for transmitting a baud rate clock signal at output line 362 and providing a +5 v SW input through resistor 364 from Switched Power Supplies 160 and bus 162 where operations are desired communicating with computer 28.

Bus 142 has been described in FIG. 2A as extending between the switching relay and oscillator function 144 to the I/O interface function at block 138. This bus is shown generally in FIG. 4 in conjunction with the label: "To UART 370".

Figure 6B:
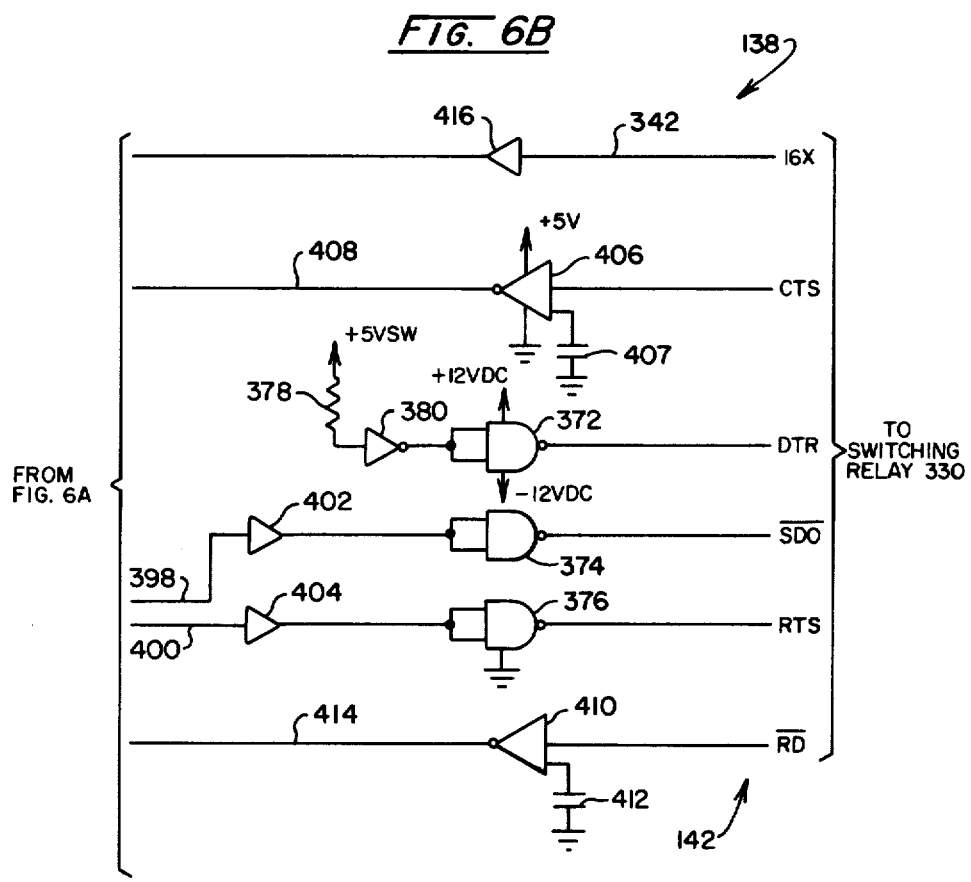
Figure 5:
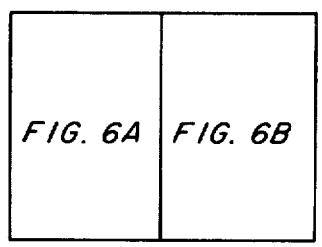
FIG. 5 is a miniaturized representation of the proper positioning for FIGS. 6A and 6B.

Referring to FIG. 5, a schematic portrayal of the side-by-side orientation for jointly considering FIGS. 6A and 6B is revealed, with these figures describing the I/O interface function 138 in detail. Turning to FIG. 6B, terminal assignment lines DTR, $\overline{SDO}$ and RTS are shown extending, respectively, to the outputs of drivers 372, 374 and 376. These drivers may, for example, be of the type SN 75188 marketed by Texas Instruments, Inc. and serve as drivers at the RS 232 level. The DTR output of driver 372 is derived with the assertion of a +5 v SW input from Switched Power Supplies 160 (FIG. 2B) through resistor 378 and buffer 380. Driver 372 also receives a regulated +12 v and −12 v d.c. input from a regulator function represented generally at 382. As described in connection with FIG. 2A, with the assertion of a power "on" signal at line 192 from output port 124, the +5 v SW input is asserted through resistor 378 and buffer 380 to driver 372 to provide an indication that the system is prepared to read. Referring momentarily to FIG. 6A, the regulator function 382 is shown comprising two voltage regulators 386 and 388, which, respectively, may be types MC 7812 and MC 7912 marketed by Motorola, Inc. In conventional fashion, regulator 386 receives a 12 v unregulated input from line 390 and carries out a regulating function to derive a +12 v d.c. regulated output at line 392 which is asserted at driver 372. Correspondingly, regulator 388 receives a −12 v unregulated input at line 394 and carries out conventional regulation thereof to provide a −12 v d.c. output at line 396 for assertion at driver 372. Power input to regulators 386 and 388 is from block 165 (FIG. 2B).

Referring additionally to FIG. 6B, the inputs to drivers 374 and 376 are present, respectively, at lines 398 and 400 which lines, in turn, incorporate buffers shown, respectively, at 402 and 404. Lines 398 and 400 extend to respective SDO and $\overline{RTS}$ terminals of UART component 370. Component 370 may be of type CDP 1854 marketed by RCA, Inc. and, as indicated earlier herein, is identified as a Universal Asynchronous Receiver-Transmitter serving to convert 8-bit parallel data to serial asynchronous data for modem 36—computer 28 utilization. Component 370 additionally cooperates with modem 36 to evolve an appropriate synchronization of available data transmission and reception intervals.

The Clear To Send, CTS, input to UART 370 from modem 36 or computer 28 is directed through receiver 406 and, thence through line 408 to the corresponding $\overline{CTS}$ terminal of UART 370. Receiver 406 may be of type SN 75189 marketed by Texas Instruments, Inc. and is shown coupled with a +5 v power supply and through a capacitor 407 to ground. The receiver serves the function of converting RS 232 levels to TTL signal levels. Similarly, the $\overline{RD}$ terminal from relay 330 extends through a receiver 410 coupled to ground through capacitor 412 and having the same structure and function as receiver 406. The output of receiver 410 extends along line 414 to the SDI Serial Data In input terminal of UART 370.

Line 342, carrying the 16X terminal designated baud rate data is shown extending through a buffer 416 to the RCLK input of UART 370, while CPU 92 generated inputs labeled N0, N1 and N2 are shown extending, respectively, through line 416 to the RSEL terminal; through line 418 to the $\overline{MRD}$ input terminal; and through lines 420 and 422 to the CS1 and CS3 chip select terminals of UART 370. An interrupt output, $\overline{INT}$, at line 424 is shown extending from UART 370 through buffer 426 for ultimate utilization at CPU 92, while a timing pulse labeled TPB is shown extending to the corresponding terminal of UART 370 through line 428. This TPB signal is a central clock generated from clock function 116 and CPU 92 (FIG. 2A). Additionally asserted at UART 370 data terminals R0–R7 are the parallel 8-bit input-output labeled BUS 0–BUS 7 and represented schematically at dual input-output bus 112 in FIG. 2A. In general, the data asserted through bus 112 to UART 370 emanates from RAM 134 in consequence of the efficient read-transmit feature of the system described in connection with FIGS. 3A–3C.

FIG. 6A also includes a more detailed representation of the Power Fail Function 184 described earlier in conjunction with a schematic representation at FIG. 2A and the microinstruction routine at FIG. 3E. As indicated in the former figure, a clock pulse corresponding with line input frequency, i.e. 60 Hz is asserted along line 172 to the Power Fail Function. This input is shown in FIG. 6A as extending to the reset terminal of a counter 430. Counter 430 may be of a conventional variety, for example type 4020 marketed by RCA, Inc. The clock input terminal of counter 430 is coupled through line 432 to the output of an AND gate 434. One input to AND gate 434 emanates from line 186 which, in turn, is coupled to line 428 which receives a system synchronization pulse (TPB) from CPU 92 as well as the ANDed divisional outputs of counter 430 representing divisions by 8192 and 2048. These outputs, respectively, are shown extending from lines 436 and 438 to AND gate 440, the output of which extends along line 442 and buffer 444 to one input of gate 434. Line 442 additionally is coupled to interrupt (INT) signal line 188 through a buffer 446. With the arrangement shown, should a pulse of the 60 Hz input at line 172 not occur, thus designating a pending power failure, no reset will occur and counter 430 will be permitted to derive increasingly high values from lines 436 and 438 to derive a fail signal condition output at line 442. When such output is achieved before reset, the $\overline{INT}$ signal is derived at line 188 to activate the power fail routine described in conjunction with FIG. 3E. Recall, that the interrupt input at line 188 leads directly to CPU 92.

Referring to FIG. 7, a schematic representation of the proper positioning of FIGS. 8A–8C is revealed such that these figures may be considered conjointly. The figures show, in enhanced detail, the controller function components earlier described in connection with FIG. 2A within boundary 76. The controller 90 itself is shown in enhanced detail in FIG. 8B, while the driver function 80 is shown in FIG. 8C as including a function timing generator 450 which is associated with coil drivers 452 and 454. Coil drivers 452 and 454 operate in conjunction with the orthogonally disposed windings of MBM 70. Function timing generator 450, additionally, is operationally associated with a function driver 456, which, in turn, operates in conjunction with sense amplifier 74 positioned within memory module 16. Further incorporated within the driver function 80 is a counter 458 which operates in conjunction with ROM 72, that memory also being incorporated within memory module 16. The earlier described CMOS to TTL buffering network again is represented in general at 102 in FIG. 8A, while the clock and decoder components are represented in FIGS. 8A and 8B in general fashion at 96. Controller 90, function timing generator 450, counter 458, coil drivers 452 and 454, and function driver 456, respectively, may be present as types TMS 5502/9916, 74LS361, 75382A and 75381 marketed by Texas Instruments, Inc.

Referring to FIG. 8A, the uppermost region of buffer function 102 is represented within a dashed boundary 102A. Within boundary 102A, signals representing memory address information from CPU 92 are shown labeled MA0–MA3. The buffers within boundary 102A are enabled from CPU 92 by an $\overline{MBMEN}$ input extending thereto along line 458. Accordingly, with the presence of a signal at line 458, address information used for encoding commands is presented to corresponding address input terminals A0–A3 of the controller 90 (FIG. 8B). FIG. 8A additionally shows a second region of buffers 102 represented by cashed boundary 102B. The buffers contained in this boundary are tri-stated and bi-directional. A read-transmit enablement of the buffers within boundary 102B is derived from CPU 92 output signals $\overline{MRD}$ (line 676), $\overline{MBMSEL}$ (line 722) and MWR (line 674) which pass through the buffering function of a third region 102C of buffer function 102 to the inputs of AND gates 460 and 462. Note in this regard, that the chip select input signal, $\overline{MBMSEL}$ is coupled in common to the inputs of AND gates 460 and 462. Accordingly, a transmit enablement of the buffers within boundary 102B is achieved by combining $\overline{MRD}$ and $\overline{MBMSEL}$ to provide an appropriate signal along line 464 from output line 466 of gate 460. Conversely, a write command, represented by a combination of MBMSEL and MWR signals, is asserted to AND gate 462 to provide an output at line 468 which is transmitted through line 470 to the read enablement buffer components within boundary 102B. A fourth region 102D of buffer function 102 contains buffering components suited for buffering the input signals of CPU 92 designated MBMEN (line 724) and 4 MHz (line 650). The former is the complement of $\overline{MBMEN}$ described above, while the latter represents an input from the system clock 116 in FIG. 2A. FIG. 8A additionally shows the presence of latch line 190 and latching switch S1 as coupled with a +5 v power supply. When a memory module 16 is properly latched within reader 24, switch S1 is in an open state. Conversely, the switch has a normally closed state, thus permitting the +5 v signal thereon, when closed, to represent an inproperly latched module 16 or the absence of a module 16, such signal being used as described in connection with FIGS. 3A and 3D.

The output of AND gate 460 at line 466 is shown being asserted through a buffer 471 to the DBIN terminal of controller 90. This signal represents a buffered and ANDed combination of $\overline{MRD}$ and $\overline{MBMSEL}$ emanating from CPU 92 and serves to instruct controller 90 that CPU 92 is executing a read instruction. Output line 466 also is coupled through line 472 to one input of OR gate 474. The opposite input to gate 474 derives from line 468 and the output of the gate is provided at line 476 extending to the chip select CS terminal of controller 90, as well as the SYNC input thereto. With the arrangement, either a read ($\overline{MRD}$) or write ($\overline{MWR}$) form of command from CPU 92 provides for an enablement of controller 90.

The MBMEN signal at line 724 derives from a Q terminal of CPU 92 is treated within buffer region 102D from which it emerges at line 478, which includes an inverter 480. The signal, as is asserted from line 478 to the RESET terminal of controller 90, serves as an initialization input resetting the principal functions thereof. This MBMEN signal, as present at line 478, also is asserted along line 482 to the clear CLR input of a flip-flop 488 which serves in conjunction with function timing generator 450. The MBMEN signal also is asserted through 484 to the DIS input of function driver 456. Additionally, the signal is asserted through line 486 to the $\overline{\text{RESET}}$ input of timing generator 450. An MBMEN signal of opposite polarity is derived at line 490 and is directed to the reset terminal $\overline{\text{S}}$ of coil driver 452, as well as through line 492 to the corresponding reset terminal $\overline{\text{S}}$ of coil driver 454.

The 4 MHz signal emerges from buffer region 102D at line 494 whereupon it is converted by clock function 96 to a two-phase, 2 MHz clock which governs all of the controller 90 timing sequences. In this regard, line 494 leads to one input of an AND gate 496 and is coupled through lines 498 and 500 to the clock CK input terminal of a D type flip-flop 502. Flip-flop 502 may be present as a type 74LS74 marketed by Texas Instruments, Inc. and is coupled with a logic high (Vpup) from line 589 at its PR and CLR terminals. The $\overline{\text{Q}}$ output of flip-flop 502 is connected by line 504 to the D terminal thereof, while the Q output thereof is connected through line 506 to the opposite input of AND gate 496. As a consequence, the output of gate 496 at line 508 represents a division of the 4 MHz clock frequency by 2 which is asserted at an input of a TTL to NMOS converter 510, the output of which, in turn, is present at line 512 which is coupled to the ⌀1 terminal of controller 90. The Q output of flip-flop 502 at line 506, additionally, is coupled through line 514 to the PR terminal of an identical flip-flop 516. Note, that the D, CK and CLR terminals of flip-flop 516 are held at logic zero which in the present embodiment is ground. As a consequence, the Q terminal output thereof at line 518 provides a pulse delay input to another TTL to NMOS converter 520 having an output at line 522 extending to the ⌀2 terminal input of converter 90. Thus, a two-phase, 2 MHz clock is provided at terminals ⌀1 and ⌀2 which governs all of the controller 90 timing sequences. Line 498, carrying the 4 MHz frequency, also is seen to extend to the CLK input of function timer 450. Converters 510 and 520 may, for example, be present as a type 75316A marketed by Texas Instruments, Inc.

The inputs to controller 90 are completed with the assertion of a buffered $\overline{\text{MWR}}$ signal along line 524 to one input of an OR gate 526. The opposite input to gate 526 derives from the RDY terminal of controller 90 which is asserted through OR gate 528 and line 530. The output of gate 526 is directed through line 532 to the $\overline{\text{WR}}$ input terminal of the controller.

As indicated earlier herein, controller 90 responds to commands from CPU 92 and enables the necessary control functions to the function timing generator 450 to access a page or pages of data. Controller 90 maintains page position information, provides internal input-/output buffering for one page of data, and handles redundancy in the minor loop in conjunction with counter 458 and ROM 72. The controller 90 operates in conjunction with a dedicated microprogram contined within an on-board ROM and the contents of registers within the device during initialization determine its operation. Controller 90 is a memory-mapped device and occupies 16 consecutive locations in the system memory of CPU 92. The controller 90 executes commands by decoding the address lines A0–A3 and gating this decode with either $\overline{\text{WR}}$ or DBIN to form a "read" or "write" strobe, $\overline{\text{WR}}$ indicating a write and DBIN indicating a read. The addresses A0–A3 are intended to address specific registers to carry out the performance of specific functions such as loading a command (FIFO) or loop-size register, reading a status condition, performing a test, or initiating reading or writing of data. Reference, in this regard, is made to publication II (supra).

Looking to the output terminals of controller 90, the $\overline{\text{INITRW}}$ terminal provides a signal for initiating read-write signals indicating that the controller 90 is about to read or write from MBM 70. This signal is shown impressed upon line 540 within which is inserted an inverter 542 and which is directed to the CLR 1 and CLR 2 terminal inputs of counter 458. Counter 458 may be present as a type 74LS393 marketed by Texas Instruments, Inc. and serves to sequentially generate memory module 16 ROM 72 addresses at its output terminals 1QA–1QD and 2QA–2QD as represented by output line array 544 which is shown leading to labeled module 16 contacts ROMADR$^A$–ROMADR$^H$. The initial clocking to counter 458 for carrying out the counting of the initiate-read/write pulses at line 540 is from line 546 extending from the Q terminal of a flip-flop 548, while clocking the second series of outputs (2QA–2QD) is provided by a line input 550 from the 1QD terminal to CK2 clock input.

The return signal from ROM 72 is, as described in connection with FIG. 2A, along a line 108 to the FUNCEN terminal of controller 90. This signal is utilized to inhibit data shifting when there is a defective minor loop in MBM 70.

Serial data from Sense Amp 74 is, as described in connection with FIG. 2A, asserted along line 110 to a DATIN input terminal to controller 90.

A ⌀2 terminal of controller 90 provides timing signals to the function timer 450 and is interconnected therewith through line 550, an inverter 552 and line 551 to the clock CK input to flip-flop 548. Similarly, the uninverted signal at line 550 is coupled through line 554 to the corresponding clock input terminal CK of flip-flop 488. The BXIN output of controller 90, representing a transfer in enabling function showing that bubble domains in the major loop of MBM 70 are to be transferred to the minor loops, is coupled with the D input of flip-flop 488 through line 556, while correspondingly, the BXOUT output, representing a transfer out enable signal indicating that bubble domains in the minor loops are to be transferred to the major loops, is provided at line 558. Line 558 is shown coupled to the XOEN terminal of function timing generator 450. The remaining inputs to function timing generator 450 from controller 90 include a BANH output signal extending along line 560 to the ANNEN terminal and representing a bubble annihilate; a REPT signal extending along line 562 to the REPEN terminal and representing a bubble replicate signal enabling the $\overline{\text{REP}}$ output of timing generator 450; and a BSS signal representing a bubble start shift utilized to start and stop bubble field drive clocks and directed along line 564 to a corresponding R/$\overline{\text{S}}$ input terminal.

A DATOUT signal generated by controller 90 represents serial data from the controller directed to MBM 70 and is shown connected through line 566 to an OR gate 568 in conjunction with the earlier-described FUNCEN signal deriving from line 108 and inputed to gate 568 through line 570. The output of gate 568 is present at line 572 which contains an inverter 574 and is directed to the DATA input terminal of function driver 456. The voltage supply inputs from switched power supplies 160 (FIG. 2B) as well as ground inputs to controller 90 are represented in FIG. 8B in general at 576. These power supplies derive, as described earlier herein, from d.c. power bus 162. A zener diode 573 and associated resistor 575 are provided to derive −5 v for controller 90 from −12 v SW.

Referring in particular to FIG. 8C, the clear, CLR, terminal of flip-flop 548 is seen to be coupled with the initiate-read/write $\overline{\text{INITRW}}$ signal at line 540 through line 582. The $\overline{\text{Q}}$ output of the flip-flop 548 is coupled with its D input terminal through line 584 and the same $\overline{\text{Q}}$ output thereof is asserted through line 586 to the DETEN input terminal of function timing generator 450. Correspondingly, the Q output of flip-flop 488 is coupled through line 588 to the XIEN input terminal of generator 450. The PR terminal of flip-flop 548 is coupled to +5 v SW supply through resistor 585 in line 587. Line 587 is tapped by line 589 for providing a consistent logic high input (Vpup) to several components as labeled in conjunction with the latter number.

Function timing generator 450 provides the precise control timing necessary for the operation of function driver 456 as well as the coil drivers 452 and 454. The device consists of control flip-flops, a counter, a decoder matrix, output latches and gating. The control flip-flops of the device serve to synchronize the run/-stop signal from controller 90 to control the starting, shifting and stopping sequences of the bubble-field rotation. As indicated earlier, the clock input to generator 450 is along line 498 which inserts the 2 MHz clock input thereto. The DETEN input serves to enable the strobe clock SC and RESTORE outputs thereof. Similarly, signals asserted at the XIEN terminal from line 588 serve to enable the $\overline{\text{X1}}$ output, that output providing a signal that, when low, causes the function driver 456 to emit a transfer-in current pulse at its output terminal XFER at line 590. In similar fashion, the signal asserted from line 558 to the XOEN terminal of generator 450 enables the $\overline{\text{X0}}$ output thereof which, being connected with a corresponding input terminal of function driver 456, serves to provide a signal that, when low, causes the function driver 456 to emit at its output terminal XFER a transfer-out current pulse at line 590. An input from line 562 to the REPEN terminal of generator 450 serves to enable the $\overline{\text{REP}}$ output thereof which, as coupled with the corresponding terminal of driver 456, provides a signal that, when low, causes driver 456 to emit a replicate pulse at line 592. Correspondingly, an input at line 560 to the ANNEN input terminal of generator 450 serves to enable the $\overline{\text{ANN}}$ output thereof. The $\overline{\text{ANN}}$ terminal is shown coupled with the corresponding terminal of driver 456 and provides a signal that, when low, causes the latter driver to emit an annihilate pulse at line 592. The run/stop R/S terminal of generator 450 as coupled with line 564 serves to either initiate a bubble shift or stop it depending upon the level of the signal inputting thereto.

Referring more specifically to the outputs of generator 450, the RESTORE terminal provides a signal, that, when high, initializes the sense amplifier 74 and when low, allows the signal to be sensed. This terminal is coupled through line 594 and inverter 596 to the sense amplifier 74 when module 16 is installed in reader 24. Similarly, the strobe clock SC provides a signal at line 598 which is connectible to the sense amplifier 74 and which serves to clock sense amplifier 74 on a low-to-high transition.

The $\overline{\text{AX}}$ and $\overline{\text{BX}}$ terminals of function timing generator 450 are represented being connected through respective lines 600 and 602 to corresponding terminals $\overline{\text{A}}$ and $\overline{\text{B}}$ of coil driver 452. These inputs carry out the phase A and phase B driving of one coil, X, of MBM 70. Similarly, output terminals $\overline{\text{AY}}$ and $\overline{\text{BY}}$ are coupled through respective lines 604 and 606 to the corresponding $\overline{\text{A}}$ and $\overline{\text{B}}$ terminals of coil driver 454. As before, these terminals supply coil driver inputs for phases A and B operation of the other, Y, coil of MBM 70 orthogonally disposed with respect to the X coil. The $\overline{\text{GEN}}$ output of generator 450 is coupled with the corresponding $\overline{\text{GEN}}$ input terminal of function driver 456 and provides a signal that, when low, causes driver 456 to emit a generate current pulse, GEN, at output line 608. Function timing generator 450 may be provided as a type SN74LS361 marketed by Texas Instruments, Inc.

Coil drivers 452 and 454 may be of type SN75382A marketed by Texas Instruments, Inc., and are provided as integrated circuits with two totem-pole outputs capable of supplying a high peak current required for the coils of MBM 70. The outputs of driver 452 are provided at terminals C1 and C2 having output lines shown, respectively, at 610 and 612. Lines 610 and 612, in turn, are coupled with a diode bridge 614 connected additionally between ground and −12 v SW. In operation, one line 610 or 612 is pulled to −12 v SW while the other one is pulled to ground. This causes a current movement in one direction through the coil X of MBM 70 by virtue of the connections labeled X1 and X2. When the input to lines 610 and 612 then is turned off, the current continues by virtue of coil inductance as a current ramp which is allowed to diminish to a 0 value. In effect, a triangular waveform is derived which evokes a partial magnetic field rotation at MBM 70. This rotation is continued through the other coil Y of MBM 70 by equivalent operation coil driver 454. In similar fashion, the C1 and C2 terminals of driver 454 are coupled through respective lines 616 and 618 both the MBM 70 coil Y as well as to diode bridge 620. Because of the 90° separation of the operation of driver 454 with resepct to driver 452, the triangular waveform evolved from the outputs of lines 616 and 618 is rotated 90° with respect to the outputs at lines 610 and 612. Accordingly, a fully rotating magnetic field is made available to MBM 70.

Function driver 456 may be provided as a type SN 75381 marketed by Texas Instruments, Inc. It operates to drive the transfer gate, generator element and replicate element of MBM 70. In this regard, the device converts the digital control pulses generated by timing generator 450. In addition to providing the outputs described earlier herein, device 456 also contains a RTEMP terminal which is coupled with line 620. This is a temperature compensation terminal which operates in conjunction with a thermistor 622 formed within a resistor bridge including resistors 624 and 626. Resistor 626 of this network is coupled to the RREF terminal of driver 456 and the entire arrangement provides a temperature compensation which establishes the level of output current at GEN line 608.

Figure 9:
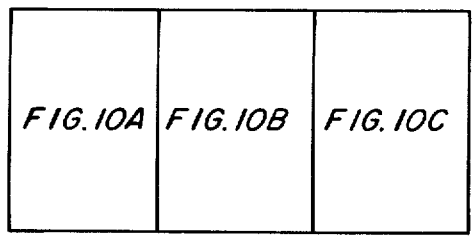
FIG. 9 is a miniaturized diagrammatic representation of the proper positioning of FIGS. 10A-10C.
Figure 10A:
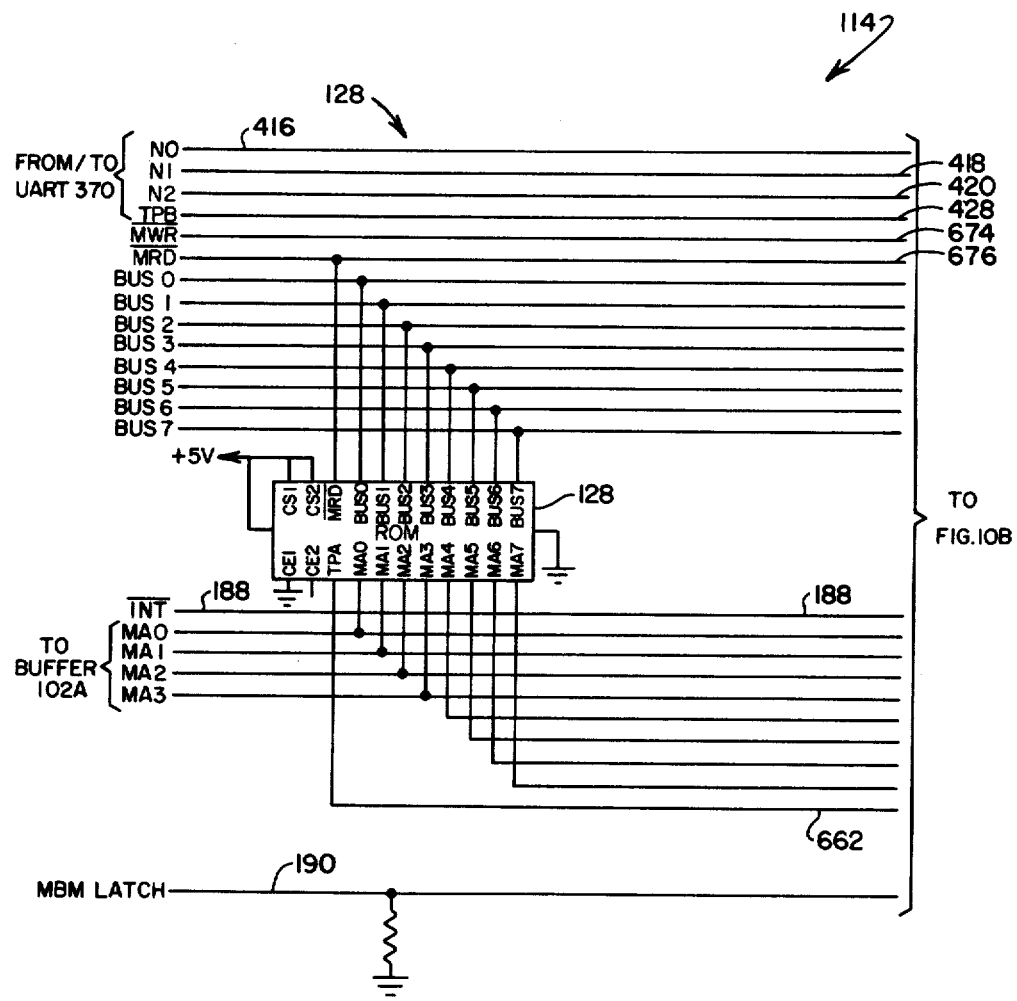
FIGS. 10A-10C are a circuit diagram describing the microprocessing functions represented in FIG. 2A.
Figure 10B:
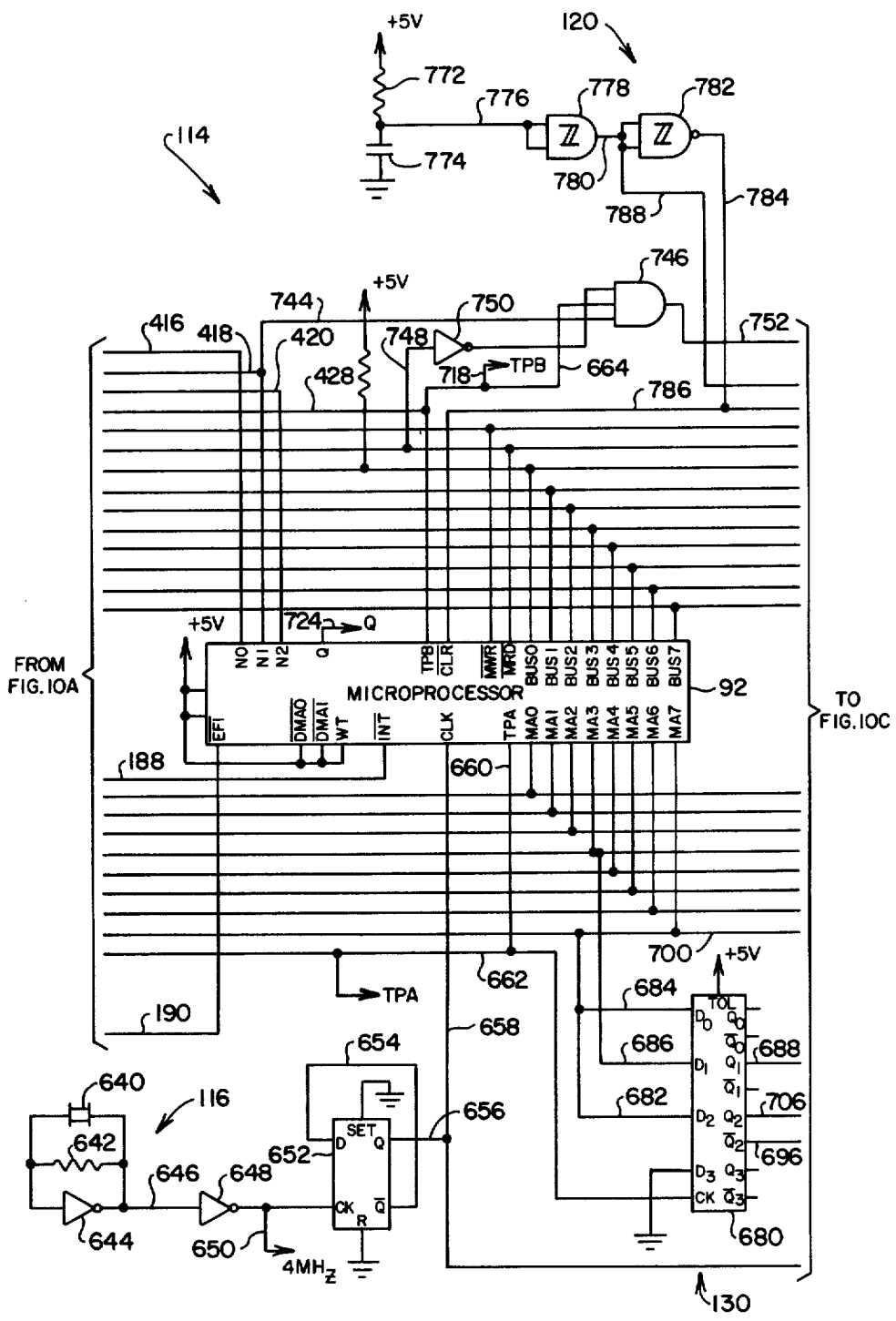
Figure 10C:
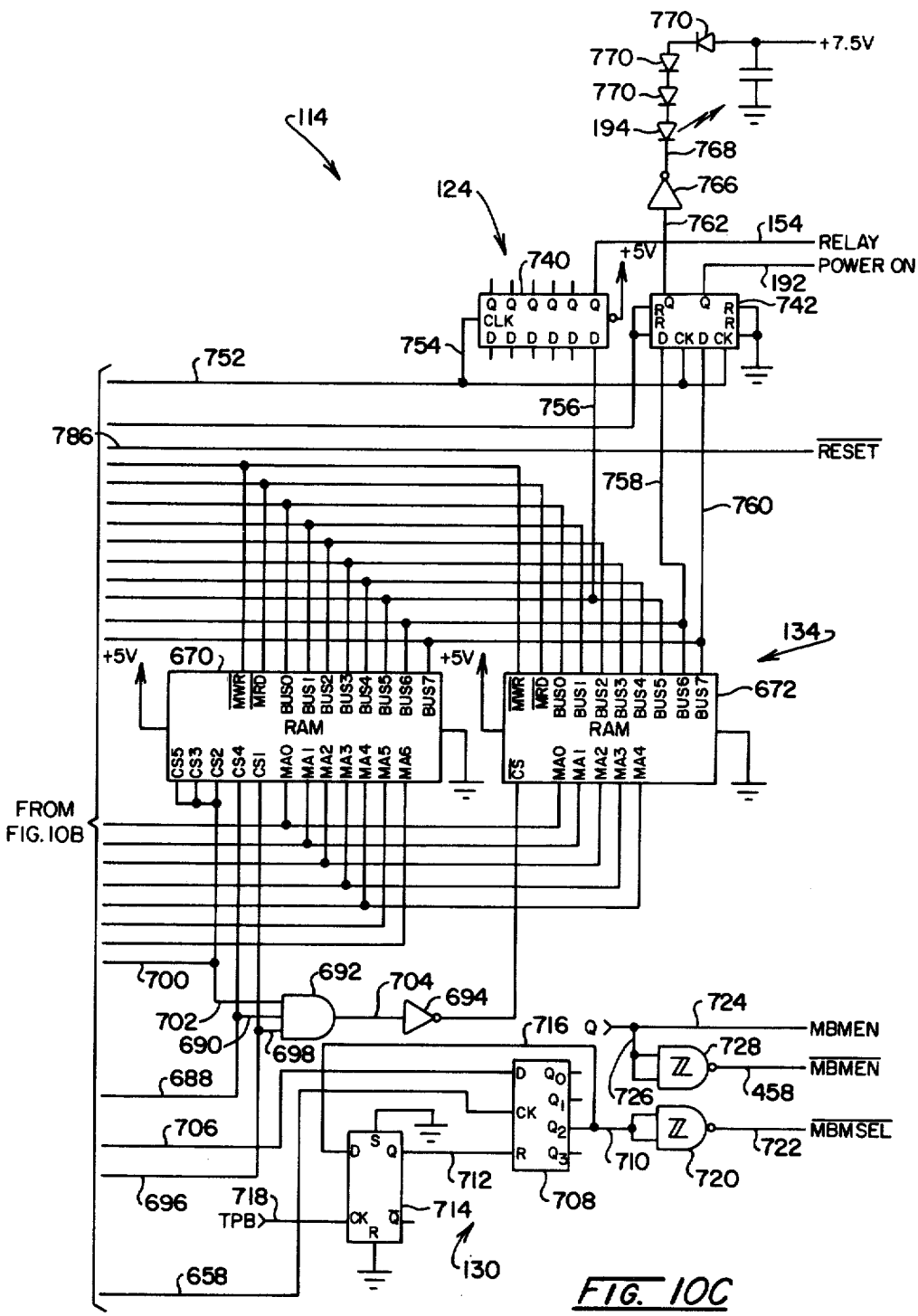

Referring to FIG. 9, a schematic representation of the proper positioning of FIGS. 10A–10C is revealed, FIG. 10A being positioned to the left side of FIG. 10B, while FIG. 10C is positioned on the right side thereof.

Turning to FIG. 10B, CPU 92 is revealed in a higher level of detail. CPU 92 operates in conjunction with microinstructions retained within read only memory ROM 128. In this regard, it may be observed that the leads labeled BUS 0–BUS 7 of data and address bus 112 extend from corresponding terminals BUS 0–BUS 7 of ROM 128 to similarly corresponding data inputs within CPU 92 having the same labeling, i.e. BUS 0–BUS 7.

ROM 128 may be of a type 1833 having a 1024×8-bit capacity and marketed by RCA, Inc. The address inputs to ROM 128 are provided at terminal inputs MA 0–MA 7 which are coupled to corresponding terminal inputs MA 0–MA 7 within CPU 92. Of these memory addresses, four lines, MA 0–MA 3, are outputted to buffers 102A, as represented at FIG. 8A, whereupon the resultant buffered signals are applied to the A0–A3 address lines of controller 90. The chip select terminals CS1 and CS2 of ROM 128 are activated upon powering up from the voltage supply 164 described in conjunction with FIG. 2B. Adjacent to memory address leads MA 0–MA 3 is line 188 carrying the $\overline{INT}$ signal which is shown extending to the corresponding $\overline{INT}$ terminal input of CPU 92. Terminals WT, $\overline{DMAI}$ and $\overline{DMAO}$ are held at logic "1". Additionally, line 190, carrying where appropriate, the MBM LATCH signal from corresponding line 190 and switch S1 described in conjunction with FIG. 8A, is shown extending to the $\overline{EF1}$ terminal input of CPU 92.

The system clock is represented generally at 116 and includes a 4 MHz crystal 640 operating in conjunction with resistor 642 and inverter 644 to provide a 4 MHz output at line 646. This signal is buffered at buffer 648 and tapped at line 650 to provide a 4 MHz output which leads to corresponding line 650 input to buffer region 102D in FIG. 8A. Line 646 leads to the clock CK input of a D flip-flop 652 which may be type 4013 marketed by Fairchild, Inc. The D terminal of flip-flop 652 is coupled through line 654 to the $\overline{Q}$ terminal, while the Q terminal output thereof is coupled through lines 656 and 658 to the clock CLK input terminal of CPU 92. Flip-flop 652 divides the incoming frequency at line 646 by 2 such that the CLK input terminal receives a 2 MHz input. CPU 92 treats this incoming signal and evolves therefrom a timing pulse A, TPA, which is outputted therefrom along lines 660 and 662, inter alia, to ROM 128. The microprocessor also develops a timing pulse B (TPB) at lines 664 and 428, line 428 carrying that timing signal to UART 370.

The random access memory of the microprocessor function 114 represented at 134 in FIG. 2A comprise RAM memory components 670 and 672. RAM 670 may be a type 1823 having a 128×8-bit capacity and marketed by RCA, Inc., while RAM 672 may be of a type 1824 having a 32×8-bit capacity and marketed by RCA, Inc. These random access memories serve the function of storing data received from MBM 70 while computer 28 is in the process of translation as described in detail in connection with FIG. 3B. The wire-read terminals, MWR and MRD of RAMs 670 and 672 are coupled in common with the corresponding terminals of microprocessor CPU 92 and are arranged for outputting through corresponding lines 674 and 676 to buffer region 102C (FIG. 8A). Note additionally, that a corresponding MRD terminal is provided in ROM 128 which is coupled with corresponding line 676. The data bus terminals of RAMs 670 and 672 are labeled Bus 0–Bus 7 and are coupled in common with the corresponding terminals of CPU 92 and ROM 128.

As described in connection with block 130 in FIG. 2A, inasmuch as two RAM components, 670 and 672 are present and a latching procedure is required by controller 90 with respect to the $\overline{MBMSEL}$ input thereto, it is necessary to provide an appropriate chip select and related logic. Accordingly, the address latch function 130 is shown to include a 4-bit address latch 680. Latch 680 may be a type 4042 marketed by RCA, Inc. The $D_0$ and $D_2$ input terminals of latch 680 are coupled to receive memory address signal inputs MA 7 respectively from along lines 682 and 684, while the $D_1$ input is coupled for receiving memory address MA 3 signals from along line 686. The $Q_1$ output of latch 680 at line 688 is coupled to chip select terminal CS 4 of RAM 670 and, through line 690 to one input of a decoder arrangement present as AND gate 692 and inverter 694. The $\overline{Q_2}$ terminal of latch 680 is coupled through line 696 to the chip select terminal CS 1 of RAM 670 and through line 698 to the second input of AND gate 692. The third input to gate 692 is coupled to receive microprocessor address terminal signal MA 7 from along lines 700 and 702. Note, that line 702 additionally extends to chip select terminals CS 2, CS 3, and CS 5 of RAM 670. The output of AND gate 692 at line 704 extends through inverter 694 to the $\overline{CS}$ terminal of RAM 672.

The $Q_2$ terminal output of latch 680 at line 706, in effect, represents a memory address 15 and ultimately is developed into the $\overline{MBMSEL}$ signal which is a form of chip select input for utilization by controller 90. Because a delay is required following the development of this signal to enable its use by controller 90, line 706, carrying the MA 15 signal, is directed to the D terminal input of a shift register 708. The clock, CK, input terminal of register 708 is coupled with line 658 which carries the 2 MHz clock signal asserted at the terminal CLK of microprocessor 92 from clock 116. By tapping register 708 at its $Q_2$ terminal output, the requisite delayed signal is present at line 710. Register 708 is reset from line 712 which is coupled with Q output of a D flip-flop 714. The output of register 708 at line 710 additionally is coupled through line 716 to the D input terminal of flip-flop 714. Additionally, the clock, CK, input to flip-flop 714 is coupled to receive timing pulse B (TPB) from along line 718 which is tapped from line 664. Thus, flip-flop 714 is toggled to reset register 708 upon the occurrence of an output at line 710 in conjunction with a clock input at line 718. The signal at line 710 is directed into a Schmitt-type NAND gate component 720 which may be present as a type 4093 marketed by RCA, Inc. Trigger component 720 serves the function of inverting the signal asserted thereto. The resultant output at line 722, as labeled, is designated $\overline{MBMSEL}$ which is directed to the buffers within boundary 102C at FIG. 8A for treatment prior to submittal to controller 90. Similarly, the memory bubble enable signals are generated from the Q terminal output of CPU 92 as presented along line 724. In this regard, the Q terminal output is considered the MBMEN or bubble enable signal. Line 724 is tapped by line 726 so as to introduce the Q signal to the inputs of another Schmitt-type NAND gate 728 which is identical to that described at 720. The inverted output of trigger 728 at line 458 carries, as labeled, the $\overline{MBMEN}$ signal. The signals at lines 724 and 458 are asserted at buffer region 102C as described in conjunction with FIG. 8A.

Now considering the output port function represented at block 124 in FIG. 2A and generally by that same number in FIG. 10C, two latch functioning devices are provided at 740 and 742. Latch 740 may be present as a type 40174, while the latching function at 742 may be a type 4013 flip-flop, each device being marketed by RCA, Inc. These latches operate in conjunction with a control signal asserted at output port N1 of CPU 92 and serve to retain that data which is present on an associated data bus until termination of the latching condition is desired. Inputs to latching function 740 and 742 stem principally from the noted instructional terminal or port N1 of CPU 92 which is shown coupled by line 744 to one input of AND gate 746. The second input to gate 746 is from line 664 representing timing pulse B (TPB), while the third input thereto is the read command, $\overline{MRD}$, from CPU 92 which is tapped at input line 798 containing an inverter 750. The output of gate 746 at line 752 is directed to the clock, CLK, input of latch 740 through line 754 as well as to the clock, CK, terminals of device 742. A D input terminal of latch 740 is coupled through line 756 to data bus lead BUS 5, while the D terminal inputs of device 742 are coupled by lines 758 and 760 to respective bus terminal data lines Bus 6 and Bus 7. With the arrangement, for example, when CPU 92 provides data on data bus leads BUS 6 and BUS 7 and, simultaneously strobes terminal N1, a high signal value is presented at the Q terminal output lines 762 and 192 of device 742. A high signal value at line 762 is inverted at LED driver 766 providing a resultant low signal value at output line 768. This provides for the passage of current through LED 194 from the labeled 7.5 v source derived from voltage supply 164 (FIG. 2B). Diodes 770 serve the purpose of providing an appropriate voltage drop to LED 194. The POWER ON line 192 extending from the Q terminal of device 742 provides for powering of the reader 24 from switched power supplies 160 (FIG. 2B) and also serves to deactivate reder 24 in the presence of a SLEEP command from computer 28 to CPU 92. The latter command is derived following the checking and receipt of all data by computer 28 which is available within MBM 70.

In similar fashion, latch 740 provides a signal at line 154 which extends to the relay driver 152 (FIG. 2B) which in turn energizes the relay winding 332 (FIG. 4).

The N2 device select of CPU 92 is shown being directed through line 420 to UART 370 along with the line 418 output of device select N1 and line 416 output of device select N0.

The power up-reset function is shown generally at 120 in FIG. 10B and includes an R-C network including resistor 772 and capacitor 774. When power first is asserted, capacitor 774 is discharged which holds line 776 at a low value. Line 776, in turn, is coupled to the input of Schmitt-type NAND gate 778. The low input at line 776 continues for an interval of about 100 milliseconds. The output of gate 778 at line 780 extends to the input of an identical Schmitt-type NAND gate 782, the corresponding output of which at line 784 is directed to line 786 which extends to the $\overline{CLR}$ terminal of CPU 92. Accordingly, resetting of the microprocessor is carried out for an interval of about the noted 100 milliseconds. Line 786 leads additionally to an output labeled $\overline{RESET}$. Line 780 also is coupled to line 788 which leads to the reset inputs R of latching device 742. Triggers 778 and 782 may be of the earlier-noted type 4093 marketed by RCA, Inc.

The power features described in conjunction with FIG. 2B at boundary 158 are described later herein in more detail following the forthcoming description of the erase component 50 (FIG. 1A.), inasmuch as the implementation of powering functions is essentially the same for both the reader 24 and erase 50 functions.

Figure 11A:
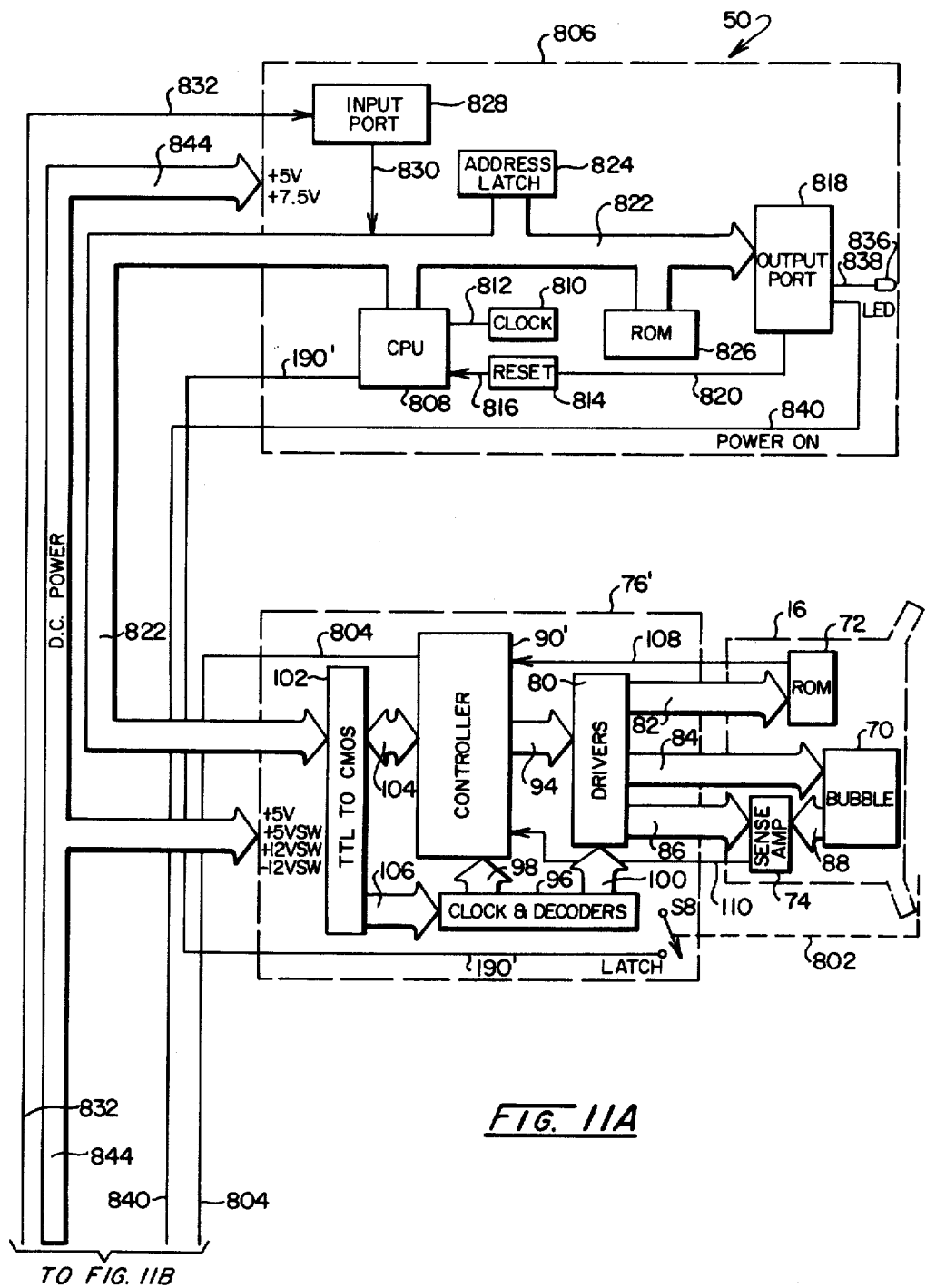

Referring now to FIGS. 11A and 11B, a block schematic diagram representing the erase function 50 is revealed in a higher level of detail. In FIG. 11A, the memory module 16 is reproduced utilizing the same numeration as provided in connection with FIG. 2A in the interest of clarity. In this regard, module 16 is shown including ROM 72, MBM 70 and sense amplifier 74. Memory Module 16 is inserted within a receptacle within the erase apparatus 50 in the same manner as provided in connection with reader 24. The controller features associated directly with memory module 16 are substantially similar to those revealed in connection with FIG. 2A with a line addition to be described later herein. Accordingly, this controller function is represented as being outlined by boundary 76'. Inasmuch as one alteration is made to the operation of the controller, it is identified in FIG. 11A by the numeral 90'.

As in the case of inserting memory module within the receptacle of reader apparatus 24, with the insertion of the module 16 into the erase apparatus 50, electrical connections are effected between lines 108 and 110 with controller 90' as well as with drivers 80 through bus components 82, 84, and 86. When memory module 16 is fully inserted, the operator actuates a latch represented by dashed line 802 to effect the opening of a normally closed switch S8. Switch S8 operates in identical fashion as switch S1 operating in conjunction with line 190 as described in connection with FIG. 8A. Accordingly, line 190 is reproduced in the instant figure in primed fashion.

For the instant application, controller 90' is operated in a multi-page mode as opposed to the single page mode of controller operation associated with reader 24. Controller 90' serves to read and write into MBM 70 on a highly accelerated basis, the verify erase procedure requiring about 8 seconds in the multi-page mode as opposed to a 40 second requirement for the same activity in a single page mode. To operate controller 90' in this multi-page mode, it is necessary for it to generate an interrupt, INT, signal for assertion at the microprocessor for example, at the termination of each byte of data. This signal is shown being generated in FIG. 11A at line 804, that interrupt signal indicating that data is ready to be read or written. Inasmuch as the structures of controllers 90 and 90' are identical with the above exception, line 804 is produced on FIGS. 8A and 8B, and FIGS. 8A–8C are considered herein to represent an appropriate description of the components within boundary 76'. It may be recalled that the discourse as provided in conjunction with the earlier figures describes that the controller is associated with driver 80 through a bus 94. Further, clock and decoder inputs to the controller are provided from a network represented by block 96, respectively, through Buses 98 and 100. Additionally, a network of buffers has been described at 102 as providing a CMOS to TTL logic through buses 104 and 106 to its controller and clock and decoder function 96 from the microprocessor.

Looking to the microprocessing function of the erase verify apparatus 50, reference is made to the dashed boundary 806. As before, the microprocessing function within boundary 806 includes a central processing unit (CPU) identified at block 808. CPU 808 may be of the earlier-described type CDP 1802 Microprocessor manufactured by RCA, Inc., a component identical to that described earlier at 92. CPU 808 performs in conjunction with a system clock 810 through an input line represented at 812. Further, CPU 808 is associated with a reset network 814, the communication therewith being represented by line 816 and network 814 being shown associated with an output port 818 by a line 820. A bi-directional data and address bus 822 provides communication between CPU 808, an address latch 824, a read only memory (ROM) 826 and output port 818. Address latch 824 serves the purpose of temporarily holding certain commands outputted along line bus 822 to controller function 76'. ROM 826 serves the conventional purpose of providing a series of microinstructions for the operation of CPU 808, as well as for storing test pattern and related insertion data for use in conjunction with the erase procedures carried out by apparatus 50. Microprocessing function 806 also includes an input port represented at block 828 which serves to communicate the earlier described controller 90' INT signal with CPU 808 through line 830 and one lead of bus 822. The signal is asserted to input port 828 from along line 832 which extends to a power function assemblage represented by dashed boundary 834 shown in FIG. 11B. Output port 818 provides for the selective powering of an indicator or light emitting diode LED 836, its association with port 818 being represented by a line 838. Port 818 also responds to CPU 808 commands through data and address bus 822 to assert selective power switching along line 840.

Looking to FIG. 11B, line 804 carrying the interrupt, INT, signal from controller 90' is shown extending to a data input buffer 842 positioned within boundary 834. Buffer 842 treats the incoming interrupt signal and transmits it along line 832 to input port 828. Boundary 834 also includes a switched power supply function represented by block 160. Inasmuch as the function represented at block 160 as well as other blocks within dashed boundary 834 are identical to related functions described in conjunction with FIG. 2B within dashed boundary 158, identical numeration is utilized where appropriate. In this regard, note the a.c. power is applied to the erase apparatus 50 from a conventional a.c. source through leads 180 and 182 which, in turn, are coupled with an a.c. power supply function represented by block 178. Block 178 is shown coupled with a voltage supply 164, as well as to switched power supplies function block 160 through a series of power leads represented by bus 176. The output of the switched power supplies function 160 is coupled with a d.c. power bus 844, which bus also includes inputs from lines 166 and 168 emanating from voltage supply 164. Power bus 844 is shown in FIG. 11A extending to the components within controller function within boundary 76' as well as to the microprocessing functions within boundary 806.

The sequence of control events carried out by CPU 808 as determined by the microinstructions within ROM 826 are described in conjunction with the microinstructional flow chart represented in FIGS. 12A and 12B. These figures should be observed in a sequence commencing uppermost with FIG. 12A and continuing in regular sequence to FIG. 12B.

Referring to FIG. 12A, the start of the erase procedure as represented at 850 involves the powering up of the erase verify device 50 through the actuation of a conventional turn-on switch. With such start-up, the registers of CPU 808 are initialized, as represented at block 852. Following initialization, as represented at block 854, a CPU pattern buffer pointer which is provided as a register within CPU 808 is set to identify a test pattern of ones and zeroes within ROM 826. This pattern is selected having a sequence representing a "worst-case" condition for carrying out the testing or verification of MBM 70. Upon completion of this task, as represented at block 856, assurance is made that LED 836 and the switched power supplies 160 are off. By assuring that the switched power supplies are off, there in turn is assurance that no damage will be caused to memory module 16 in consequence of the act of making electrical contact with components within boundary 76'. The program then commences to decision block 858 at which point a query is made as to whether memory module 16 is properly latched. A no response representing a signal at line 190', indicates that memory module 16 has not been inserted or, if inserted, the latch represented by dashed line 802 has not been properly actuated. In the event of a negative response at block 858, the system carries out a waiting interval represented by minor loop 860 during which the system awaits appropriate insertion and latching of memory module 16.

When the memory module 16 is properly inserted and latched, an affirmative response is derived to the query at block 858 and the program then turns on LED 836 in steady state fashion, as well as activates the switched power supplies represented at block 160 as indicated at block 862.

Following the illumination of LED 836 and activation of the switched power supply, as represented at block 864, controller 90' is initialized. Upon initializing the controller 90' routine, the program then progresses to block 866 which provides for the acquisition of the byte of data indicated by the buffer pointer and this byte is written into MBM 70. Inasmuch as controller 90' is operating in a multi-page mode, writing is carried out on a basis of one byte at a time and this procedure continues until the entire memory capability of MBM 70 is filled with the test pattern. In this regard, the instructions progress to decision block 868 to determine whether the test pattern has been written to the entire MBM 70 memory. Where this is not the case, the instructions enter into a minor loop represented at 870 whereupon the procedure at block 866 is repeated until an affirmative answer is received at block 868. Inasmuch as the extent of the buffer pattern is not commensurate with that of the memory capability of MBM 70, the pointer is reset each time it reaches the end of its pattern as the writing represented by minor loop 870 is carried on.

Referring to FIG. 12B, upon the receipt of an affirmative response at block 868, the microinstructions return the buffer pointer to its initial position, whereupon, as represented at block 874, a whole byte is read from MBM 70 commencing with the initial one. This byte is then compared with the pattern containing byte at the buffer pointer and a discrepancy in such comparison represents an error constituting the tested MBM 70 as defective. Where equality between the patterns is achieved, as represented by decision block 876, the microinstructions proceed to decision block 878 wherein a query is made as to whether comparisons have been made with respect to the entire memory capability of MBM 70. A no response at block 878, representing a memory error signal causes the program to enter into a minor loop represented at 880 which continues the reading and comparison subroutine until such time as the entire memory has been verified. As is apparent, each byte position within the memory of MBM 70 is checked or verified within the subroutine represented by loop 880.

In the event equality between the pattern indicated by the buffer pointer and the byte read from MBM 70 is not achieved as represented at decision block 876, then as represented at block 882 the microinstructions cause LED 836 and switched power supply 160 to be turned off. The latter power shut-down permits module 16 to be removed from apparatus 50 without damage. As represented at block 884, CPU 808 then causes LED 836 to blink on and off as a visual indicia to the operator that a defective memory module 16 is present. The program then proceed to decision block 886 wherein a query is made as to whether memory module 16 is latched. In the event of an affirmative response, the instructions carry out a looping routine represented at 888 providing for the continued blinking of LED 836 until such time as module 16 is removed, which will be represented at block 886 as a negative response indicating the unlatching thereof. The program then proceeds, as represented at line 890, to start position 850 (FIG. 12A) whereupon a shut-down routine is carried out leading to a stand-by condition as developed by minor loop 860.

Returning to FIG. 12B, in the event decision block 878 indicates that the entire memory of MBM 70 has been read and verified by the comparison tests, the program then proceeds to insert all zeros within the entire memory of MBM 70. This is carried out by setting the CPU 808 register or buffer pointer at a zero pattern. Accordingly, as represented at decision block 892 a query is made as to whether the buffer pointer has been set to the zero pattern. In the event of a negative response, as represented at block 894, the register or buffer pointer is set to identify such zero pattern. This pattern is a block of zeroes which is format-compatible with the test pattern. Following the setting of the buffer pointer to the zero pattern, as represented at line 896 extending to the input to block 864 in FIG. 12A, the system carries out the insertion of zeroes one byte at a time, as represented by loop 870 following which, as represented by loop 880 the zero patterns are compared to assure proper erasure of MBM 70.

An affirmative response to the inquiry of decision block 892 indicates that the entire MBM 70 has been properly filled with zeroes and the program then proceeds to block 898 at which point LED 832 and switched power supplies 160 are turned off. Following the command of block 898, as represented at decision block 900, an inquiry is made as to whether the memory module 16 is latched. In the event of an affirmative response, as represented by minor loop 902, the program awaits the removal of the module 16 by the operator. When the memory module 16 has been removed by the operator, a negative response is received to the inquiry at block 900 and, as represented by line 890, the program proceeds to the input of block 852 in FIG. 12A. The description of CPU 808 and related components within dashed boundary 806 of FIG. 11A is provided herein as it may relate to the signal and terminal labeling of FIGS. 8A-8C. To operate erase function 50, however, it has been pointed out that a unique interrupt, INT, signal is required from controller 90'. A line 804 carrying this signal has been described in conjunction with FIGS. 11A and 11B and is reproduced in FIGS. 8A and 8B for the specific purpose of description of the components forming the erase function 50. Line 804 has been generally described as extending to the input of a data input buffer 842. The buffered INT signal then is directed from input buffer 842 along line 832 to CPU 808.

Figure 14B:
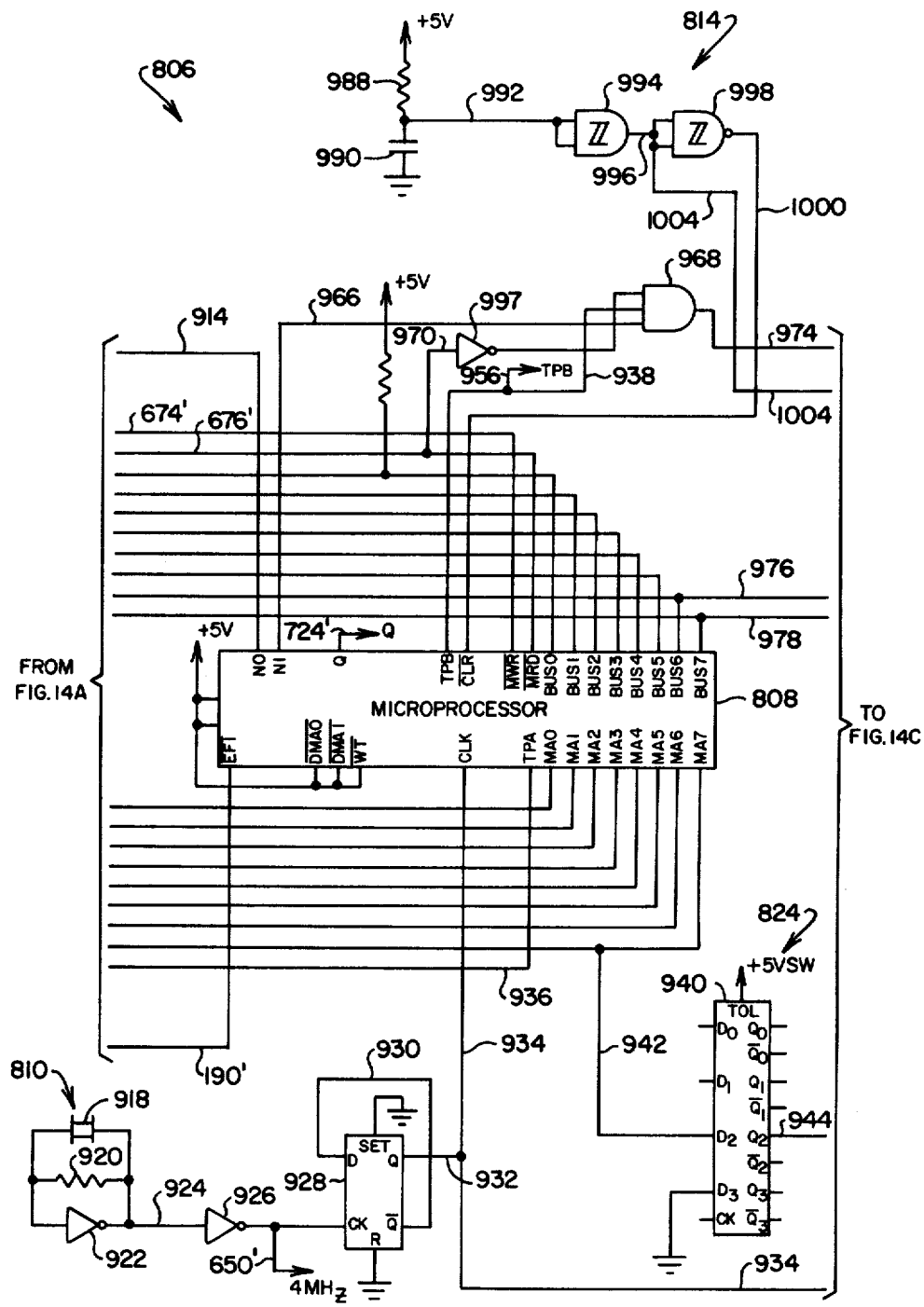
Figure 14C:
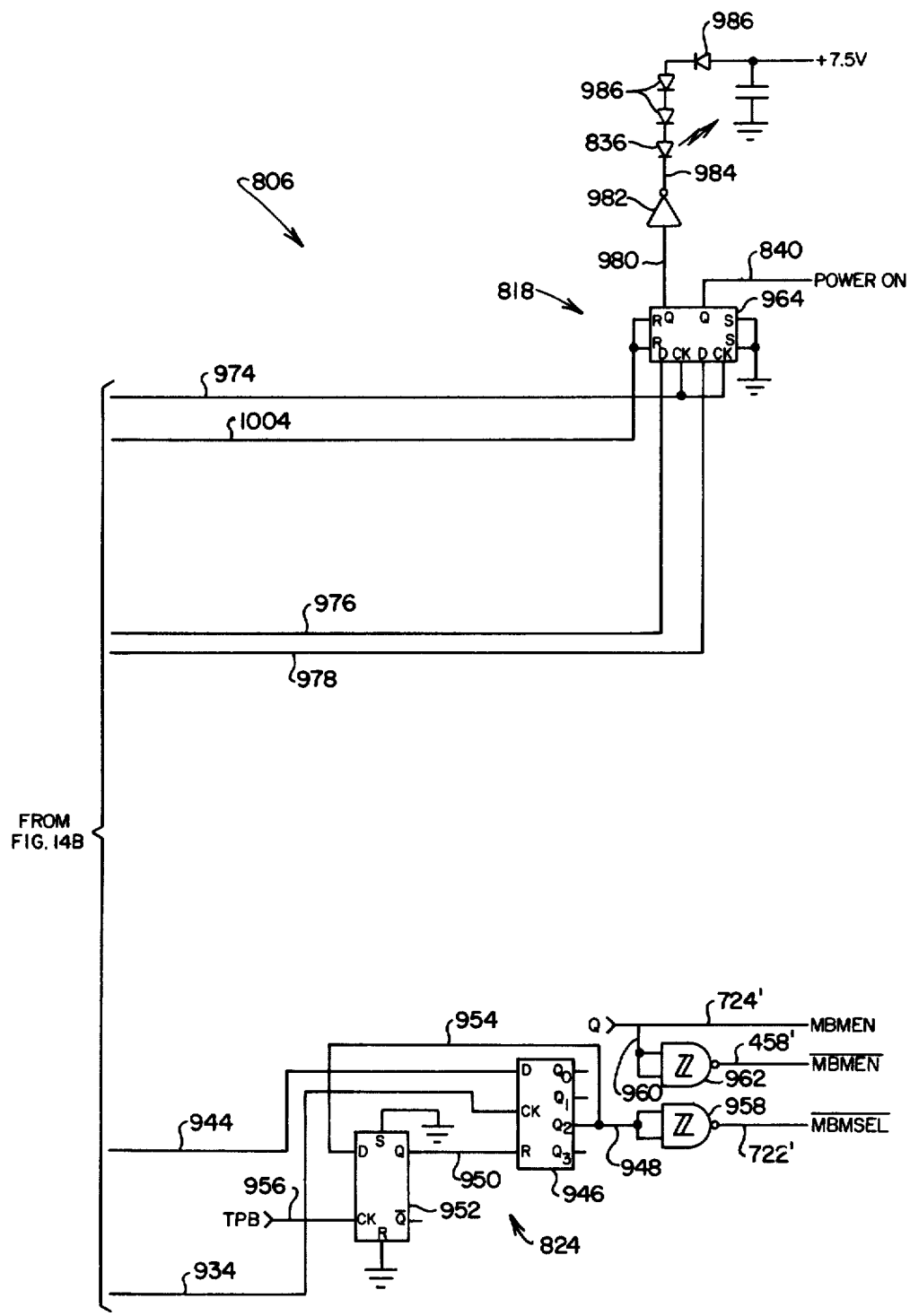

Referring to FIG. 13, a schematic representation of the relative positioning of FIGS. 14A-14C is revealed, the latter figures representing those components described in connection with FIG. 11A within dashed boundary 806.

Turning to FIGS. 14A-14C, CPU 808 is represented in a higher level of detail as it is associated with read only memory, ROM 826, input port 828, clock 810, reset network 814, output port network 818 and LED 836. To facilitate the description of the instant microprocessing function in connection with the controller function represented in FIGS. 8A-8C, where appropriate, the identical numeration as is utilized in the latter figures is reproduced in the former figures in primed fashion. The above-noted input line 832 from data input buffer 842 (FIG. 11B) to input port 828 again is revealed as extending to a CMOS, tri-stated, non-inverting buffer 910, the output of which at line 830 is coupled through lead BUS 1 to the corresponding terminal of CPU 808 (FIG. 14B). Buffer 910 is selectively gated from the N0 device select terminal of CPU 808 through line 914 which extends through an inverter 916. Buffer 910 may be a type 14503 marketed by Motorola, Inc.

The system clock is represented generally in FIG. 14B at 810 and includes a 4 MHz crystal 918 operating in conjunction with resistor 920 and inverter 922 to provide a 4 MHz output at line 924. This signal is buffered at buffer 926 and tapped at line 650' to provide a 4 MHz output which leads to corresponding line 650 input to buffer region 102 of controller 90' as represented in FIG. 8A. Line 924 leads to the clock CK input of D type flip-flop 928 which may be type 4013 marketed by RCA, Inc. The D terminal of flip-flop 928 is coupled through line 930 to the $\overline{Q}$ terminal thereof, while the Q terminal output thereof is coupled through lines 932 and 934 to the clock CLK input terminal of CPU 808. Flip-flop 928 divides the incoming frequency at line 924 by 2 such that the CLK terminal receives a 2 MHz input. CPU 808 treats this incoming signal and evolves therefrom a timing pulse A, TPA which is outputted therefrom along line 936 to ROM 826. CPU 808 also develops a timing pulse B (TPB) at line 938 and, as before, includes write-read terminals $\overline{MWR}$ and $\overline{MRD}$ which extend, respectively, along lines 674' and 676' to buffer region 102C (FIG. 8A). Additionally, note that a corresponding $\overline{MRD}$ terminal is provided in ROM 826 which is coupled with line 676'. The data bus terminals of CPU 808 are identified as BUS 0-BUS 7 and are connected with corresponding input terminals of ROM 826. These bus leads also extend to buffer region 102B in FIG. 8A. Correspondingly, the memory address terminals of CPU 808 are labeled MA0-MA7 and extend to corresponding terminals within ROM 826, as well as to the correspondingly labeled terminals of buffer region 102A in FIG. 8A.

The $\overline{MBMSEL}$ input at line 722' is retained by address latch 824 for the requisite interval required to permit its utilization by controller 90'. This network includes a 4-bit address latch 940. Latch 940 may be a type 4042 marketed by RCA, Inc. The $D_2$ terminal of latch 940 is coupled through line 942 to memory address terminal MA7 of CPU 808 by connection with an appropriate bus 822 lead. The output of latch 940 is provided at the $Q_2$ terminal thereof which is coupled by line 944 to the D terminal input of a shift register 946. The clock, CK, input terminal of register 946 is coupled with line 934 which carries the 2 MHz clock signal asserted at microprocessor 808 from clock 810. By tapping register 946 at its $Q_2$ terminal output, the requisite delayed signal is present at line 948. Register 946 is reset from line 950 which, in turn, is coupled with the Q output of a D type flip-flop 952. The D terminal of flip-flop 952 is coupled through line 954 to line 948, representing the output of shift register 946, while the clock, CK, terminal thereof is connected to receive the timing pulse B (TPB) input from CPU 808 through lines 938 and 956. Thus, flip-flop 952 is toggled to reset register 946 upon the occurrence of an output at line 948 in conjunction with a clock input at line 956. The signal at line 948 is directed into a Schmitt-type NAND triggering component 958 which may be present as a type 4093 marketed by RCA, Inc. Triggering component 958 serves the function of inverting the signal. The resultant output at line 722' is, as labeled, designated $\overline{\text{MBMSEL}}$ which is directed to the buffers within boundary 102C at FIG. 8A for treatment prior to submittal to controller 90'. Similarly, the memory bubble enable signals are generated from the Q terminal output of CPU 808 as presented along line 724'. In this regard, the Q terminal output is considered the MBMEN or bubble enable signal. Line 724' is tapped by line 960 so as to introduce the Q signal to the inputs of another Schmitt-type NAND trigger 962 which is identical to that described at 958. The inverted output of trigger 962 at line 458' carries, as labeled, the $\overline{\text{MBMEN}}$ signal. The signals at line 724' and 458' are asserted at buffer region 102C as described in conjunction with FIG. 8A.

Looking to the output port function represented at block 818 in FIG. 11A and generally by that same number in FIG. 14C, a latching device 964 is provided which may be a type 4013 flip-flop marketed by RCA, Inc. Latching device 964 operates in conjunction with a signal asserted at output port N1 of CPU 808 so as to retain that data which is present on an associated data bus lead until termination of the latching condition is desired. Output from device select terminal N1 of CPU 808 is asserted along line 966 which extends to one input of AND gate 968. The second input to gate 968 is the timing pulse B, TPB, input at line 938 and the third input thereto is the read command, $\overline{\text{MRD}}$, from CPU 808 which is tapped at input line 970 containing an inverter 997. The output of gate 968 at line 974 is directed to the clock, CK, terminal inputs of device 964, while the D terminal inputs thereto are coupled by lines 976 and 978 to respective bus terminals Bus 6 and Bus 7 of CPU 808. With the arrangement, for example, when CPU 808 provides data on data bus leads BUS 6 and BUS 7 and, simultaneously, strobes terminal N1, a high signal value is presented at the Q terminal output lines 980 and 840. A high signal value at line 980 is inverted at LED driver 982, providing a resultant low signal value at output line 984. This provides for the passage of current through LED 836 from the labeled 7.5 v source derived from voltage supply 164 (FIG. 11B). Diodes 986 serve the purpose of providing an appropriate voltage drop to LED 836. The POWER ON line 840 extending from the Q terminal of device 964 provides for powering of the erase apparatus 50 from switched power supplies 160 (FIG. 11B).

The power up-reset function is shown generally at 814 (FIG. 14B) and includes an R-C network including resistor 988 and capacitor 990. When power first is asserted, capacitor 990 is discharged which serves to hold line 992 at a low value. Line 992, in turn, is coupled to the input of a Schmitt-type NAND gate 994. The low input at line 992 continues for an interval of about 100 milliseconds. The output of gate 994 at line 996 extends to the input of an identical Schmitt-type NAND gate 998, the corresponding output of which at line 1000 extends to the $\overline{\text{CLR}}$ terminal of CPU 808. Accordingly, resetting of the microprocessor is carried out for an interval of about the noted 100 milliseconds. Line 996 at the output of device 994 is shown extending to line 1004 which leads to the reset inputs R of latching device 964. Gates 994 and 998 may be of the earlier-noted type 4093 marketed by RCA, Inc. By thus resetting the latch function on both output ports 818 and 124 (FIG. 2A) over an interval during power-up, the components of memory module 16 are protected.

Referring to FIG. 15, the arrangement for considering FIGS. 16A and 16B is represented schematically. Note, that FIG. 16A should be considered as positioned above FIG. 16B. FIGS. 16A and 16B include a compilation of powering components both common to reader apparatus 24 and erase apparatus 50 as well as components unique to those devices. Those components within the figures common to both functions retain the same general numerical identification provided in conjunction with FIG. 2B within dashed boundary 158 and FIG. 11B within dashed boundary 834.

Referring to FIG. 16B, the switched power supplies commonly described in conjunction with block 160 in FIGS. 2B and 11B again is represented in general by that number. The figure shows a positive and negative 16 v a.c. input at lines 1002 and 1004 which derives from bus 176 extending to a.c. power supply 178 (FIGS. 2B and 11B). Lines 1002 and 1004 extend to opposite positions within a bridge rectifier indicated generally at 1006. Rectifier 1006 provides a d.c. output at line 167 which is labeled "+12 v UNREG" and another output at line 169 which is labeled "−12 v UNREG". Lines 167 and 169 have been described earlier in conjunction with block 165 in FIG. 2B. These lines supply power, respectively, to lines 390 and 394 of regulator function 382 described in conjunction with FIG. 6A. Conventional filtering is provided by two capacitors C1 and C2 shown within a network 1008 as coupled between lines 167 and 169 and in common to ground.

Line 167 is shown coupled to the voltage input of a +12 v regulator 1010 by connection therewith through lines 1012 and 1014. The regulator 1010 responds to a switching signal input thereto provided along line 1016 through resistor 1018 to provide a corresponding output signal voltage at line 1020. Line 1020 is coupled to the base of an NPN transistor Q1, the collector of which is coupled to line 167 and the emitter of which is connected to line 1024. Regulation of the voltage level at line 1024 is derived by selecting an appropriate combination of resistors within network 1026, that network being shown coupled to the INV terminal of regulator 1010 through line 1028. A capacitor C3 is coupled, as is conventional, from the COMP terminal of regulator 1010 to line 1028 to complete the noted regulation. Actuating line 1016 extends to one inverting Schmitt-type NAND gate 1030 of a pair thereof including NAND gate 1032. These gates may be present as the earlier-described type 4093. One input of each gate 1030 and 1032 is coupled through resistor 1034 to the POWER ON output line represented at 192 in conjunction with FIG. 2A and line 840 in conjunction with FIG. 11A. The opposite input to each of the AND gates 1030 and 1032 is coupled through line 1036 to a +6 v voltage supply derived at line 1036 extending from line 1096 and labeled "+6 v" (FIG. 16A). With the arrangement, with the assertion of a POWER ON signal either at line 192 or 840, depending upon the apparatus involved, regulator 1010 is actuated from line 1016 to provide a +12 v SW output at line 1024.

Gate 1032 is shown coupled through line 1038 to the base of PNP transistor Q2. The emitter of transistor Q2 is coupled to the +6 v supply derived from line 1036, while the collector thereof is coupled to line 1040 which extends through base resistor 1042 to the base of PNP transistor Q3. The emitter of transistor Q3 is coupled to line 169, while the collector thereof is coupled through line 1044 to a −12 v regulator 1046. Regulator 1046 is coupled with bypass capacitors C4 and C5 and may be present, for example, as a type 79M12 marketed by Fairchild, Inc. With the arrangement shown, with the presence of a power-on signal asserted through resistor 1034, the resultant low signal at line 1038 draws transistor Q2 into conduction to, in turn, provide a forward bias through resistor 1042 to the base of transistor Q3. Transistor Q3 is then turned on, to actuate regulator 1046 and derive a −12 v SW output source at line 1048.

Turning to FIG. 16A, a second input from a.c. power supply 178 and power bus 176 is represented at lines 1050 and 1052. These lines are mutually coupled with a surge or transient protector 1054 and to opposite sides of a bridge rectifier 1056 to provide a d.c. output at line 1058. Filtering action is provided by capacitor C6 at line 1058 and line 1058, in turn, is tapped by line 1060. Line 1060 extends to line 1062 and capacitor C7. Capacitor C7 serves the earlier-described function in conjunction with reading apparatus 24 of providing stand-by power to controller 90 in the event of a power failure, that power being sufficient to permit MBM 70 to be indexed to its 0 memory position.

Line 1060 additionally extends to line 1064 leading to the voltage input of voltage regulator 1066. The input to regulator 1066 is coupled with a voltage divider network including resistors 1068 and 1070 as well as thermistor 1072. Thus, the input to regulator 1066 is temperature compensated. The output voltage terminal of regulator 1066 is coupled through line 1074 to the base electrode of NPN transistor Q4, the collector of which is coupled with line 1060. The emitter of transistor Q4 is coupled to a current limiting resistor network 1076 coupled between output lines 1078 and 1080. A voltage selection network 1082 additionally is coupled to line 1080 and the inverting compensating output terminal of regulator 1066. As before, a compensation capacitor C8 additionally is coupled with regulator 1066. Regulators 1066 and 1010 may be a type 723 marketed by Texas Instruments, Inc.

Line 1080 is coupled through lines 1084 and 1086 to provide a +7.5 v output as labeled, and through a diode D2 to provide a +5 v output at line 1090, as labeled. These outputs have been described in connection with block 164 in FIGS. 2B and 11B.

Line 1058, carrying a d.c. power supply also is directed through base resistor 1092 to the base of NPN transistor Q5. The collector of transistor Q5 is coupled to the +5 v output at line 1090 through line 1094. The emitter of transistor Q5 is coupled through line 1096 (to which is connected a filtering capacitor C9) to the power input of an operational amplifier 1098. One input to amplifier 1098 derives from a divider network 1100 having a voltage input at line 1102 coupled to +12 v SW developed at line 1024, as described in connection with FIG. 16B. Network 1100 further is coupled through line 1104 and resistor 1106 to one input of amplifier 1098. With the arrangement, the output of amplifier 1098, as coupled to the base of PNP transistor Q5, will serve to forward bias the latter transistor in the presence of a +12 v SW input to line 1102. The collector of transistor Q5 is coupled to line 1094 and through resistor 1108 to the base of PNP transistor Q6 and to the collector of transistor Q10. The emitter of transistor Q6 is coupled through line 1110 to line 1094, while the collector thereof is coupled along line 1120 and line 1112 and resistor 1114 to the second input of operational amplifier 1098. The emitter of transistor Q10 is coupled through line 1116 and resistor 118 to ground, while its base is coupled to the output of amplifier 1098. With the arrangement shown, a regulating action is evoked at output line 1120 to provide the labeled +5 v SW power output. A filtering capacitor C10 is shown coupled to output line 1120.

FIG. 16A also reveals the clock signal generating network described in FIG. 2B at block 170. This clock output is utilized in conjunction with the power fail network described in general at 184 in FIGS. 2A and 6A. Network 170 includes an input line 174 coupled to input line 1050. Line 174 extends through resistors 1122 and 1124 to one input of a Schmitt-type NAND gate 1126. Gate 1126 is powered from the +6 v power supply of line 1036 (FIG. 16B) as represented at line 1128, that line being coupled additionally into a capacitor C11 coupled, in turn, to ground in conventional filtering fashion. The opposite input to gate 1126 is provided at line 1130 which, in turn, is coupled with the +6 v supply of line 1036. Line 174 additionally is coupled to a line 1132 which incorporates to a diode D1 and is coupled to the noted line 1036 +6 v supply. Diode D1 serves to clamp the input of gate 1126 such that it does not go above Vcc. A filtering capacitor, C12, additionally is shown coupled between line 174 and ground. The output of gate 1126 is present at line 172 which includes a resistor 1134. Line 172, carrying the 60 Hz line frequency, as shown in FIG. 2A, leads to power fail network 184 (FIG. 6A).

Returning to FIG. 16B, the relay driver function described in connection with FIG. 2B is shown in enhanced detail within dashed boundary 152. As is described in conjunction with FIG. 2A, output port 124 provides a relay actuating signal along line 154. Line 154 is reproduced in FIG. 16B and is shown leading through base resistor 1136 to the base of NPN transistor Q7. The emitter of transistor Q7 is coupled to ground, while the collector thereof is connected along line 1138 to light emitting diode D3, extending therefrom through resistor 1140 to a +7.5 v supply as derived from line 1086 (FIG. 16A). Accordingly, with the imposition of a high signal at line 154, transistor Q7 is turned on to energize diode D3 causing illumination. This illumination causes phototransistor Q8 to be turned on. The collector of transistor Q8 is coupled to line 156 which, in turn, is coupled to winding 332 of relay 330 as described in FIG. 4. The emitter of transistor Q8 is coupled through line 1142 to the base of NPN transistor Q9, the emitter of which is coupled through line 1144 to ground. The collectors of transistors Q8 and Q9 are coupled to line 156. Accordingly, as transistor Q8 is turned on, transistor Q9 is turned on to, in turn, effect the energization of winding 332. The use of a light coupling as shown serves the conventional purpose of isolating the power input lines from inductive winding 332.

FIG. 16B additionally reveals the data input buffer function described in FIG. 11B in conjunction with block 842 as receiving the INT signal along line 804 from controller 90' as it operates in conjunction with the erase-erase verify apparatus 50. Line 804 is shown extending through resistors 1148 and 1150 to one input of a Schmitt-type NAND gate 1152, the output of which is present at line 832 which incorporates resistor 1154. Line 832, in turn, has been described as extending to the input port function 828 as described in conjunction with FIG. 14A. The opposite input to gate 1152 derives from line 1156 which extends from the output of an identical Schmitt-type NAND gate 1158. One input of gate 1158 is provided by a line 1160 extending from output line 832, while the opposite input thereto is coupled by line 1162 to ground. Line 1162 also is shown to contain resistors 1164 and 1166. Resistors 1168 and 1170, coupled between respective lines 1162 and 804 to +6 v (line 1036) serve a conventional pull-up function. With the arrangement shown, wherein line 1162 is coupled to ground, a buffering function is provided wherein gate 1152 operates in the fashion of an inverter of the input to line 804.

Turning now to a consideration of the interaction between reader function 24 or 24' and computer 28, the operator at a remote location utilizing terminal 22 or locally utilizing terminal 22' calls up computer 28 by actuating a single key whereupon computer 28 transmits a prompt character representing a response to an unsolicited interrupt request. The operator then inserts a command which schedules the appropriate program for computer 28 for carrying out the reception and translation of the data derived from reader 24 or 24'. Assuming appropriate line availability, computer 28 transmits a character described earlier herein as WAKE-UP. As described in conjunction with FIG. 3A, the reader apparatus then actuates relay function 330 to energize winding 332 (FIG. 4) to effect the disconnection of terminal 22 or 22' and the corresponding coupling of the reader function with the computer function through the earlier-discussed transmitting techniques. Computer 28 then awaits a status signal from the reader which, as described in connection with FIG. 3A, may represent a NOT READY status or a READY status. Data transmission then ensues as generally described in connection with the flow diagrams at FIGS. 3A-3E. Data is transmitted in combinations of pages referred to as "blocks". One block is considered to represent six pages of data, each page representing 18 bytes. Each demand interval is assigned 12 bits of memory for pulse recordation, thus providing a maximum pulse capacity per demand interval of 4095. Of course, such an arrangement is arbitrary depending upon the desires of the designer.

Referring to Table I, a graphic illustration of the form of information which is transmitted in the initial block of data is provided. Represented in the table are word addresses, each such word representing two bytes of data. The table reveals that at page 0, and at word address 1, one byte is assigned to the month (MO) and another to the day (DA) of insertion of memory module 16. At word address 2, the hour (HR) and minute (MIN) of such insertion are provided, following which at words 3, 4, and the first half of 5, the user identification (ID1, ID2, ID3, ID4, ID5) is provided. The second half of 5 and words 6, 7 and the first half of 8 are utilized for providing running pulse total counts in dependence upon the number of channels selected. The remaining byte positions are 0 filled. As indicated in conjunction with FIG. 3B, page 0 is transmitted twice, and thus the second page of the first data block represented transmission of page 0 again. The third page transmitted is page 637 which represents the removal record. Note, that word 19 provides data as to the month, day, hour and minute of removal of memory module 16, while word positions 21 through 23 carry consumer identification and the remaining word addresses contain running pulse count totals for the minute of module 16 removal. The next data transmitted represent pages 638–640 of memory module 16 and provide at word addresses 28 and 29 the month, day and hour of the last collection period encountered. In the present example, a collection period of 8 hours is represented. The "nibbles" or half bytes represented at word addresses 30–53 show the close "packing" of data available with the system of the invention. In this regard, the term "L1" represents the least significant nibble of demand interval pulse count for demand interval 1 within the pertinent collection period. The symbol "H1" represents the highest significant nibble of the pulse count for the first demand interval of the pertinent collection period, while the symbol "M1" represents the middle range nibble data for the pulse count of the first demand interval. As is represented in the remainder of the table, these data components continue through the thirty-second demand interval depending upon the time of removal of module 16. Zero filling takes place for any portions or partial periods of the final collection period identified at word addresses 30 to 53 which are not utilized because of the removal. Note additionally, that a running total for that collection period is provided at those portions of word addresses 53 and 54 labeled "RT1-RT3", while a status indication labeled "ST" providing an output as to whether a read after write test for power failure or the like occurred during the noted collection period appear at word address 54. Finally, at word address 55, two bytes of information are provided for transmitting the most significant byte (MSB) and least significant byte (LSB) of CRC check data.

Looking to Table II, all other or interim data blocks representing six pages of data are represented. Note, that two 8-hour collection periods are represented and identified by byte address. The byte address commences with identification of the pertinent collection period month, day and hour following which demand interval pulse count ensues for three pages or 32 intervals to byte addresses 52 and 54 wherein running totals (R1-R3) and status (ST) information are provided. The next collection period of three pages then continues at byte addresses 56 and 58 at which position the month, day and hour for that next collection period are identified. The six page block of data is concluded at byte addresses 106–110 at which position running totals (RT1-RT3), status (ST) and CRC check data (MSB at byte 109 and LSB at byte 110) are provided.

TABLE I

| Page No. | WORD ADDRESS | 1st Data Block Transmitted | |
|---|---|---|---|
| ↑ | 1 | MO | DA |
| ↑ | 2 | HR | MIN |
| INS. | 3 | ID5 | ID4 |
| REC. | 4 | ID3 | ID2 |
| P. 0 | 5 | ID1 | A2 |
| ↓ | 6 | A3 | A1 |
| ↓ | 7 | B2 | B3 |
| ↓ | 8 | B1 | 0 |
| ↓ | 9 | 0 | 0 |
| ↑ | 10 | MO | DA |
| ↑ | 11 | HR | MIN |

TABLE I-continued

| Page No. | WORD ADDRESS | 1st Data Block Transmitted | | |
|---|---|---|---|---|
| ↑ | 12 | | ID5 | ID4 |
| INS. | 13 | | ID3 | ID2 |
| REC. | 14 | | ID1 | A2 |
| P. 0 | 15 | | A3 | A4 |
| ↓ | 16 | | B2 | B3 |
| ↓ | 17 | | B1 | 0 |
| ↓ | 18 | | 0 | 0 |
| ↓ | 19 | | MO | DA |
| ↑ | 20 | | HR | MN |
| REM. | 21 | | ID5 | ID4 |
| REC. | 22 | | ID3 | ID2 |
| | 23 | | ID1 | A2 |
| P. 637 | 24 | | A3 | A1 |
| ↓ | 25 | | B2 | B3 |
| ↓ | 26 | | B1 | 0 |
| ↓ | 27 | | 0 | 0 |
| ↑ | 28 | | MO | DA |
| ↑ | 29 | | HR | M1 | L1 |
| ↑ | 30 | H1 | H2 | M2 | L2 |
| ↑ | 31 | M3 | L3 | H3 | H4 |
| ↑ | 32 | M4 | L4 | M5 | L5 |
| ↑ | 33 | H5 | H6 | M6 | L6 |
| | 34 | M7 | L7 | H7 | H8 |
| P. 638 | 35 | M8 | L8 | M9 | L9 |
| | 36 | H9 | H10 | M10 | L10 |
| | 37 | M11 | L11 | H11 | H12 |
| | 38 | M12 | L12 | M13 | L13 |
| | 39 | H13 | H14 | M14 | L14 |
| LAST | 40 | M15 | L15 | H15 | H16 |
| PAGES | 41 | M16 | L16 | M17 | L17 |
| REC. | 42 | H17 | H18 | M18 | L18 |
| P. 639 | 43 | M19 | L19 | H19 | H20 |
| | 44 | M20 | L20 | M21 | L21 |
| | 45 | H21 | H22 | M22 | L22 |
| | 46 | M23 | L23 | H23 | H24 |
| | 47 | M24 | L24 | M25 | L25 |
| | 48 | H25 | H26 | M26 | L26 |
| | 49 | M27 | L27 | H27 | H28 |
| | 50 | M28 | L28 | M29 | L29 |
| P. 640 | 51 | H29 | H30 | M30 | L30 |
| ↓ | 52 | M31 | L31 | H31 | H32 |
| ↓ | 53 | M32 | L32 | | RT2 |
| ↓ | 54 | | RT3 | ST | RT1 |
| CRC | 55 | | MSB | | LSB |

TABLE II

| BYTE ADDRESS | INTERIM DATA BLOCKS | | | |
|---|---|---|---|---|
| ↑ | 2 | | MO | DA |
| ↑ | 4 | | HR | M1 | L1 |
| ↑ | 6 | H1 | H6 | M2 | L2 |
| ↑ | 8 | M3 | L3 | H3 | H4 |
| ↑ | 10 | M4 | L4 | M5 | L5 |
| ↑ | 12 | H5 | H6 | M6 | L6 |
| ↑ | 14 | M7 | L7 | H7 | H8 |
| ↑ | 16 | M8 | L8 | M9 | L9 |
| ↑ | 18 | H0 | H10 | M10 | L10 |
| ↑ | 20 | M11 | L11 | H11 | H12 |
| ↑ | 22 | M12 | L12 | M13 | L13 |
| 3 | 24 | H13 | H14 | M14 | L14 |
| Pages | 26 | M15 | L15 | H15 | H16 |
| ↓ | 28 | M16 | L16 | M17 | L17 |
| ↓ | 30 | H17 | H18 | M18 | L18 |
| ↓ | 32 | M19 | L19 | H19 | H20 |
| ↓ | 34 | M20 | L20 | M21 | L21 |
| ↓ | 36 | H21 | H22 | M22 | L22 |
| ↓ | 38 | M23 | L23 | H23 | H24 |
| ↓ | 40 | M24 | L24 | M25 | L25 |
| ↓ | 42 | H25 | H26 | M26 | L26 |
| ↓ | 44 | M27 | L27 | H27 | H28 |
| ↓ | 46 | M28 | L28 | M29 | L29 |
| ↓ | 48 | H29 | H30 | M30 | L30 |
| ↓ | 50 | M30 | L30 | H31 | H32 |
| ↓ | 52 | M32 | L32 | | R2 |
| ↓ | 54 | | R3 | ST | R1 |
| ↑ | 56 | | MO | | DA |
| ↑ | 58 | | HR | M1 | L1 |

TABLE II-continued

| BYTE ADDRESS | INTERIM DATA BLOCKS | | | |
|---|---|---|---|---|
| ↑ | 60 | H1 | H2 | M2 | L2 |
| ↑ | 62 | M3 | L3 | H3 | H4 |
| ↑ | 64 | M4 | L4 | M5 | L5 |
| ↑ | 66 | H5 | H6 | M6 | L6 |
| ↑ | 68 | M7 | L7 | H7 | H8 |
| ↑ | 70 | M8 | L8 | M9 | L9 |
| ↑ | 72 | H9 | H10 | M10 | L10 |
| ↑ | 74 | M11 | L11 | H11 | H12 |
| 3 | 76 | M12 | L12 | M13 | L13 |
| Pages | 78 | H13 | H14 | M14 | L14 |
| ↓ | 80 | M15 | L15 | H15 | H16 |
| ↓ | 82 | M16 | L16 | M17 | L17 |
| ↓ | 84 | H17 | H18 | M18 | L18 |
| ↓ | 86 | M19 | L19 | H19 | H20 |
| ↓ | 88 | M20 | L20 | M21 | L21 |
| ↓ | 90 | H21 | H22 | M22 | L22 |
| ↓ | 92 | M23 | L23 | H23 | H24 |
| ↓ | 94 | M24 | L24 | M25 | L25 |
| ↓ | 96 | H25 | H26 | M26 | L26 |
| ↓ | 98 | M27 | L27 | H27 | H28 |
| ↓ | 100 | M28 | L28 | M29 | L29 |
| ↓ | 102 | H29 | L29 | M30 | L30 |
| ↓ | 104 | M31 | L31 | H31 | H32 |
| ↓ | 106 | M32 | L32 | | RT2 |
| ↓ | 108 | | RT3 | ST | RT1 |
| CRC | 110 | | MSB | | LSB |

Figure 17A:
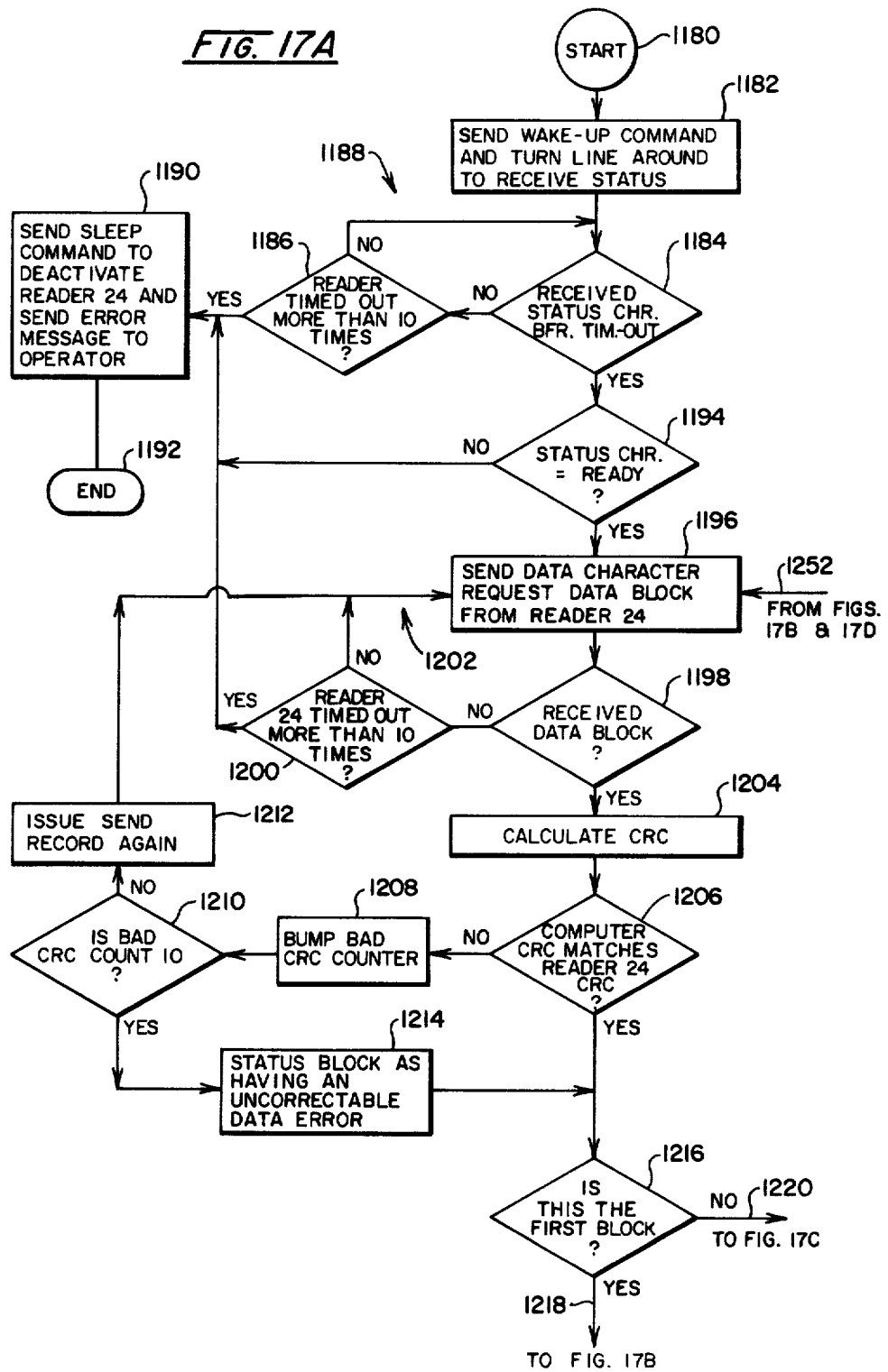

Referring to FIG. 17A, a flow chart representing the scheduled task carried out by computer 28 in translating the information stored in memory module 16 is revealed. This program commences at start terminal 1180, whereupon, as represented at block 1182, the WAKE-UP command (escape-K-DC1) is asserted and, as represented at block 218 in FIG. 3A, the relay 130 is turned on, controller 90 is energized and LED 194 is illuminated in steady state fashion. Additionally, the input to the terminal is turned around such that it is then in a receive status, operating in a half duplex fashion. Upon carrying out the above functions, the program then proceeds to decision block 1184 at which position the question as to whether a status character has been received yet is proffered. In the event of a negative response, the program proceed to decision block 1186 querying whether the question has been asserted at block 1184 with a negative response for a given number of times, for example 10 times. In the event of a negative response, then a minor loop is provided wherein a delay is defined, for example of about 200 milliseconds, wherein the system awaits the presence of a status command. In the event that the time-out represented by loop 1188 is achieved, the resultant affirmative response at block 1186 leads to the command represented at block 1190. The SLEEP command which corresponds with the earlier described DONE command, causes the reader 24 to shut down and may, for example, be asserted at line 238 as described in connection with the DONE command to cause the relay 130 to be turned off as well as power to controller 90 and LED 194. The termination is represented at end terminal 1192. Also, as represented at block 1190, the computer may send an error message to the operator at terminal 22. Such message, for example, may advise that the memory module 16 has not been inserted or has been improperly latched.

In the event a status character has been received to provide an affirmative response at block 1184, then as represented at decision block 1194, the query as to whether the status character was READY as represented by the character G is made. In the event of a negative response, representing a NOT READY or N character, then the program exits to block 1190 to generate a SLEEP command and terminate the instructions as represented at terminal 1192. An affirmative response at block 1194 leads to block 1196. At block 1196 the SEND DATA command is generated as discussed in connection with FIG. 3B at block 234. This command requests that a data bock be transmitted from reader apparatus 24. The program then progresses to decision block 1198 wherein the query is made as to whether a data block has been received. In the event of a negative response, then as represented at decision block 1200, the question as to whether the query has been asserted at block 1198 a given number of times, for example 10 times, has occurred. In the event of a negative response, then a minor loop as represented at 1202 is effected to provide a time delay during which the data block will have been received or not. An affirmative response at block 1200 results in the generation of a SLEEP command as represented at block 1190 and termination of the program as represented at 1192. Additionally, a message may be sent to the operator at terminals 22 or 22'. Generally, 200 to 400 milliseconds will be involved in the evolution of loop 1202 to its ultimate time span. The message to the operator may be, for example, that an interface condition has not been met or simply that the data block has not been received.

An affirmative response at block 1198 leads to a command at block 1204 wherein a cyclic redundancy check is calculated in conjunction with the data received and in independence of the corresponding computation made by reader 24. This computation involves the earlier-described CEC-CCITT polynomial.

Following the computation of a CRC character, then as represented at decision block 1206, the query is made as to whether the thus computed CRC character matches that computed and transmitted by reader 24. A negative response to the query at block 1206 generally will be caused by a transmission line difficulty, consequently, as represented at block 1208, the number of mismatches in CRC characters or number of negative responses at block 1206 are accounted for. Following this activity, the program proceeds to decision block 1210 at which point the number of bad CRC counts at block 1208 is compared to a standard number, for example 10. If that number has not been equaled or exceeded to indicate a negative response, then the program proceeds to block 1212 at which point a command is made to SEND RECORD AGAIN as described in connection with blocks 288-292 in FIG. 3C. The resultant command returns the program to block 1196.

The record represented by the loop including blocks 1208-1212 is retained for providing a record as the quality of the transmission lines involved in the system. Such data may lead to instructions to call up computer 28 from the remote station 20 again.

In the event of an affirmative response at block 1210, then, as represented at block 1214, a status record is derived describing that the block of data has an uncorrectable error. This information is retained in memory. An affirmative response at block 1206 or an input from block 1214 leads to decision block 1216 which queries whether or not this is the first block of data transmitted, such block being described for example, in connection with Table I above. An affirmative response at bock 1216 is represented at path line 1218 and a negative response is represented at line 1220.

Figure 17B:
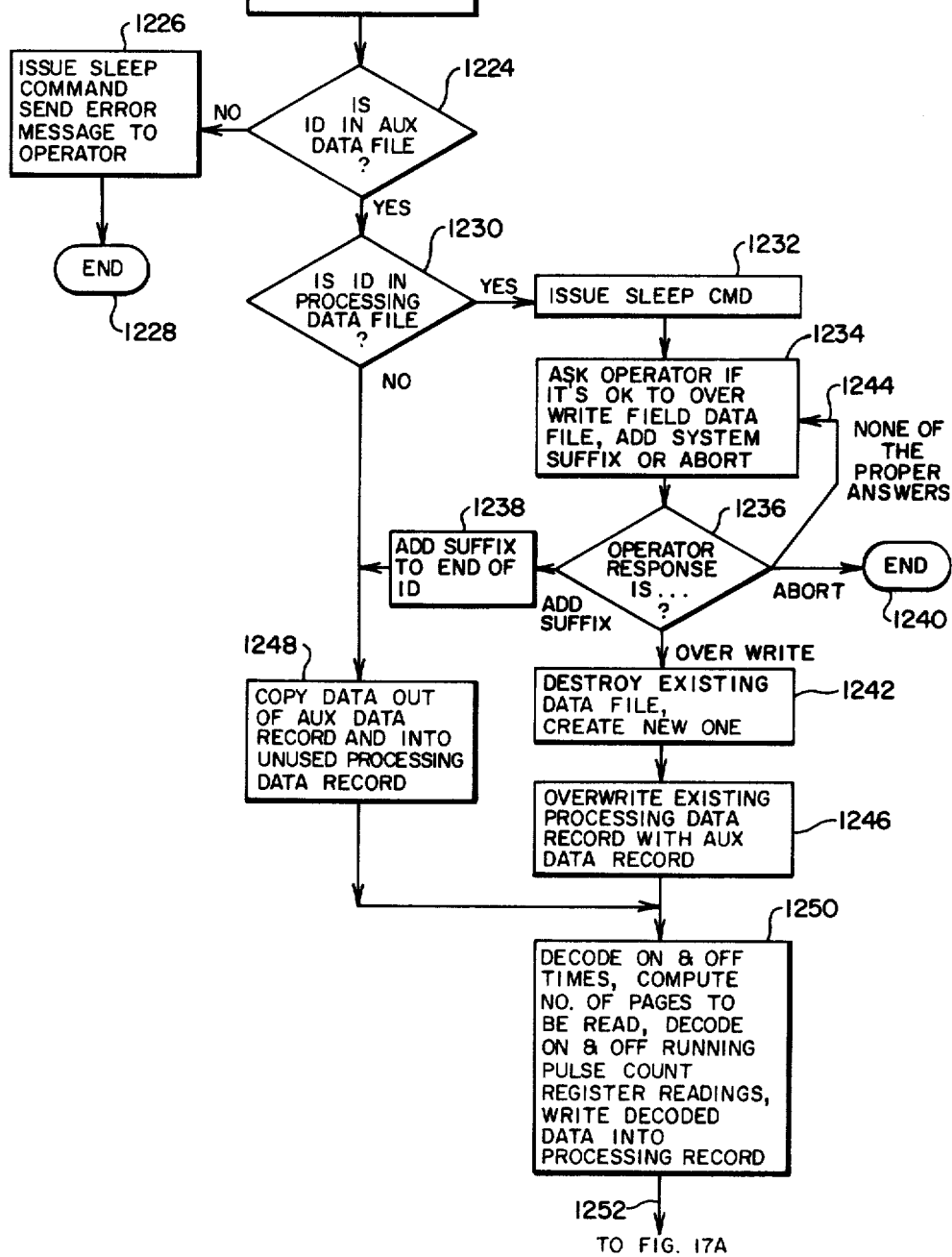

Referring to FIG. 17B and assuming an affirmative response at block 1216 leading to path line 1218, the situation at this point in time is that the first block of data (Table I) is being considered and that block may or may not have a status representing an uncorrectable data error associated therewith which input would have emanated from block 1214. Line 1218 leads to block 1222. At block 1222, commands are provided for decoding the customer identification (ID) and placing it in predetermined memory locations. Additionally, the auxiliary data file of computer 28 is searched for the corresponding user or consumer identification. Such identification will include the consumer's name and address as well as conversion factors for generating a power value from the pulse complications. The program then proceeds to decision block 1224 wherein the query is made as to whether this identification (ID) is present in the auxiliary data file. In the event of a negative response at block 1224, then as represented at block 1226, a SLEEP command is issued to abort the program, inasmuch as conversion factors and the like are not available. Additionally, an error message is sent to the operator at terminal 22 or 22'. The termination of the program then is represented at block 1228 having a function identical to that at block 1192 in FIG. 17A.

In the event of an affirmative response at block 1224, then, as represented in decision block 1230, the query is made as to whether the customer identification (ID) is in a processing data file. Two forms of memory are available in computer 28, one being archival having a copy of all data including customer ID and the other is a processing data file which contains field data or that data currently being acted upon. In the event of an affirmative response at block 1230, then, as represented at block 1232, a SLEEP command is issued. Following the command at block 1232, the program proceeds to block 1234 at which position, the operator is requested to advise as to whether an overwrite of the field data file (processing data file) is permissible, or whether a system suffix should be added to the ID information to render it unique, or whether to abort the program at this position. The program then proceeds to decision block 1236 at which position the various operator responses are considered. In the event the operator response is to add a suffix to the end of the ID character, then such decision results in the command represented at block 1238. Should the operator wish to abort the program, then the program is terminated as represented at block 1240, such termination being in the manner described in conjunction with block 1192. In the event the operator wishes to create a new customer ID file, then the command for the creation of such new file is provided along with the destruction of the existing ID information as represented at block 1242. Where the operator provides none of the proper responses, then as represented at line 1244, the queries posed at block 1234 again are presented to the operator. Such second assertion, however, will provide a read-out to the operator setting forth those answers which are appropriate at that point in time, i.e. a definite response is required.

Following the command at block 1242, then as represented at block 1246, the existing processing data record is overridden with an auxiliary data record, variable data being altered. In the event a determination is made to add a suffix to the end of the ID character as represented at block 1238, or in the event of a negative response at decision block 1230, the program advances to block 1248 wherein the data are moved to an unused processing data record. The program then progresses to block 1250. Within the function represented by block 1250, the insertion material and removal record data concerning date and time are decoded; the number of 15 minute sample periods to be read are computed from the same pages, the running pulse count data are read and the decoded data are written into the processing record. The program then progresses along path line 1252 to block 1196 in FIG. 17A. Returning momentarily to that figure, it may be observed that the program then is repeated to decision block 1216 at which point the query will be made whether the first block of data is being read. In this instance, the response will be in the negative and the program then proceeds along path 1220 to block 1254 in FIG. 17C.

Referring to the latter figure, a subroutine is provided wherein all blocks of data are decoded except the first block. At block 1254, a computer pointer is set to the initial address of the block of data under consideration, which block will represent the next block in the sequence of events. The program then proceeds to block 1256 at which point the time data are decoded from the block under consideration, that time generally representing the commencement of a collection period. From block 1256, the program progresses to decision block 1258 at which position a comparison is made as to whether the collection interval times transmitted by reader 24 are equivalent to the corresponding collection interval times as computed by computer 28. In the event of a negative response, then as represented at block 1260, the clock error is established for status recordation. Following such recordation at block 1260 or in the event of an affirmative response at decision block 1258, as represented at block 1262, 32 intervals of data are decoded from the block of data. For example, as represented in Table II, 32 such intervals will represent three pages. The interval totals then are added together to derive a collection period running total which, for example, in the example of Table II would represent an 8 hour period. Next, the running pulse count total transmitted by reader apparatus 24 is decoded. The program then proceeds to decision block 1264 at which position the determination is made as to whether the running pulse count total transmitted by reader apparatus 24 is equal to the computed running pulse count total as derived in block 1262. In the event of a negative response, then as set forth at block 1266, the block of data is given a status as having a running pulse count error. This will be outputted to the operator eventually in the read-out of the system. While not shown in the flow chart, additionally, commands may be made to reread the block of data at this juncture. In the event of an affirmative response at block 1264 or following the status recordation at block 1266, as represented at block 1268, the status condition (running total error or clock error) is added to all demand intervals of the block. This feature is available, inasmuch as computer 28 will have a higher bit capacity than memory available from module 16 or reader 24.

Following the recordation provided at block 1268, the program proceeds to decision block 1270 at which position the query is made as to whether the block being considered has been fully decoded. The system operates such that one half of a block first is decoded, following which the second half of the block is decoded. In the event the complete block has not been decoded, then the program proceeds to block 1272 at which position the pointer is caused to move to the center of the block (see Table II) and the routine loops to block 1262 until such time as the second half of the block of data has been decoded. An affirmative response at block 1270 is represented at path line 1274.

Referring to FIG. 17D, path line 1274 is shown extending to block 1276. At block 1276, the interval data is written to the disc file which is that file of computer 28 upon which all forms of editing and the like can be carried out. This file retains the data until it is passed onto half inch magnetic tape for use by a main frame billing computer. Additionally, the clock is advanced one collection period and the page counter is advanced by a factor of 6, representing the decoding of a six page data block. The program then proceeds to decision block 1278 which queries whether or not the last block of data has been read. In the event of a negative response, then as represented at path line 1252, the program proceeds to block 1196 of FIG. 17A to carry out the reading of a next block of data.

In the event of an affirmative response at block 1278, then as represented at block 1280, a SLEEP command is issued and a translation report is written to terminal 22 or 22'. The translation report will advise the operator of all clock and transmission errors which may have occurred during the reading of MBM 70 as well as the energy consumption recorded by deriving the pulse register differences and the total of all demand intervals recorded. Any possible difference between the latter two values will represent an error to the operator. The program then progresses to block 1282 wherein the operator is asked for the disposition of the data and the possible responses thereto are represented at decision block 1284. In this regard, the operator may pass the data to the magnetic tape intended for main frame billing computer use by providing an ACCEPT status as represented at line 1286. Line 1286 leads to decision block 1288 wherein the system compares whether the number of calculated demand intervals equals the number actually recorded. In the event these values do not match, then as represented at line 1290, the operator again is asked for data disposition, the answer having been given at line 1286 being incorrect. In the event of an affirmative response at block 1288, then as represented at block 1292, the pass to magnetic tape flag is set and the status of the data is set to ACCEPT. This provides information such that, at the time a program is prepared for transferring the data to main frame magnetic tape, the data of the instant module 16 will be so passed. The program then is shown ending at terminal 1294.

If the read-out at terminal 22 or 22' indicates transmission errors of a degree wherein the operator determines that the information should be purged or aborted, then, as represented by path line 1296 and block 1298, the program sets a purge flag which provides for the elimination of the acquired data and, as represented at terminal 1300, the program is ended in the manner described in connection with terminal 1192.

If the read-out to the operator indicates that the data can be edited to an acceptable status, then a disposition as represented at path line 1302 wherein an edit report is to be prepared represents the selected disposition. As represented at block 1304, the program then sets a MAKE EDIT report flag and, as represented at block 1306, the program is brought to an end, again as represented as described earlier at terminal 1192.

A fourth disposition which may be made is represented at path line 1308, that disposition providing a passage of the data to magnetic tape with a reject status associated with it. Such a decision is made where the operator determines that better data is not available but it may be desirable to retain that data acquired for later retrieval. As represented at block 1310, the program sets the PASS TO MAGNETIC TAPE flag and the status is set to a REJECT one. Following this operation, as represented at terminal 1312, the program is ended. For any such ending, optionally, information may be passed to terminal 22 or 22' suggesting that the operator insert another memory module 16.

Since certain changes may be made in the above-described system, apparatus and method without departing from the scope of the invention herein involved, it is intended that all matter contained in the description thereof or shown in the accompanying drawings shall be interpreted as illustrative and not in a limiting sense.

We claim:

1. A system for reading data words contained in portable data storage means, said data words representative of data signals from a data source, and for treating said data signals comprising:
    reader means including: a receptable for receiving said portable data storage means in signal communicating relationship, first and second signal storage means, and first signal processing means responsive to an activation command signal for transferring a first group of said data words from a predetermined location within said portable data storage means to said first signal storage means, said signal processing means being further responsive to a transmit command signal for transmitting said first group of data words stored within said first signal storage means to said second signal storage means and then to an output of said reader means and for transferring a second group of data words from said portable data storage means to said first signal storage means while said first group of data words are being transmitted from said second signal storage means; and
    translator means having an input for receiving, when activated, signals representing said transmitted data words from said output of said reader means and including second signal processor means for generating said activation command signal and said transmit command signal and for analyzing the validity of said transmitted data words and effecting the select recordation thereof upon a storage medium.

2. The system of claim 1 further comprising terminal means for communicating with said translator means, said terminal means including manually actuable means for effecting the activation of said translator means.

3. The system of claim 1 wherein said first signal processor means is initially energizable to assume a standby status, and is responsive to an activation command signal subsequent to said stand-by status to assume an active status, whereby said first signal processor is then capable of being responsive to said transmit command signal.

4. The system of claim 1 wherein said reader means first signal processor means includes means for carrying out an arithmetic operation based upon a predetermined mathematical expression and with respect to all transmitted said data words to derive a first check character signal transmitted at said output.

5. The system of claim 4 wherein said translator means second signal processor means includes means for carrying out said arithmetic operation based upon said predetermined mathematical expression and with respect to all said transmitted data words received at said input to derive a second check character signal.

6. The system of claim 5 wherein said translator means second signal processor means includes means for carrying out a comparison of the value of said second check character signal with respect to said first check character signal for deriving an error status signal in the presence of an inequality therebetween.

7. The system of claim 5 wherein:
    said translator means second signal processor means includes means for carrying out a comparison of the value of said second check character signal with respect to said first check character signal, and for generating a transmit again command signal upon the occurrence of an inequality between said first and second check character signal values, said first signal processor means being responsive to said transmit again signal for retransmitting said data word signals.

8. The system of claim 7 wherein said translator means second signal processor means includes means for deriving an error status signal in response to a predetermined number of said occurrence of said inequality between said first and second check character signal values.

9. The system of claim 1 in which:
    said reader means first signal processor means is responsive to a deactivation command signal to assume said standby status;
    said translator means second signal processor means includes means for receiving said transmitted data words within a second predetermined interval following said transmit command signal and for generating said deactivation command signal in the absence of said data word receipt at the termination of said second predetermined interval to effect said reader means standby status.

10. The system of claim 1 in which:
    said reader means first signal processor means is responsive to a deactivation command signal to assume said standby status;
    at least some of said data words identify said data source; and
    said translator means includes second storage means under the control of said second signal processor means retaining corresponding identification of said data source deriving from previous transmission of said data word signals, said second signal processor means including means for deriving said deactivation command signal to effect said reader means standby status when said corresponding identification is not within said second storage means.

11. The system of claim 1 in which:
    at least some of said data words identify said data source;
    said reader means first signal processor means is responsive to a deactivation command signal to assume said standby status and effects the transmission of said source identifying data words; and
    said translator means second signal processor means includes means for generating said deactivation command signal upon receipt of transmitted identification data words when simultaneously carrying out the processing of data having the same identification of said data source.

12. The system of claim 1 in which:

at least some of said data words correspond to the running total of said data signals received over predetermined intervals of time; and said translator means second signal processor means includes means for summing the quantity of said data signals and comparing the value of said summed quantity with the value of said recorder means running total and deriving a running total error signal in the presence of an inequality between said values.

13. The system of claim 1 wherein:

said reader means first signal processor means is responsive to the insertion of said portable storage means in said receptacle and to said transmit command signal for providing a status signal at said output; and said translator means second signal processor means is responsive to said status signal for generating said transmit command signal.

14. The system of claim 13 in which:

said reader means first signal processor means is responsive to a deactivation command signal to assume said standby status; and said translator means second signal processor means includes means responsive to said status signal within a first predetermined interval following said actuation command signal for generating said transmit command signal.

15. The system of claim 14 wherein said translator means second signal processor means is responsive at the termination of said first predetermined interval for generating said deactivation command signal to effect said reader means standby status.

16. The system of claim 13 in which:

said reader means first signal processor means is responsive to a defective insertion of said portable data storage means into said receptacle and responsive to said transmit command signal and a deactivation command signal for providing a not ready status signal at said output and for effecting a return of said reader means to said standby status; and said translator means second signal processor means is responsive to said not ready status signal for generating said deactivation command signal.

17. The system of claim 14, or 15, or 9, or 10, or 11, or 16 comprising:

terminal means for communicating with said translator means, and readout means under the control of said translator means for displaying select visual information in response to the receipt of select message signal; and wherein said translator means second signal processor means includes means for deriving error message signals for transmission to said terminal means in the presence of a said deactivation command signal.

18. A system of claim 13 in which;

said reader means first signal processing means is responsive to a deactivation command signal to assume said standby status; and said translator means second signal processor means includes means responsive to said status signal within a first predetermined interval following said activation command signal for generating said transmit command signal, and responsive at the termination of said first predetermined interval in the absence of said transmit command signal for generating said deactivation command signal to effect said reader means standby status.

19. The system of claim 18 in which said translator means second signal processing means includes means for receiving said transmitted data words within a second predetermined interval following said transmit command signal and for generating said deactivation command signal in the absence of said data word receipt at the termination of said second predetermined interval to effect said reader means standby status.

20. The system of claim 18 in which:

said reader means first signal processor means includes means for carrying out an arithmetic operation based upon a predetermined mathematical expression and with respect to all said transmitted data words for deriving a first check character signal transmitted at said output; and said translator means second signal processor means includes means for carrying out said arithmetic operation based upon said predetermined mathematical expression and with respect to all said transmitted data words received at said input to derive a second check characters signal, said second signal processor means further including means for carrying out a comparison of the value of said second check character signal with respect to said first check character signal and for generating a transmit again command signal upon the occurrence of an inequality between said first and second check character signal values, said first signal processor means being responsive to said transmit again signal for retransmitting said data words.

21. The system of claim 20 wherein said translator means second signal processor means includes means for deriving an error status signal in the presence of said inequality between said first and second check character signal values.

22. The system of claim 21 wherein said translator means second signal processor means includes means for generating said error status signal in response to a predetermined number of occurrences of said inequality between said first and second check character signal values.

23. The system of claim 20 in which:

at least some of said data words correspond to the running total of said data signal received over predetermined time intervals; and said translator means second signal processor means includes means for summing the quantity of said data signals and comparing the value of said summed quantity with the running total of said received data signals represented by said data words and deriving a running total error signal in the presence of an inequality between said values.

24. The system of claim 20 in which:

at least some of said data words identify said data source;

said reader means first signal processor means is responsive to a deactivation command signal to assume said standby status and effects the transmission of said source identifying data words; and said translator means second signal processor means includes means for generating said deactivation command signal upon receipt of transmitted identification data words while simultaneously carrying out the processing of data having the same identification as said data source.

25. The system of claim 24 in which:

said reader means first signal processor means is responsive to a defective insertion of said portable data storage means into said receptacle, and is responsive to said transmit command signal and a deactivation command signal for providing a not ready status signal at said output and for effecting a return of said reader means to said standby status; and said translator means second signal processor means is responsive to said not ready status signal for generating said deactivation command signal.

26. The system of claim 19 or 25 comprising:

terminal means for communicating with said translator means, and readout means under the control of said translator means for displaying select visual information in response to the receipt of select message signals; and wherein said translator means second signal processor means includes means for deriving error message signals for transmission to said terminal means in the presence of a said deactivation command signal.

27. The system of claim 1 wherein:

said reader means includes synchronous receiver-transmitter means for converting said data words at said output to serial asynchronous data signals;

said input of said translator means receives said asynchronous data signals; and said system further includes coupling means connected to said reader means output and said translator means input for effecting said transmission by telecommunication.

28. The system of claim 1 wherein said portable signal storage means comprises a solid-state non-volatile memory.

29. The system of claim 28 wherein said solid-state non-volatile memory device comprises a magnetic bubble memory device.

30. The system of claim 1 wherein the data reader means further includes power supply means under the control of said first signal processing means for providing selective power input thereto.

31. The system of claim 1 wherein:

said power supply means is connectible with an a.c. power source and includes power storage means under the control of said first signal processing means;

said reader means includes power fail circuit means for deriving a fail signal condition in the presence of a failure of said a.c. power source; and said first signal processing means includes means for effecting a continuation of said transference of said data words to said first storage means in the presence of said fail signal condition by utilization of power from said power storage means.

32. The system of claim 1 in which said first signal storage means is a F.I.F.O. memory and said second signal storage means is a random access memory.

* * * * *